(12) United States Patent
Kim et al.

(10) Patent No.: US 11,706,931 B2
(45) Date of Patent: Jul. 18, 2023

(54) VARIABLE RESISTANCE MEMORY DEVICE

(71) Applicant: SAMSUNG ELECTRONICS CO., LTD., Suwon-si (KR)

(72) Inventors: Jae Hoon Kim, Suwon-si (KR); Sang Hwan Park, Hwaseong-si (KR); Yong-Sung Park, Suwon-si (KR); Hyeonwoo Seo, Suwon-si (KR); Se Chung Oh, Yongin-si (KR); Hyun Cho, Changwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 17/230,029

(22) Filed: Apr. 14, 2021

(65) Prior Publication Data

US 2022/0102427 A1 Mar. 31, 2022

(30) Foreign Application Priority Data

Sep. 25, 2020 (KR) .................. 10-2020-0125030

(51) Int. Cl.
*H10B 61/00* (2023.01)
*H10B 63/00* (2023.01)

(52) U.S. Cl.
CPC ............. *H10B 61/22* (2023.02); *H10B 63/34* (2023.02); *H10B 63/845* (2023.02)

(58) Field of Classification Search
CPC . H01L 27/228; H01L 27/2454; H01L 27/249; H01L 45/06; H01L 45/1233; H01L 45/144; H01L 27/2436; H01L 27/2481; H01L 45/1226; H01L 45/1253; H10B 61/22; H10B 63/34; H10B 63/845; H10B 63/30; H10B 63/84; H10N 70/231; H10N 70/826; H10N 70/8828; H10N 70/823; H10N 70/841
See application file for complete search history.

(56) References Cited

U.S. PATENT DOCUMENTS

| | | | |
|---|---|---|---|
| 8,716,780 B2 | 5/2014 | Kellam et al. | |
| 9,484,389 B2 | 11/2016 | Wouters et al. | |
| 10,388,697 B2 | 8/2019 | Chen et al. | |
| 2015/0035032 A1 | 2/2015 | Kang et al. | |
| 2018/0012937 A1 | 1/2018 | Park et al. | |

(Continued)

FOREIGN PATENT DOCUMENTS

| KR | 10-2015-0016797 A | 2/2015 |
|---|---|---|
| KR | 10-2018-0005778 A | 1/2018 |

(Continued)

*Primary Examiner* — Allison Bernstein
(74) *Attorney, Agent, or Firm* — Lee IP Law, P.C.

(57) ABSTRACT

A variable resistance memory device including a substrate; horizontal structures spaced apart from each other in a first direction perpendicular to a top surface of the substrate; variable resistance patterns on the horizontal structures, respectively; and conductive lines on the variable resistance patterns, respectively, wherein each of the horizontal structures includes a first electrode pattern, a semiconductor pattern, and a second electrode pattern arranged along a second direction parallel to the top surface of the substrate, and each of the variable resistance patterns is between one of the second electrode patterns and a corresponding one of the conductive lines.

19 Claims, 49 Drawing Sheets

(56) References Cited

U.S. PATENT DOCUMENTS

2018/0358056 A1    12/2018  Lee et al.
2019/0206869 A1    7/2019   Kim et al.
2020/0006434 A1*   1/2020   Kim .................... H01L 27/2409

FOREIGN PATENT DOCUMENTS

KR    10-2018-0013629 A    2/2018
KR    10-2019-0018594 A    2/2019
KR    10-2019-0080688 A    7/2019

* cited by examiner

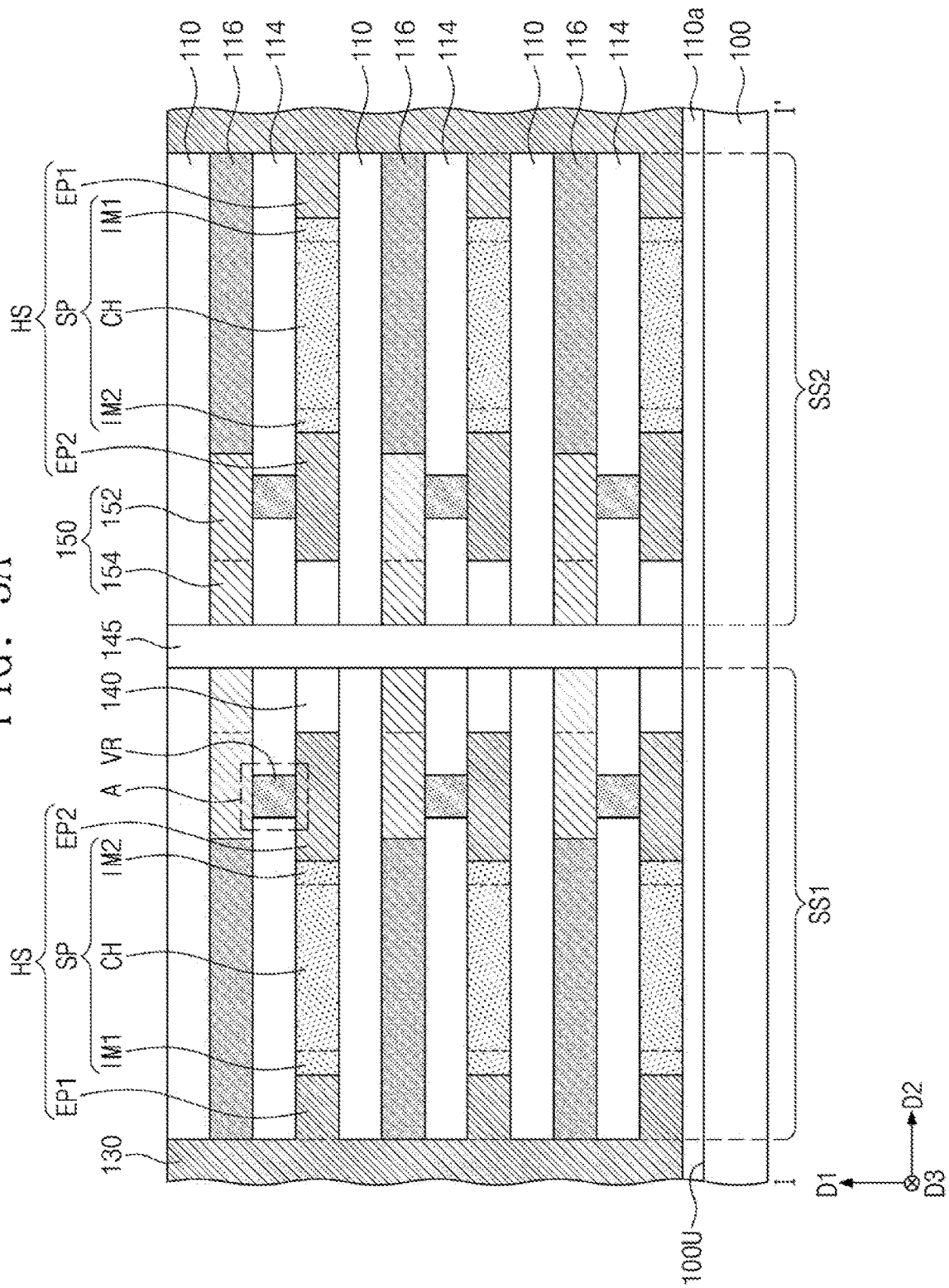

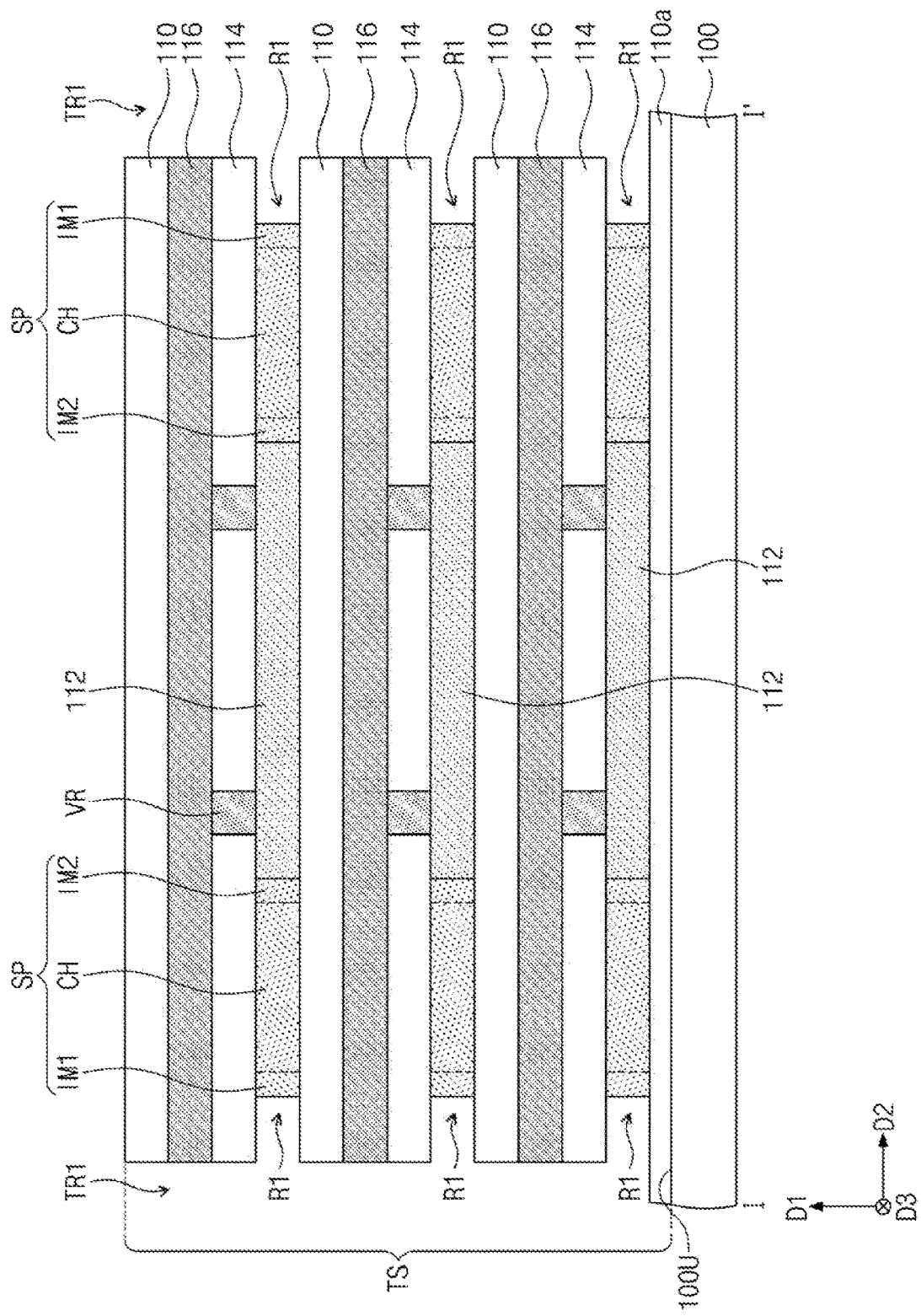

VARIABLE RESISTANCE MEMORY DEVICE

CROSS-REFERENCE TO RELATED APPLICATION

Korean Patent Application No. 10-2020-0125030, filed on Sep. 25, 2020 in the Korean Intellectual Property Office, and entitled: "Variable Resistance Memory Device," is incorporated by reference herein in its entirety.

BACKGROUND

1. Field

Embodiments relate to a variable resistance memory device.

2. Description of the Related Art

Semiconductor devices have been highly integrated to provide excellent performance and low manufacturing costs. The integration density of semiconductor devices may directly affect the costs of the semiconductor devices, thereby resulting in a demand of highly integrated semiconductor devices. The integration density of some two-dimensional (2D) or planar semiconductor devices may be mainly determined by an area where a unit memory cell occupies. The integration density of the 2D or planar semiconductor devices may be greatly affected by a technique of forming fine patterns.

SUMMARY

The embodiments may be realized by providing a variable resistance memory device including a substrate; horizontal structures spaced apart from each other in a first direction perpendicular to a top surface of the substrate; variable resistance patterns on the horizontal structures, respectively; and conductive lines on the variable resistance patterns, respectively, wherein each of the horizontal structures includes a first electrode pattern, a semiconductor pattern, and a second electrode pattern arranged along a second direction parallel to the top surface of the substrate, and each of the variable resistance patterns is between one of the second electrode patterns and a corresponding one of the conductive lines.

The embodiments may be realized by providing a variable resistance memory device including a substrate; horizontal structures and variable resistance patterns alternately stacked on the substrate in a first direction perpendicular to a top surface of the substrate; and a selection line extending lengthwise in the first direction and connected to the horizontal structures, wherein each of the horizontal structures includes a first electrode pattern, a semiconductor pattern, and a second electrode pattern arranged in a second direction parallel to the top surface of the substrate, each of the variable resistance patterns is connected to a corresponding one the second electrode patterns, and the selection line is connected to the semiconductor pattern of each of the horizontal structures.

The embodiments may be realized by providing a variable resistance memory device including a substrate; horizontal structures laterally spaced apart from each other on a top surface of the substrate; a vertical insulating pattern between the horizontal structures and extending lengthwise in a first direction perpendicular to the top surface of the substrate; variable resistance patterns on the horizontal structures, respectively; and a conductive line connected to the variable resistance patterns, wherein each of the horizontal structures includes a first electrode pattern, a semiconductor pattern, and a second electrode pattern arranged along a second direction parallel to the top surface of the substrate, each of the variable resistance patterns is on the second electrode pattern of a corresponding one of the horizontal structures, the horizontal structures are spaced apart from each other in a third direction parallel to the top surface of the substrate and intersecting the second direction, and the conductive line extends lengthwise in the third direction and is connected to the variable resistance patterns.

BRIEF DESCRIPTION OF THE DRAWINGS

Features will be apparent to those of skill in the art by describing in detail exemplary embodiments with reference to the attached drawings in which:

FIGS. 3A and 3B are cross-sectional views taken along lines I-I' and II-II' of FIG. 2, respectively.

FIGS. 5A to 10A are cross-sectional views corresponding to the line I-I' of FIG. 2 of stages in a method of manufacturing a variable resistance memory device according to some embodiments.

FIGS. 5B to 10B are cross-sectional views corresponding to the line II-II' of FIG. 2 of stages in a method of manufacturing a variable resistance memory device according to some embodiments.

FIGS. 14A to 19A are cross-sectional views corresponding to the line I-I' of FIG. 12 of stages in a method of manufacturing a variable resistance memory device according to some embodiments.

FIGS. 14B to 19B are cross-sectional views corresponding to the line II-II' of FIG. 12 of stages in a method of manufacturing a variable resistance memory device according to some embodiments.

FIGS. 20A to 26A are cross-sectional views corresponding to the line I-I' of FIG. 12 of stages in a method of manufacturing a variable resistance memory device according to some embodiments.

FIGS. 20B to 26B are cross-sectional views corresponding to the line II-II' of FIG. 12 of stages in a method of manufacturing a variable resistance memory device according to some embodiments.

DETAILED DESCRIPTION

Figure 1:
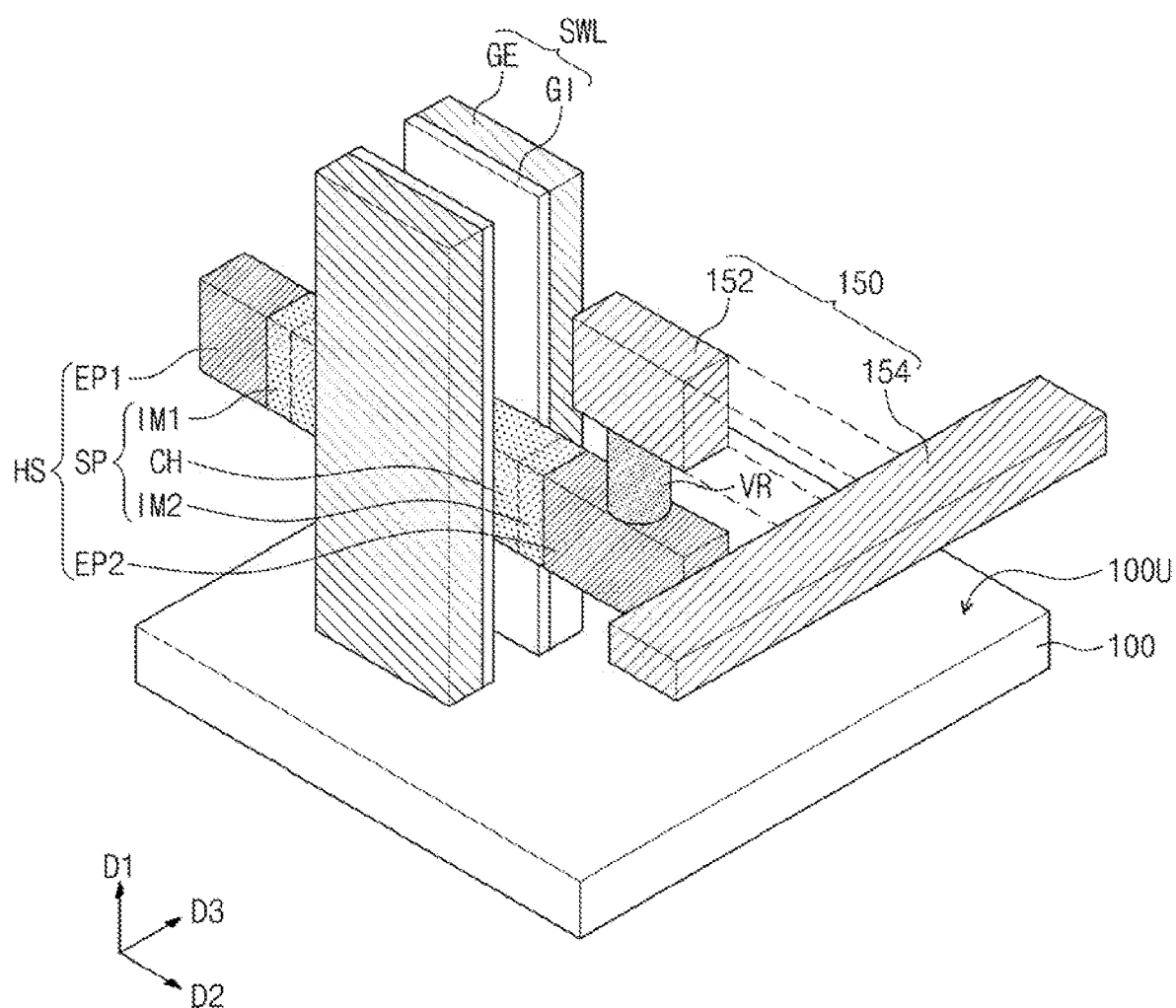
FIG. 1 is a perspective view of a variable resistance memory device according to some embodiments.

FIG. 1 is a perspective view of a variable resistance memory device according to some embodiments.

Referring to FIG. 1, a horizontal structure HS may be on a substrate 100. The horizontal structure HS may be spaced apart from the substrate 100 in a first direction D1 perpendicular to a top surface 100U of the substrate 100 (e.g., vertical direction). The horizontal structure HS may include a first electrode pattern EP1, a semiconductor pattern SP, and a second electrode pattern EP2, which may be arranged in (e.g., aligned along) a second direction D2 parallel to the top surface 100U of the substrate 100. The first electrode pattern EP1 and the second electrode pattern EP2 may be spaced apart from each other in the second direction D2 with the semiconductor pattern SP therebetween.

The semiconductor pattern SP may include a first dopant region IM1 adjacent to the first electrode pattern EP1, a second dopant region IM2 adjacent to the second electrode pattern EP2, and a channel region CH between the first dopant region IM1 and the second dopant region IM2. The first and second dopant regions IM1 and IM2 may have a different conductivity type from that of the channel region CH. The first and second dopant regions IM1 and IM2 may have the same conductivity type. In an implementation, the semiconductor pattern SP may include silicon, germanium, silicon-germanium, or indium gallium zinc oxide (IGZO). The first and second dopant regions IM1 and IM2 may include, e.g., N-type dopants or P-type dopants. The first and second electrode patterns EP1 and EP2 may include a conductive material (e.g., a metal). As used herein, the term "or" is not an exclusive term, e.g., "A or B" would include A, B, or A and B.

In an implementation, a pair of selection lines SWL may be connected to the horizontal structure HS. The pair of selection lines SWL may be spaced apart from each other in a third direction D3 which is parallel to the top surface 100U of the substrate 100 and intersects the second direction D2. The horizontal structure HS may be between the pair of selection lines SWL, and the pair of selection lines SWL may extend lengthwise in the first direction D1. The pair of selection lines SWL may be connected to the semiconductor pattern SP of the horizontal structure HS. Each of the selection lines SWL may include a gate electrode GE adjacent to the channel region CH of the semiconductor pattern SP, and a gate dielectric layer GI between the gate electrode GE and the channel region CH of the semiconductor pattern SP. The pair of selection lines SWL may be configured to receive the same voltage.

A variable resistance pattern VR may be on the horizontal structure HS. The variable resistance pattern VR may be stacked on the horizontal structure HS in the first direction D1. The variable resistance pattern VR may be on the second electrode pattern EP2 of the horizontal structure HS and may be connected to the second electrode pattern EP2. The variable resistance pattern VR may include a material capable of storing data using its resistance change. In an implementation, the variable resistance pattern VR may be a magnetic tunnel junction pattern. The magnetic tunnel junction pattern may include a pinned layer having a magnetization direction fixed in one direction, a free layer having a magnetization direction changeable to be parallel or anti-parallel to the magnetization direction of the pinned layer, and a tunnel barrier layer between the pinned layer and the free layer. In this case, the horizontal structure HS and the variable resistance pattern VR may constitute a unit cell of a magnetic random-access memory (MRAM) device. In an implementation, the variable resistance pattern VR may include a material of which a phase is reversibly changeable between a crystalline state and an amorphous state by a temperature. In an implementation, the variable resistance pattern VR may include a compound that includes Te or Se (e.g., chalcogen elements) and Ge, Sb, Bi, Pb, Sn, Ag, As, S, Si, In, Ti, Ga, P, O, or C. The variable resistance pattern VR may include, e.g., GeSbTe, GeTeAs, SbTeSe, GeTe, SbTe, SeTeSn, GeTeSe, SbSeBi, GeBiTe, GeTeTi, InSe, GaTeSe, or InSbTe, or may have a superlattice structure in which a layer including Ge and a layer not including Ge are alternately and repeatedly stacked, e.g., a structure in which a GeTe layer and a SbTe layer are alternately and repeatedly stacked. In this case, the horizontal structure HS and the variable resistance pattern VR may constitute a unit cell of a phase change random-access memory (PRAM) device.

A conductive line 150 may be on the variable resistance pattern VR. The conductive line 150 may be stacked on the variable resistance pattern VR in the first direction D1 and may be connected to the variable resistance pattern VR. The conductive line 150 may include a line portion 154 extending lengthwise in the third direction D3, and an extension 152 extending from the line portion 154 onto a top surface of the variable resistance pattern VR. The variable resistance pattern VR may be between the second electrode pattern EP2 of the horizontal structure HS and the extension 152 of the conductive line 150. A bottom surface of the variable resistance pattern VR may be connected to (or in contact, e.g., direct contact, with) the second electrode pattern EP2, and the top surface of the variable resistance pattern VR may be connected to (or in contact, e.g., direct contact, with) the extension 152 of the conductive line 150. The conductive line 150 may include, e.g., a metal.

Figure 2:
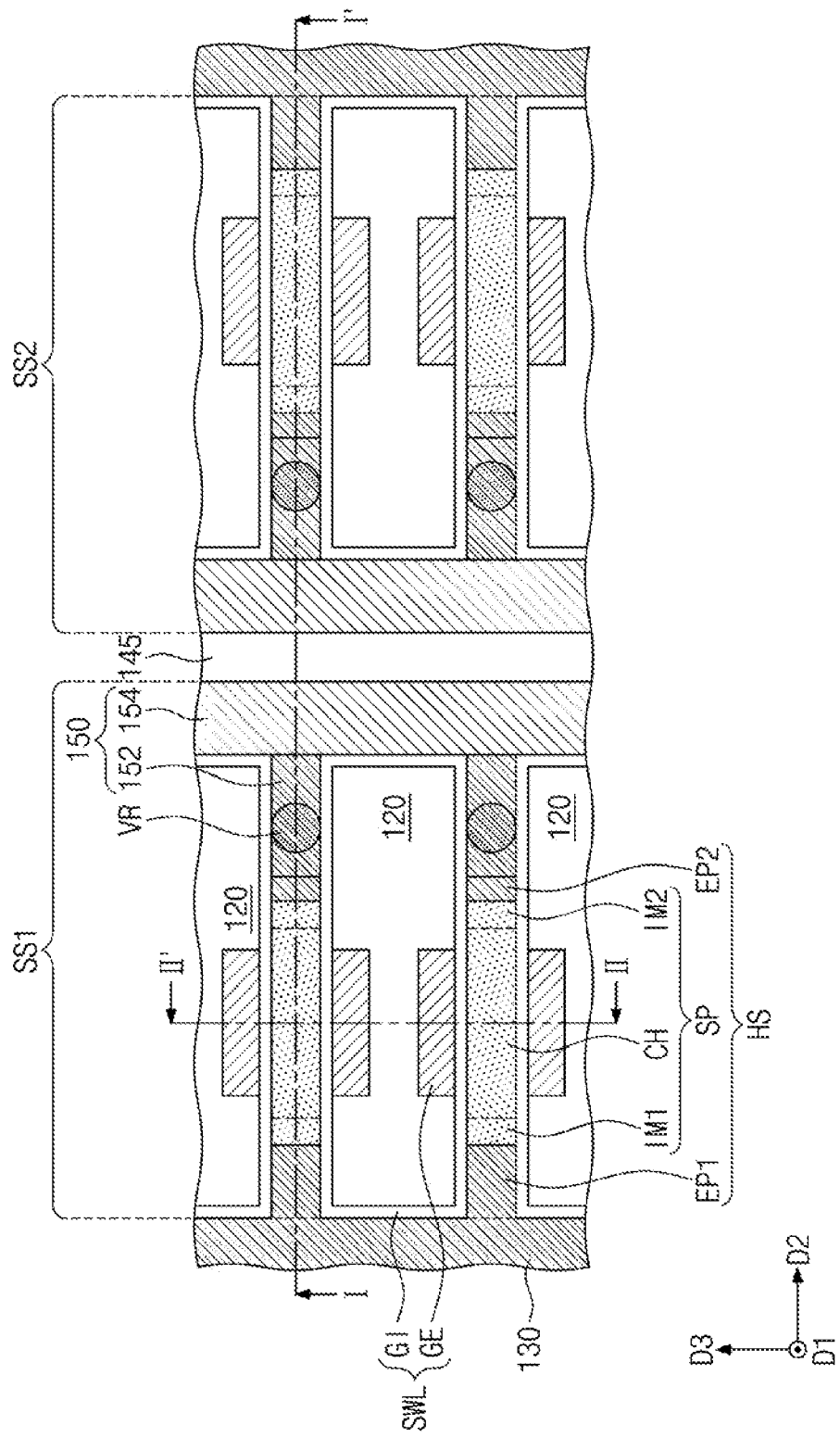
FIG. 2 is a plan view of a variable resistance memory device according to some embodiments.
Figure 3B:
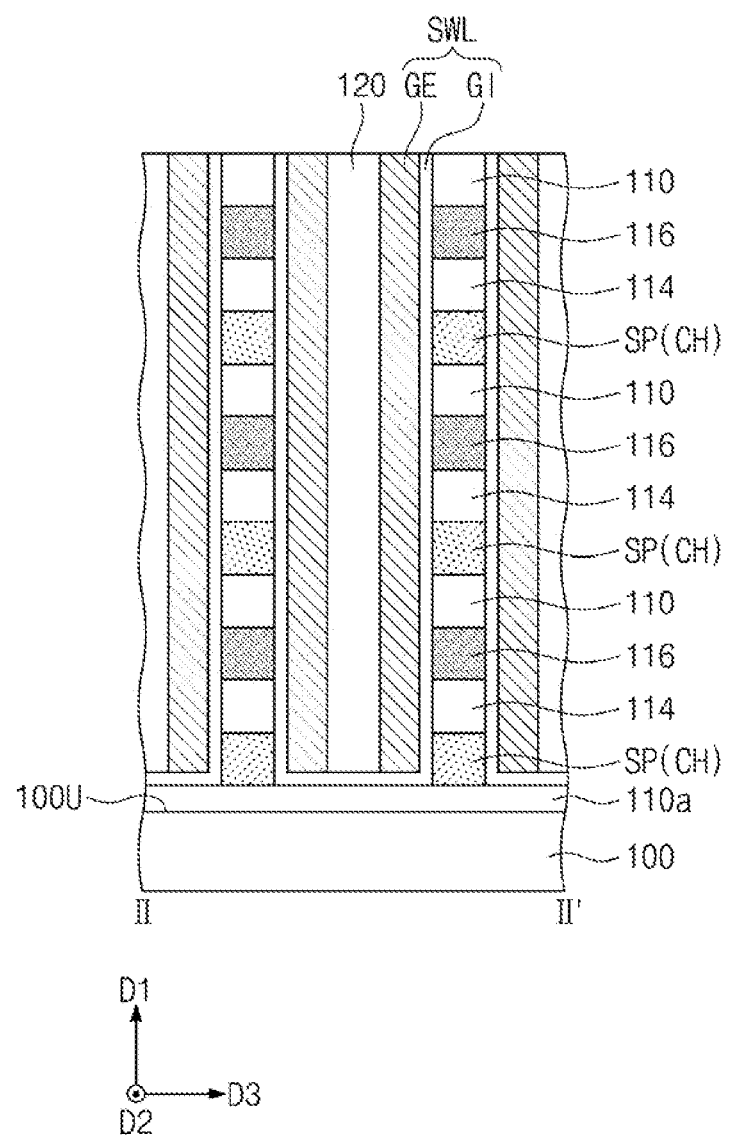
Figure 4A:
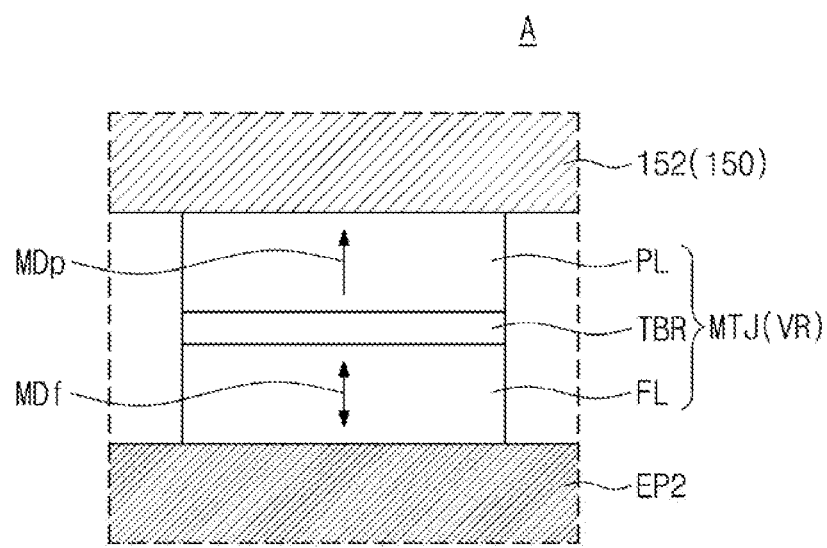
FIGS. 4A and 4B are enlarged views of a portion 'A' of FIG. 3A to illustrate variable resistance patterns according to some embodiments.
Figure 4B:
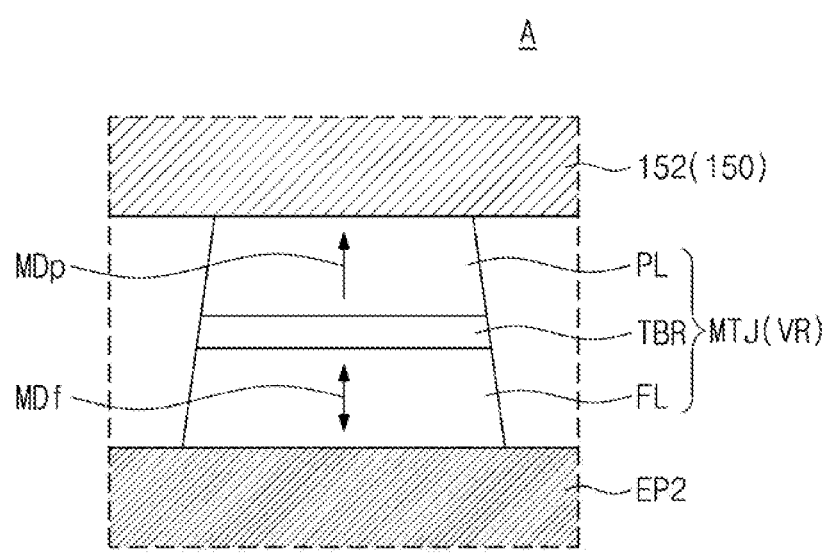

FIG. 2 is a plan view of a variable resistance memory device according to some embodiments. FIGS. 3A and 3B are cross-sectional views taken along lines I-I' and II-II' of FIG. 2, respectively. FIGS. 4A and 4B are enlarged views of a portion 'A' of FIG. 3A of variable resistance patterns according to some embodiments.

Referring to FIGS. 2, 3A and 3B, a first stack structure SS1 and a second stack structure SS2 may be on a substrate 100 and may be spaced apart from each other in the second direction D2 parallel to a top surface 100U of the substrate 100. A separation insulating layer 145 may be between the first stack structure SS1 and the second stack structure SS2. In an implementation, the separation insulating layer 145 may include silicon oxide, silicon nitride, or silicon oxynitride. A lower insulating layer 110a may be between the substrate 100 and each of the first and second stack structures SS1 and SS2. The lower insulating layer 110a may extend between the separation insulating layer 145 and the substrate 100 and may be in contact with the separation insulating layer 145. In an implementation, the lower insulating layer 110a may include silicon oxide, silicon nitride, or silicon oxynitride.

Each of the first and second stack structures SS1 and SS2 may include a plurality of horizontal structures HS vertically and horizontally stacked on the substrate 100. The horizontal structures HS may be spaced apart from each other in the first direction D1 perpendicular to the top surface 100U of the substrate 100 and in the third direction D3 parallel to the top surface 100U of the substrate 100 and intersecting the second direction D2. Each of the horizontal structures HS may include a first electrode pattern EP1, a semiconductor pattern SP, and a second electrode pattern EP2 arranged in or aligned along the second direction D2. The first electrode pattern EP1 and the second electrode pattern EP2 may be spaced apart from each other in the second direction D2 with the semiconductor pattern SP therebetween.

The semiconductor pattern SP may include a first dopant region IM1 adjacent to the first electrode pattern EP1, a second dopant region IM2 adjacent to the second electrode pattern EP2, and a channel region CH between the first dopant region IM1 and the second dopant region IM2. The first and second dopant regions IM1 and IM2 may have a different conductivity type from that of the channel region CH. The first and second dopant regions IM1 and IM2 may have the same conductivity type. In an implementation, the semiconductor pattern SP may include silicon, germanium, silicon-germanium, or indium gallium zinc oxide (IGZO). The first and second dopant regions IM1 and IM2 may include, e.g., N-type dopants or P-type dopants. The first and second electrode patterns EP1 and EP2 may include a conductive material (e.g., a metal).

Each of the first and second stack structures SS1 and SS2 may include a horizontal insulating pattern 140 between the separation insulating layer 145 and each of the horizontal structures HS. The horizontal insulating pattern 140 may be between the separation insulating layer 145 and the second electrode pattern EP2 of each of the horizontal structures HS and may be in contact (e.g., direct contact) with the separation insulating layer 145. In an implementation, the horizontal insulating pattern 140 may include silicon oxide, silicon nitride, or silicon oxynitride.

Each of the first and second stack structures SS1 and SS2 may include variable resistance patterns VR on the horizontal structures HS, respectively. Each of the variable resistance patterns VR may be stacked on each of the horizontal structures HS in the first direction D1. Each of the variable resistance patterns VR may be on the second electrode pattern EP2 of each of the horizontal structures HS and may be (e.g., electrically) connected to the second electrode pattern EP2.

Referring to FIGS. 4A and 4B, the variable resistance patterns VR may be, e.g., magnetic tunnel junction patterns MTJ. Each of the magnetic tunnel junction patterns MTJ may include a reference magnetic pattern PL, a free magnetic pattern FL, and a tunnel barrier pattern TBR between the reference and free magnetic patterns PL and FL. In an implementation, the free magnetic pattern FL may be between the second electrode pattern EP2 and the tunnel barrier pattern TBR, and the reference magnetic pattern PL may be spaced apart from the free magnetic pattern FL with the tunnel barrier pattern TBR therebetween. In an implementation, the reference magnetic pattern PL may be between the second electrode pattern EP2 and the tunnel barrier pattern TBR, and the free magnetic pattern FL may be spaced apart from the reference magnetic pattern PL with the tunnel barrier pattern TBR therebetween. In an implementation, the tunnel barrier pattern TBR may include a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the reference magnetic pattern PL and the free magnetic pattern FL may include at least one magnetic layer.

The reference magnetic pattern PL may include a reference layer having a magnetization direction MDp fixed in one direction. The free magnetic pattern FL may include a free layer having a magnetization direction MDf changeable to be parallel or anti-parallel to the magnetization direction MDp of the reference magnetic pattern PL. In an implementation, the magnetization directions MDp and MDf of the reference magnetic pattern PL and the free magnetic pattern FL may be substantially perpendicular to an interface between the tunnel barrier pattern TBR and the free magnetic pattern FL. In this case, each of the reference magnetic pattern PL and the free magnetic pattern FL may include an intrinsic perpendicular magnetic material or an extrinsic perpendicular magnetic material. The intrinsic perpendicular magnetic material may include a material which has a perpendicular magnetization property even though an external factor does not exist. The intrinsic perpendicular magnetic material may include a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. In an implementation, the perpendicular magnetic structure may include $(Co/Pt)_n$, $(CoFe/Pt)_n$, $(CoFe/Pd)_n$, $(Co/Pd)_n$, $(Co/Ni)_n$, $(CoNi/Pt)_n$, $(CoCr/Pt)_n$, or $(CoCr/Pd)_n$, where 'n' denotes the number of bilayers. The extrinsic perpendicular magnetic material may include a material which has an intrinsic horizontal magnetization property but has a perpendicular magnetization property by an external factor. In an implementation, the extrinsic perpendicular magnetic material may have the perpendicular magnetization property by magnetic anisotropy induced by a junction of the tunnel barrier pattern TBR and the reference magnetic pattern PL (or the free magnetic pattern FL). The extrinsic perpendicular magnetic material may include, e.g., CoFeB. Each of the reference magnetic pattern PL and the free magnetic pattern FL may include a Co-based Heusler alloy.

In an implementation, the magnetization directions MDp and MDf of the reference magnetic pattern PL and the free magnetic pattern FL may be substantially parallel to the interface between the tunnel barrier pattern TBR and the free magnetic pattern FL. In this case, each of the reference magnetic pattern PL and the free magnetic pattern FL may include a ferromagnetic material, and the reference magnetic pattern PL may further include an antiferromagnetic material for fixing a magnetization direction of the ferromagnetic material.

In an implementation, as illustrated in FIG. 4A, a sidewall of each of the magnetic tunnel junction patterns MTJ may be substantially perpendicular to a bottom surface of each of the magnetic tunnel junction patterns MTJ (e.g., a bottom surface of the free magnetic pattern FL). In an implementation, as illustrated in FIG. 4B, a sidewall of each of the magnetic tunnel junction patterns MTJ may be inclined with respect to the bottom surface of each of the magnetic tunnel junction patterns MTJ (e.g., the bottom surface of the free magnetic pattern FL). In this case, a width of each of the magnetic tunnel junction patterns MTJ may become less from its bottom toward its top. In an implementation, each of the magnetic tunnel junction patterns MTJ may be tapered from its bottom toward its top (e.g., may have a trapezoidal cross sectional shape).

Referring again to FIGS. 2, 3A and 3B, each of the first and second stack structures SS1 and SS2 may include first capping layers 114 which are respectively on the horizontal structures HS and covering the variable resistance patterns VR. Each of the variable resistance patterns VR may be in each of the first capping layers 114 and may penetrate each of the first capping layers 114 so as to be connected to the second electrode pattern EP2 of each of the horizontal structures HS. A portion of each of the first capping layers 114 may be between the separation insulating layer 145 and each of the variable resistance patterns VR and may be in contact with the separation insulating layer 145. The first capping layers 114 may include the same material as the lower insulating layer 110a. In an implementation, the first capping layers 114 and the lower insulating layer 110a may include silicon oxide.

Each of the first and second stack structures SS1 and SS2 may include conductive lines 150 on the variable resistance patterns VR, respectively. Each of the conductive lines 150 may be stacked on each of the variable resistance patterns VR in the first direction D1 and may be connected to each of the variable resistance patterns VR. Variable resistance patterns VR, spaced apart from each other in the first direction D1, of the variable resistance patterns VR may be connected to the conductive lines 150, respectively. Variable resistance patterns VR, spaced apart from each other in the third direction D3, of the variable resistance patterns VR may be connected to a corresponding one of the conductive lines 150.

Each of the conductive lines 150 may include a line portion 154 extending lengthwise in the third direction D3, and extensions 152 extending from one sidewall of the line portion 154 in a direction parallel to the top surface 100U of the substrate 100. The extensions 152 of each of the conductive lines 150 may extend onto top surfaces of the variable resistance patterns VR spaced apart from each other in the third direction D3, respectively, and may be spaced apart from each other in the third direction D3 on the one sidewall of the line portion 154. Another sidewall of the line portion 154 of each of the conductive lines 150 may be in contact with the separation insulating layer 145.

Each of the variable resistance patterns VR may be between the second electrode pattern EP2 of each of the horizontal structures HS and a corresponding extension 152 of a corresponding conductive line 150. A bottom surface of each of the variable resistance patterns VR may be connected to (or in contact with) the second electrode pattern EP2, and the top surface of each of the variable resistance patterns VR may be connected to (or in contact with) the corresponding extension 152 of the corresponding conductive line 150. The conductive lines 150 may include, e.g., a metal.

Each of the first and second stack structures SS1 and SS2 may include second capping layers 116 which are respectively on the first capping layers 114 and cover sidewalls of the conductive lines 150. The second capping layers 116 may include a different material from that of the first capping layers 114. In an implementation, the second capping layers 116 may include poly-crystalline silicon. Each of the first capping layers 114 may be between each of the horizontal structures HS and each of the second capping layers 116. A portion of each of the first capping layers 114 may be between the horizontal insulating pattern 140 and a corresponding conductive line 150 and between each of the variable resistance patterns VR and the separation insulating layer 145 and may be in contact with the separation insulating layer 145.

Each of the first and second stack structures SS1 and SS2 may include upper insulating layers 110 which are respectively on the second capping layers 116 and cover top surfaces of the conductive lines 150. The horizontal structures HS, the variable resistance patterns VR, the conductive lines 150 and the upper insulating layers 110 may be alternately stacked on the top surface 100U of the substrate 100 in the first direction D1. Each of the upper insulating layers 110 may electrically isolate the conductive line 150 thereunder and the horizontal structure HS thereon from each other. The upper insulating layers 110 may include a different material from that of the second capping layers 116. The upper insulating layers 110 may include the same material as the first capping layers 114 and the lower insulating layer 110a. The upper insulating layers 110 may include, e.g., silicon oxide.

A vertical conductive pattern 130 may be at one side of each of the first and second stack structures SS1 and SS2. Each of the first and second stack structures SS1 and SS2 may be between the vertical conductive pattern 130 and the separation insulating layer 145. The first electrode pattern EP1 of each of the horizontal structures HS may be connected to the vertical conductive pattern 130.

A vertical insulating pattern 120 may be between horizontal structures HS, spaced apart from each other in the third direction D3, of the horizontal structures HS and may be between variable resistance patterns VR, spaced apart from each other in the third direction D3, of the variable resistance patterns VR. The vertical insulating pattern 120 may extend lengthwise in the first direction D1 and may extend in the second direction D2 so as to be between the extensions 152 of each of the conductive lines 150.

A pair of the vertical insulating patterns 120 may be at one side of the line portion 154 of each of the conductive lines 150 and may be spaced apart from each other in the third direction D3. One of the extensions 152 of each of the conductive lines 150 may be between the pair of vertical insulating patterns 120. The horizontal structures HS spaced apart from each other in the first direction D1 and the variable resistance patterns VR spaced apart from each other in the first direction D1 may be between the pair of vertical insulating patterns 120. In an implementation, the vertical insulating pattern 120 may include silicon oxide, silicon nitride, or silicon oxynitride.

A gate electrode GE may be in the vertical insulating pattern 120. The gate electrode GE may extend lengthwise in the first direction D1 and may penetrate the vertical insulating pattern 120. The gate electrode GE may be adjacent to the semiconductor patterns SP of the horizontal structures HS spaced apart from each other in the first direction D1. The gate electrode GE may be adjacent to the channel regions CH of the semiconductor patterns SP. In an implementation, a pair of the gate electrodes GE may be in the pair of vertical insulating patterns 120, respectively. The pair of gate electrodes GE may extend lengthwise in the first direction D1 and may be spaced apart from each other in the third direction D3. The pair of gate electrodes GE may extend in the first direction D1 in parallel to each other. The horizontal structures HS spaced apart from each other in the first direction D1 may be between the pair of gate electrodes GE. The pair of gate electrodes GE may be adjacent to the semiconductor patterns SP (e.g., the channel regions CH) of the horizontal structures HS spaced apart from each other in the first direction D1. The gate electrode GE may include a metal (e.g., tungsten, titanium, or tantalum) or a conductive metal nitride (e.g., titanium nitride or tantalum nitride).

A gate dielectric layer GI may be between the gate electrode GE and the semiconductor patterns SP of the horizontal structures HS spaced apart from each other in the first direction D1. The gate dielectric layer GI may extend in the first direction D1 between the gate electrode GE and the first capping layers 114, between the gate electrode GE and the second capping layers 116 and between the gate electrode GE and the upper insulating layers 110. In an implementation, the gate dielectric layer GI may extend between the gate electrode GE and the lower insulating layer 110a and between the vertical insulating pattern 120 and the lower insulating layer 110a. In an implementation, the gate dielectric layer GI may extend between the gate electrode GE and the lower insulating layer 110a, and the vertical insulating pattern 120 may penetrate the gate dielectric layer GI so as to be in contact with the lower insulating layer 110a.

The gate dielectric layer GI may extend between the vertical insulating pattern 120 and the conductive lines 150 and between the vertical conductive pattern 130 and the vertical insulating pattern 120. The gate dielectric layer GI may have a ring or closed loop shape surrounding the vertical insulating pattern 120 when viewed in a plan view. The gate dielectric layer GI may include a high-k dielectric layer, a silicon oxide layer, a silicon nitride layer, or a silicon oxynitride layer.

The gate electrode GE and a portion of the gate dielectric layer GI adjacent thereto may constitute a selection line SWL. The pair of gate electrodes GE and portions of the gate dielectric layer GI adjacent thereto may constitute a pair of the selection lines SWL. The horizontal structures HS spaced apart from each other in the first direction D1 may be between the pair of selection lines SWL, and the pair of selection lines SWL may be adjacent to the semiconductor patterns SP (e.g., the channel regions CH) of the horizontal structures HS spaced apart from each other in the first direction D1. The pair of selection lines SWL may be configured to receive the same voltage.

In an implementation, the horizontal structures HS and the variable resistance patterns VR may be three-dimensionally stacked on the substrate 100. Each of the horizontal structures HS may include the first electrode pattern EP1, the semiconductor pattern SP, and the second electrode pattern EP2, which are horizontally arranged. Each of the variable resistance patterns VR may be on the second electrode pattern EP2 of each of the horizontal structures HS. The semiconductor pattern SP of each of the horizontal structures HS and the selection line SWL adjacent thereto may function as a selection element connected to each of the variable resistance patterns VR. Each of the variable resistance patterns VR and the selection element connected thereto may constitute a unit memory cell, and a plurality of memory cells may be easily three-dimensionally stacked on the substrate 100. As a result, it may be easy to increase an integration density of the variable resistance memory device.

FIGS. 5A to 10A are cross-sectional views corresponding to the line I-I' of FIG. 2 of stages in a method of manufacturing a variable resistance memory device according to some embodiments. FIGS. 5B to 10B are cross-sectional views corresponding to the line II-II' of FIG. 2 of stages in a method of manufacturing a variable resistance memory device according to some embodiments. Hereinafter, the same features as described with reference to FIGS. 2, 3A, 3B, 4A and 4B may be omitted for the purpose of ease and convenience in explanation.

Figure 5A:
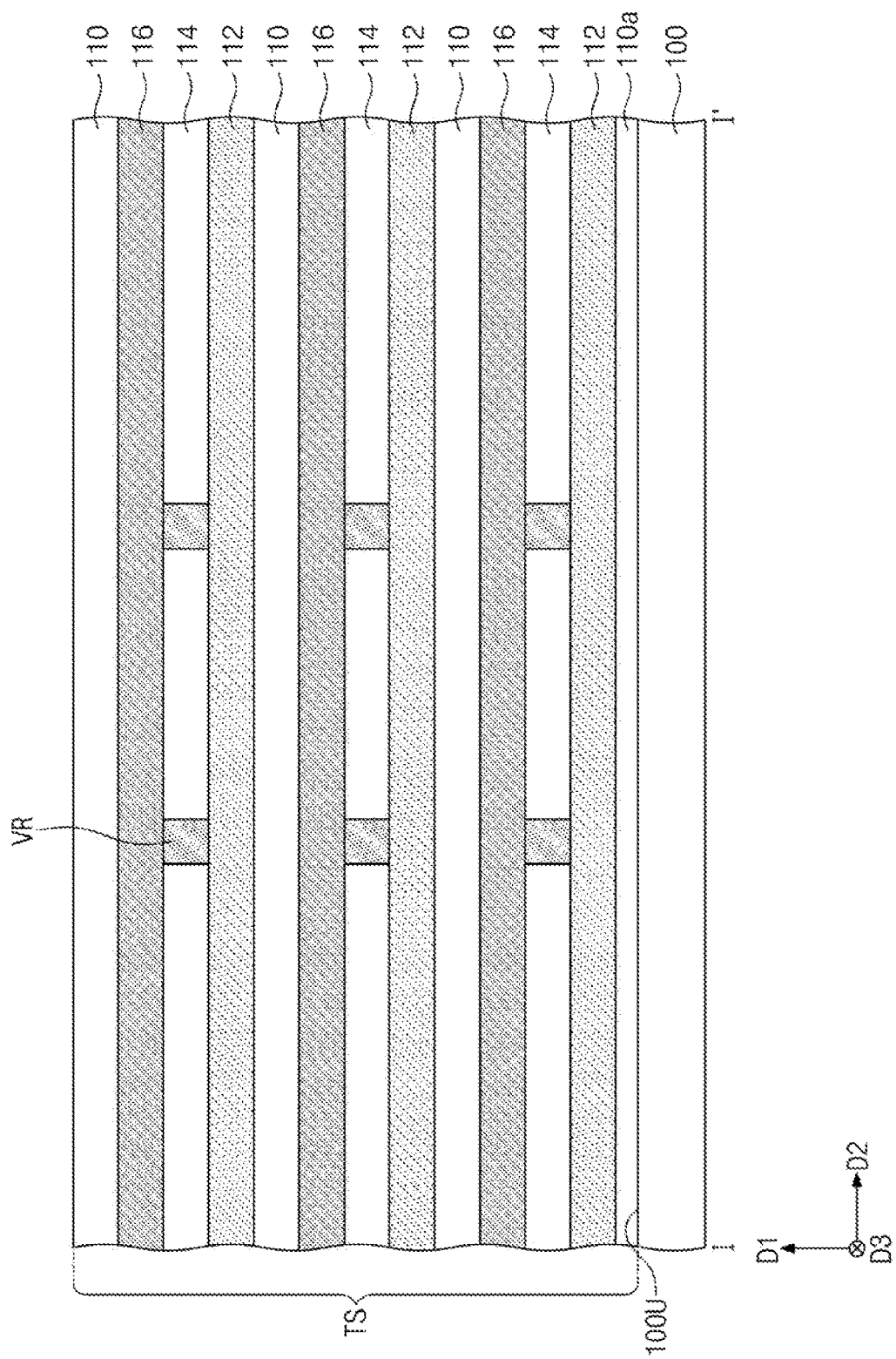
Figure 5B:
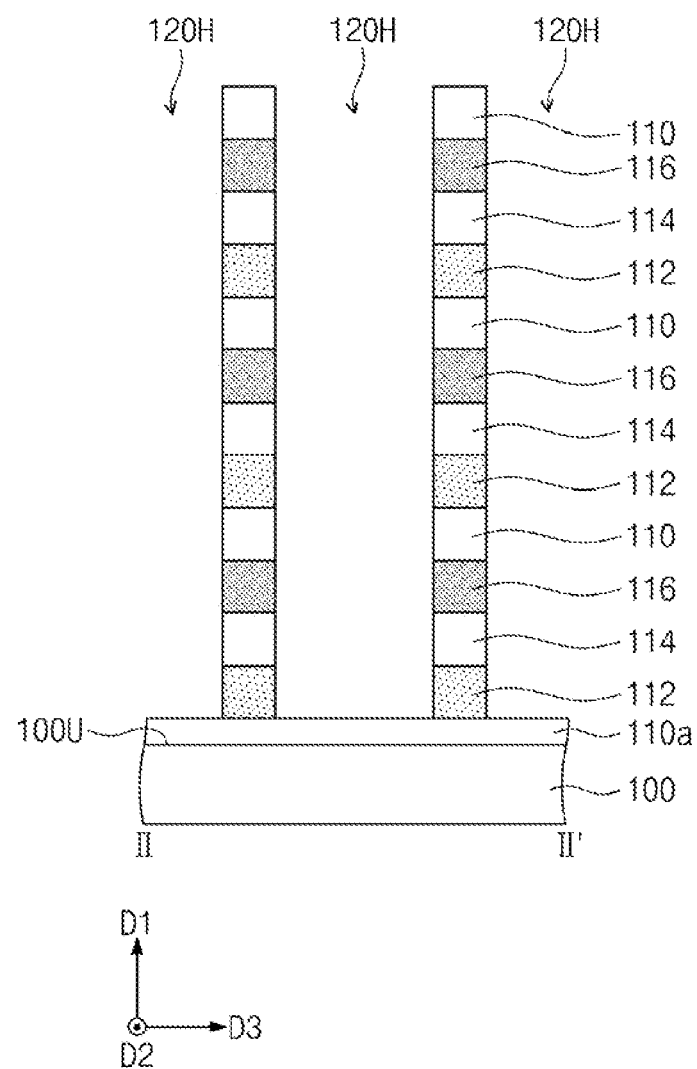

Referring to FIGS. 2, 5A and 5B, a lower insulating layer 110a and a sacrificial layer 112 may be sequentially formed on a substrate 100. The sacrificial layer 112 may include a material having an etch selectivity with respect to the lower insulating layer 110a and may include, e.g., silicon nitride.

Variable resistance patterns VR may be formed on the sacrificial layer 112. The formation of the variable resistance patterns VR may include forming a variable resistance layer (e.g., a magnetic tunnel junction layer) on the sacrificial layer 112, and patterning the variable resistance layer. The patterning of the variable resistance layer may include etching the variable resistance layer using, e.g., a reactive ion etching (RIE) process or an ion beam etching (IBE) process.

After the formation of the variable resistance patterns VR, a first capping layer 114 may be formed on the sacrificial layer 112. The first capping layer 114 may be formed to expose top surfaces of the variable resistance patterns VR. The first capping layer 114 may include a material having an etch selectivity with respect to the sacrificial layer 112. The first capping layer 114 may include the same material as the lower insulating layer 110a. In an implementation, the first capping layer 114 and the lower insulating layer 110a may include silicon oxide.

A second capping layer 116 may be formed on the first capping layer 114 and may be formed to cover the exposed top surfaces of the variable resistance patterns VR. The second capping layer 116 may include a material having an etch selectivity with respect to the first capping layer 114. The second capping layer 116 may include, e.g., polycrystalline silicon.

An upper insulating layer 110 may be formed on the second capping layer 116. The upper insulating layer 110 may include a material having an etch selectivity with respect to the second capping layer 116. The upper insulating layer 110 may include the same material as the first capping layer 114 and the lower insulating layer 110a. The upper insulating layer 110 may include, e.g., silicon oxide.

The sacrificial layer 112, the variable resistance patterns VR, the first capping layer 114, the second capping layer 116 and the upper insulating layer 110 may be alternately and repeatedly stacked on the substrate 100 in the first direction D1, and thus a thin-layer structure TS may be formed on the substrate 100. The thin-layer structure TS may include the variable resistance patterns VR three-dimensionally arranged in the first direction D1, the second direction D2, and the third direction D3.

Vertical holes 120H may be formed in the thin-layer structure TS. Each of the vertical holes 120H may penetrate the thin-layer structure TS in the first direction D1. Each of the vertical holes 120H may expose a top surface of the lower insulating layer 110a. In an implementation, the vertical holes 120H may extend in the second direction D2 in the thin-layer structure TS and may be spaced apart from each other in the third direction D3.

Figure 6A:
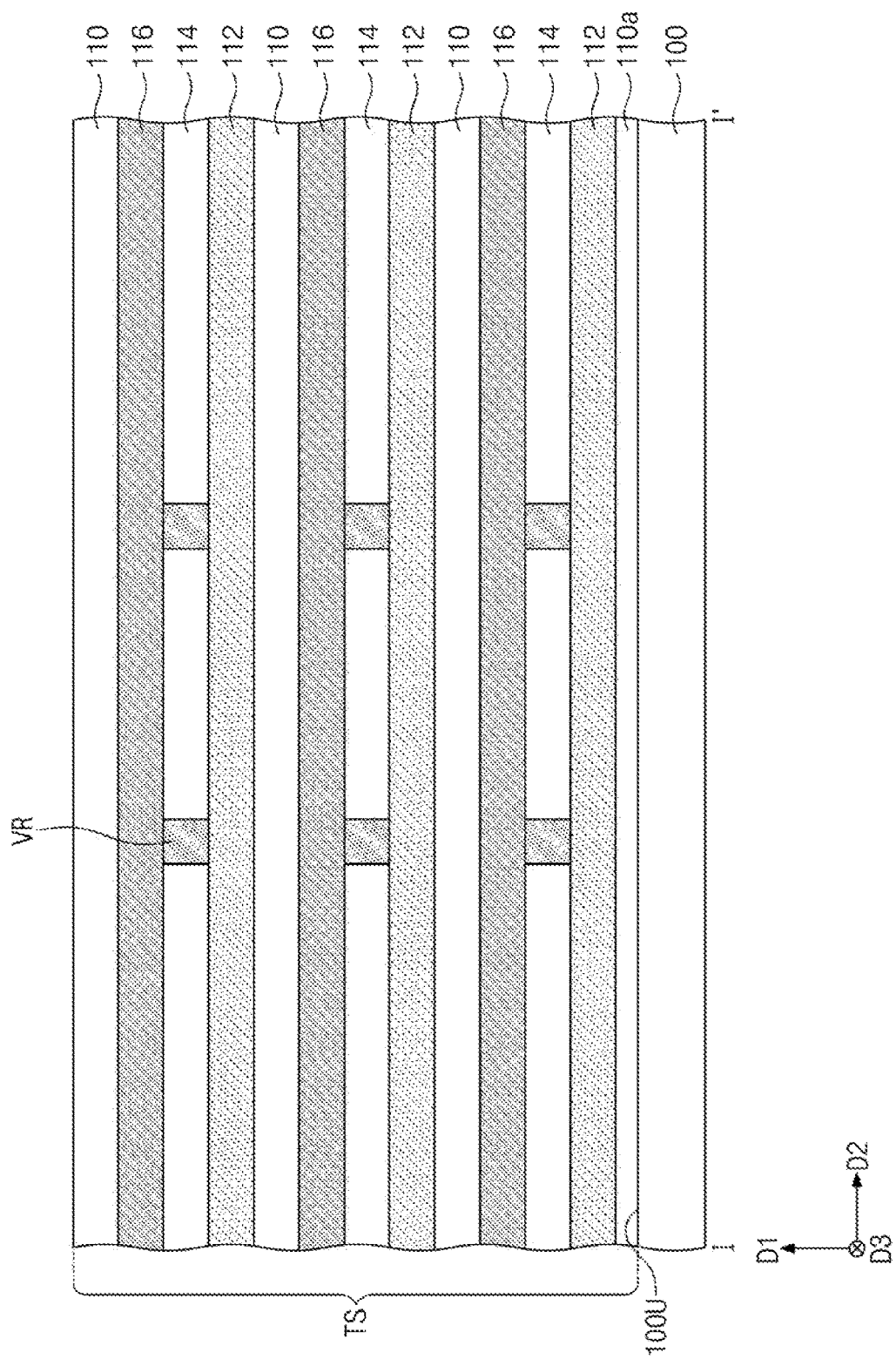
Figure 6B:
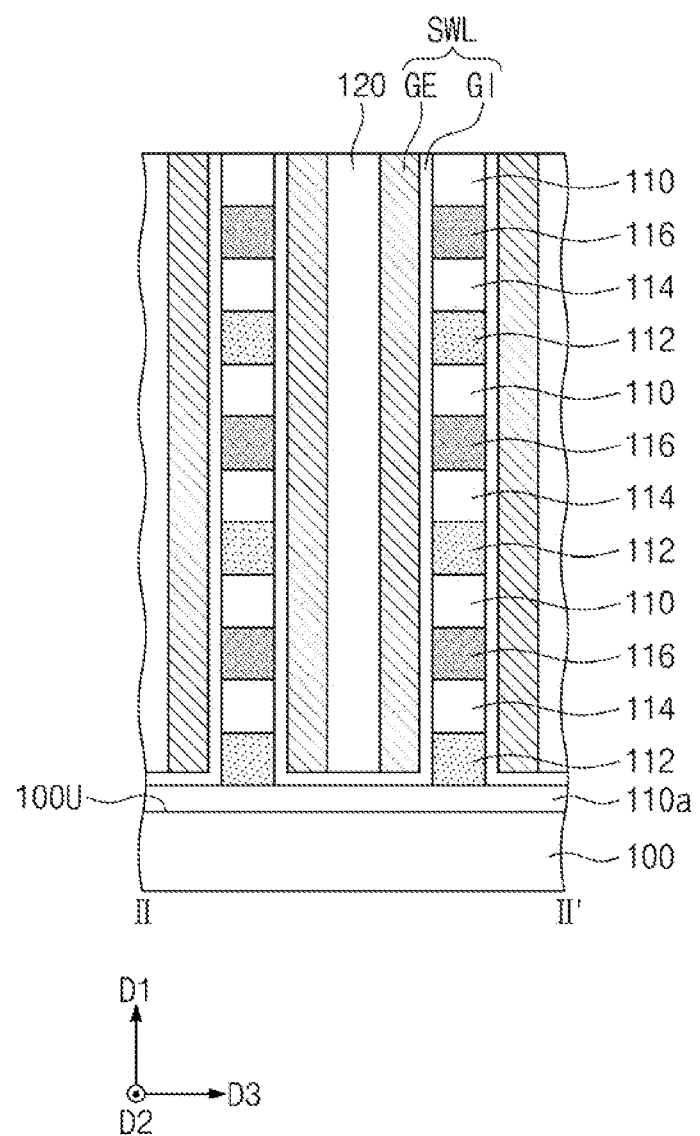

Referring to FIGS. 2, 6A and 6B, a gate dielectric layer GI may be formed to cover an inner surface of each of the vertical holes 120H with a substantially uniform thickness. A gate electrode GE may be formed in each of the vertical holes 120H. The formation of the gate electrode GE may include forming a gate electrode layer filling a portion of each of the vertical holes 120H, and forming the gate electrode GE on an inner sidewall of each of the vertical holes 120H by etching the gate electrode layer. After the formation of the gate electrode GE, vertical insulating patterns 120 may be formed in the vertical holes 120H, respectively. Each of the vertical insulating patterns 120 may be formed to fill a remaining portion of each of the vertical holes 120H. The gate electrode GE and the gate dielectric layer GI may constitute a selection line SWL.

Figure 7B:
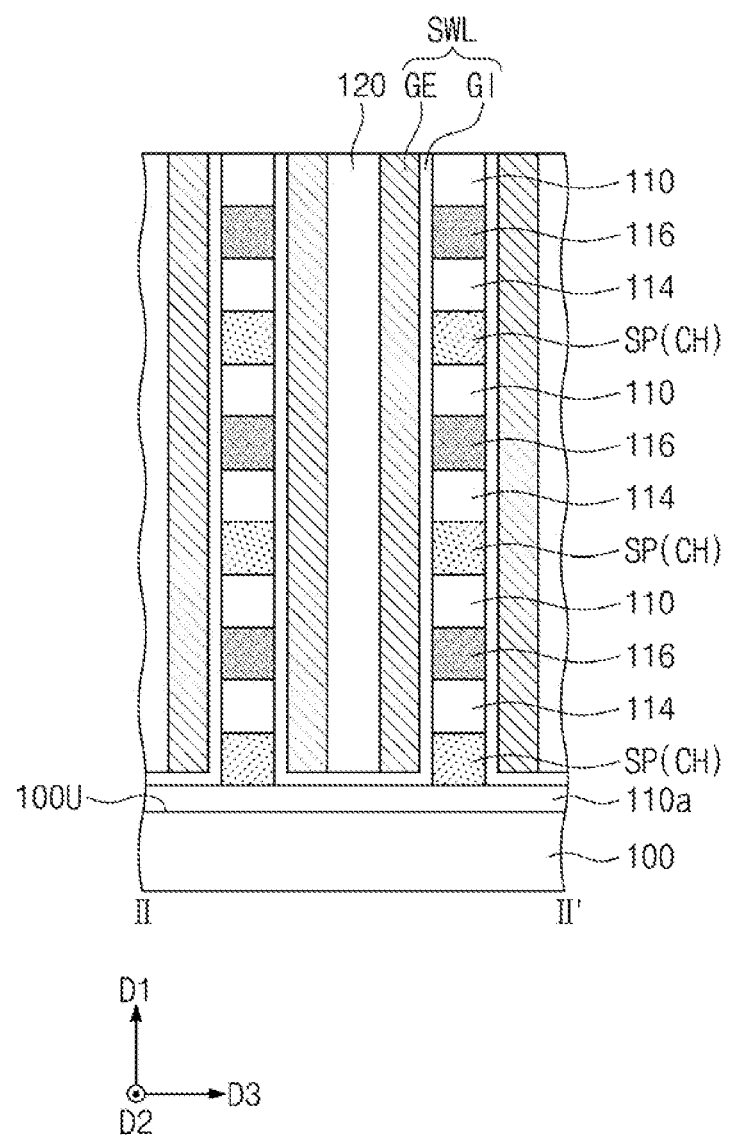

Referring to FIGS. 2, 7A and 7B, first trenches TR1 may be formed in the thin-layer structure TS. The first trenches TR1 may be spaced apart from each other in the second direction D2 and may extend in the third direction D3. Each of the first trenches TR1 may penetrate the thin-layer structure TS in the first direction D1. Each of the first trenches TR1 may expose sidewalls of the sacrificial layers 112, the first capping layers 114, the second capping layers 116, and the upper insulating layers 110 of the thin-layer structure TS. In an implementation, the formation of the first trenches TR1 may include forming a first mask pattern defining regions, in which the first trenches TR1 will be formed, on the thin-layer structure TS, and etching the thin-layer structure TS using the first mask pattern as an etch mask.

The sidewalls of the sacrificial layers 112, which are exposed by each of the first trenches TR1, may be recessed. Thus, first recess regions R1 may be formed in the thin-layer structure TS. The first recess regions R1 may be formed between the lower insulating layer 110a and a lowermost one of the first capping layers 114 and between each of the upper insulating layers 110 and each of the others of the first capping layers 114.

Semiconductor patterns SP may be formed in the first recess regions R1, respectively. The formation of the semiconductor patterns SP may include forming a semiconductor layer filling the first recess regions R1 and filling at least a portion of the first trenches TR1 on the thin-layer structure TS, and removing the semiconductor layer from the first trenches TR1. The formation of the semiconductor patterns SP may further include etching sidewalls of the semiconductor layer in the first recess regions R1. Thus, each of the semiconductor patterns SP may fill a portion of each of the first recess regions R1, and a remaining portion of each of the first recess regions R1 may be exposed. The formation of the semiconductor patterns SP may further include forming a first dopant region IM1 and a second dopant region IM2 in each of the semiconductor patterns SP by injecting dopants into each of the semiconductor patterns SP. Each of the semiconductor patterns SP may include a channel region CH between the first dopant region IM1 and the second dopant region IM2. The first dopant region IM1 and the second dopant region IM2 may have a different conductivity type from that of the channel region CH.

Figure 8A:
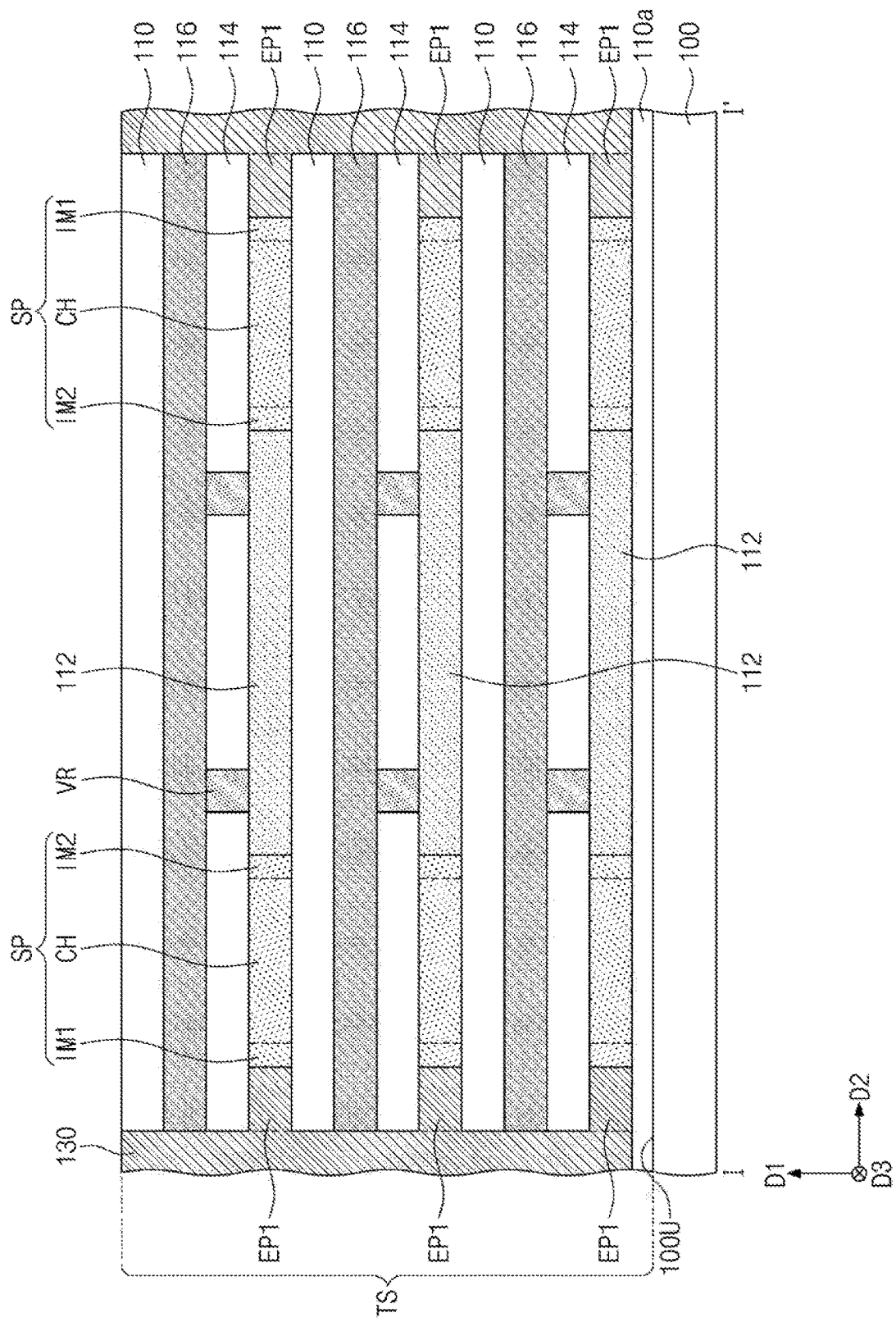
Figure 8B:
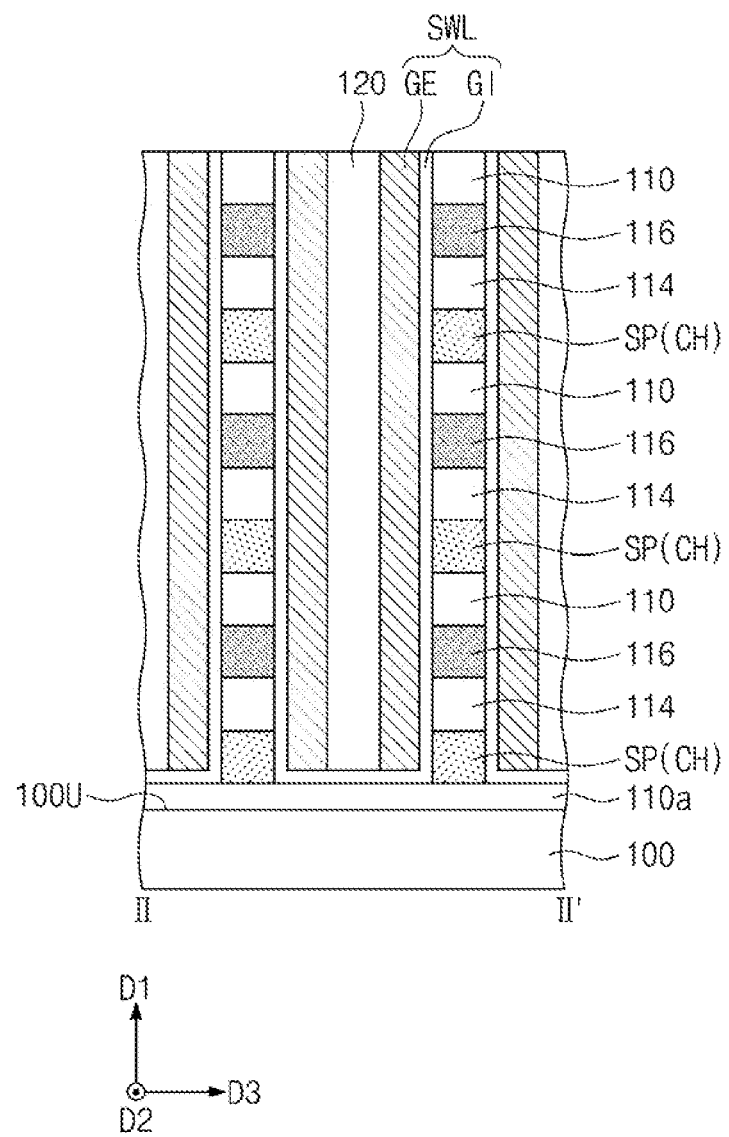

Referring to FIGS. 2, 8A and 8B, first electrode patterns EP1 may be formed in the remaining portions of the first recess regions R1, respectively, and vertical conductive patterns 130 may be formed in the first trenches TR1, respectively. In an implementation, the formation of the first electrode patterns EP1 and the vertical conductive patterns 130 may include forming a conductive layer filling the remaining portions of the first recess regions R1 and filling the first trenches TR1 on the thin-layer structure TS, and planarizing the conductive layer until a top surface of the thin-layer structure TS is exposed. The first electrode patterns EP1 and the vertical conductive patterns 130 may include the same conductive material (e.g., the same metal).

Figure 9A:
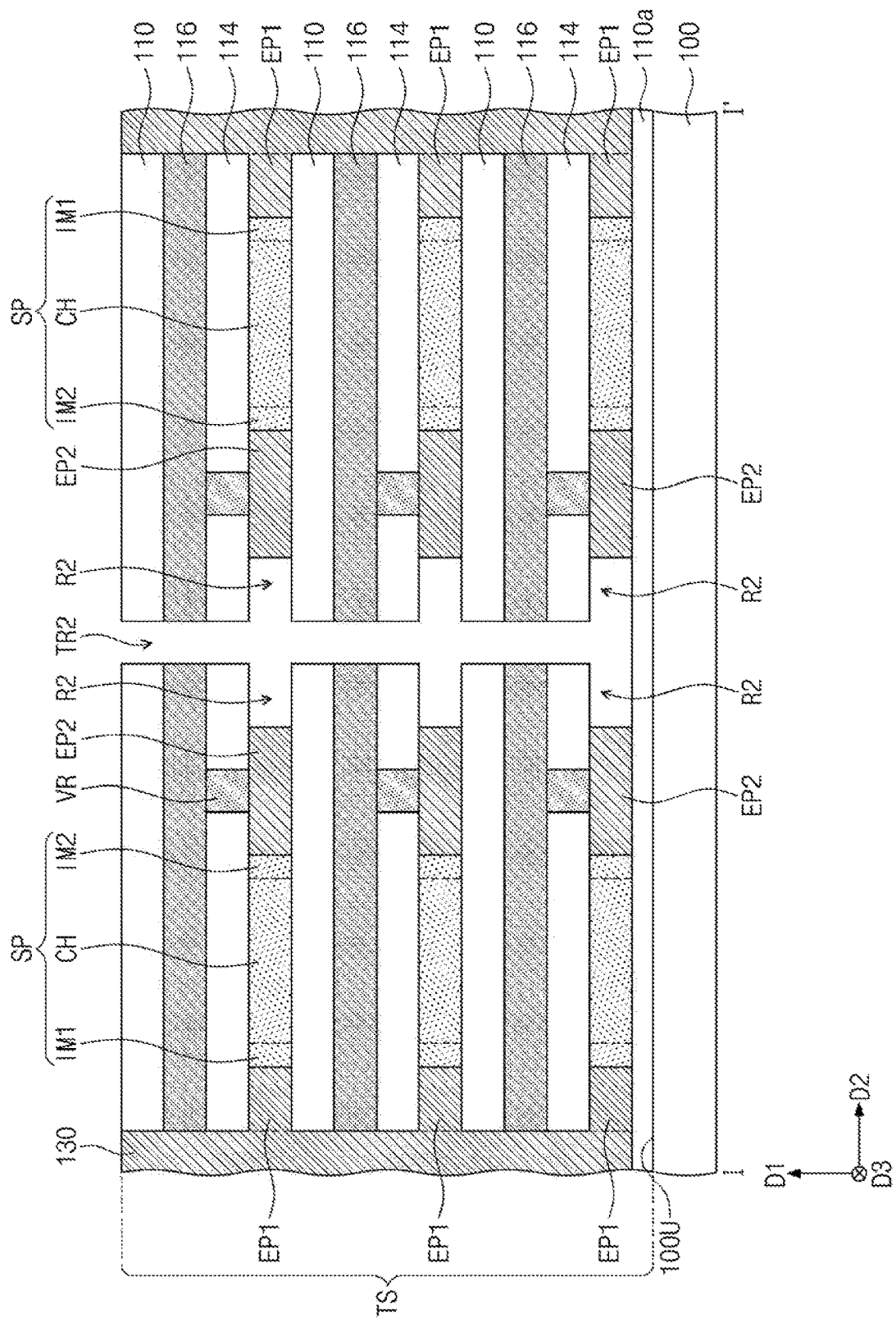
Figure 9B:
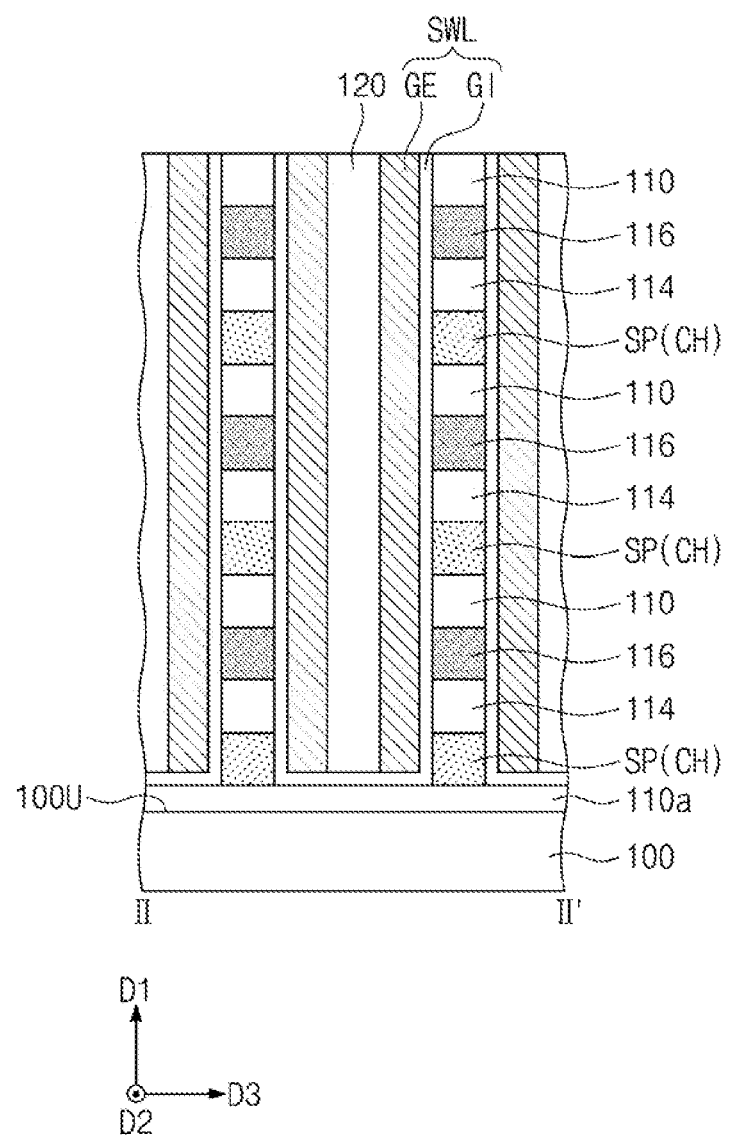

Referring to FIGS. 2, 9A and 9B, a second trench TR2 may be formed in the thin-layer structure TS. The second trench TR2 may be formed between the vertical conductive patterns 130 and may extend in the third direction D3. The second trench TR2 may penetrate the thin-layer structure TS in the first direction D1. The second trench TR2 may expose sidewalls of the sacrificial layers 112, the first capping layers 114, the second capping layers 116 and the upper insulating layers 110 of the thin-layer structure TS. In an implementation, the formation of the second trench TR2 may include forming a second mask pattern defining a region, in which the second trench TR2 will be formed, on the thin-layer structure TS, and etching the thin-layer structure TS using the second mask pattern as an etch mask.

The sacrificial layers 112 exposed by the second trench TR2 may be removed to form second recess regions R2 in the thin-layer structure TS. The second recess regions R2 may be formed between the lower insulating layer 110a and the lowermost one of the first capping layers 114 and between each of the upper insulating layers 110 and each of the others of the first capping layers 114. The second recess regions R2 may expose sidewalls of the semiconductor patterns SP and bottom surfaces of the variable resistance patterns VR.

Second electrode patterns EP2 may be formed in the second recess regions R2, respectively. In an implementation, the formation of the second electrode patterns EP2 may include forming an electrode layer filling the second recess regions R2 and filling at least a portion of the second trench TR2 on the thin-layer structure TS, and removing the electrode layer from the second trench TR2. The formation of the second electrode patterns EP2 may further include etching sidewalls of the electrode layer in the second recess regions R2. Thus, each of the second electrode patterns EP2 may fill a portion of each of the second recess regions R2, and a remaining portion of each of the second recess regions R2 may be exposed. Each of the second electrode patterns EP2 may be connected to the bottom surface of each of the variable resistance patterns VR.

Figure 10A:
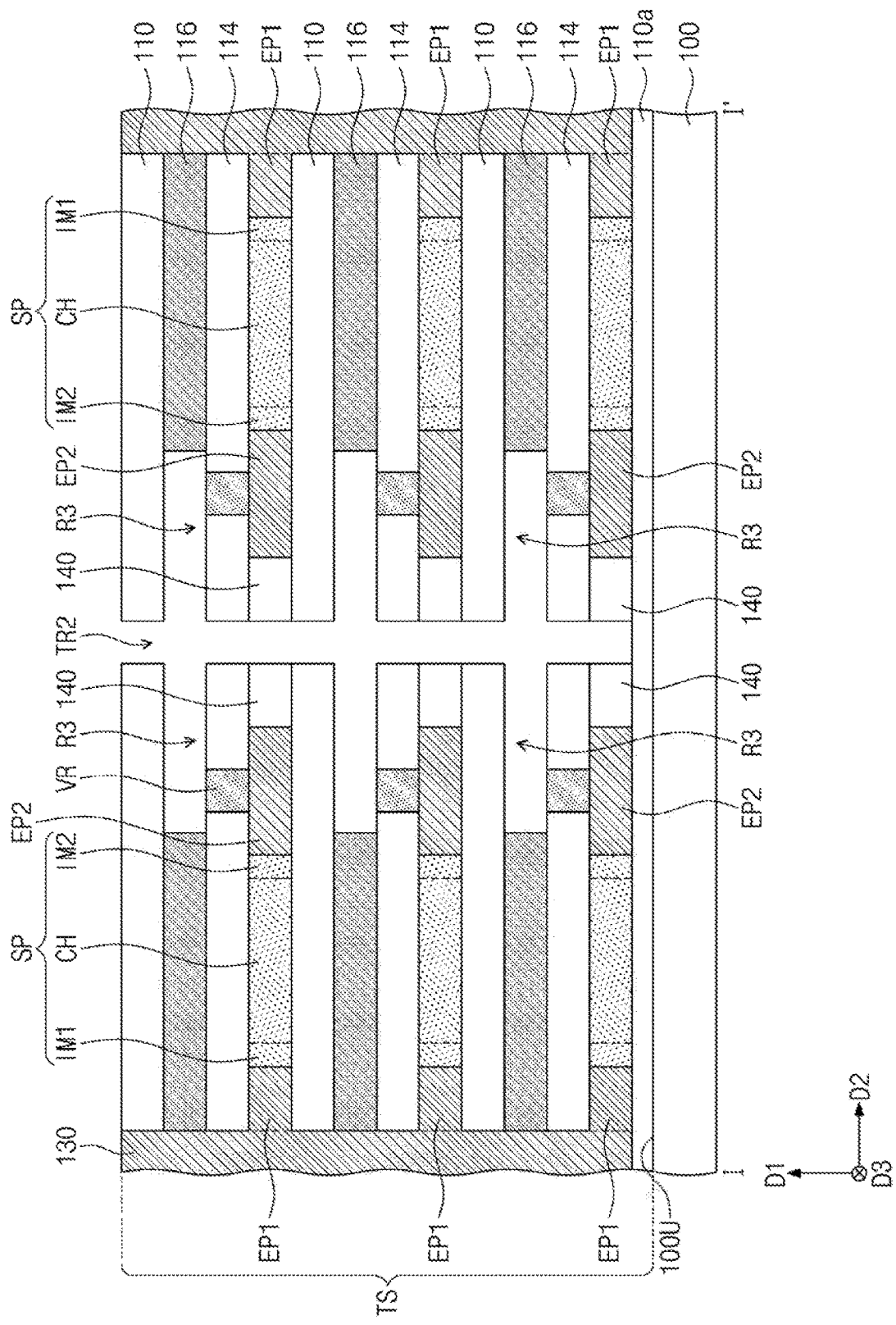
Figure 10B:
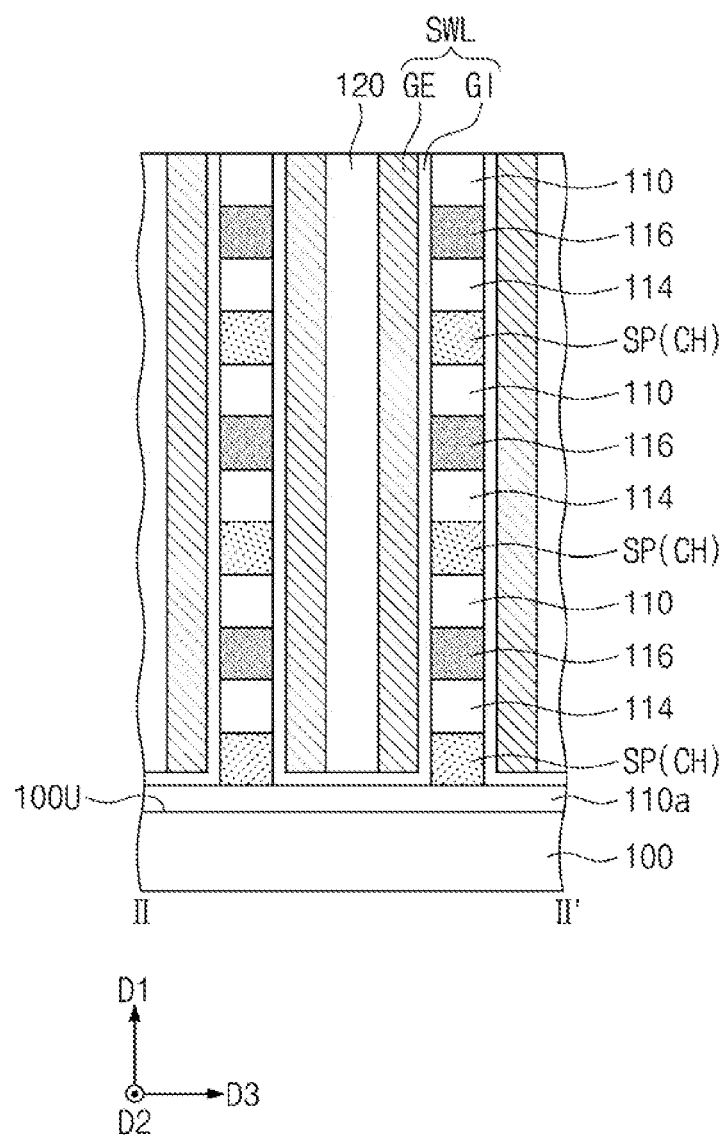

Referring to FIGS. 2, 10A and 10B, horizontal insulating patterns 140 may be formed in the remaining portions of the second recess regions R2, respectively. In an implementation, the formation of the horizontal insulating patterns 140 may include forming an insulating layer filling the remaining portions of the second recess regions R2 and filling at least a portion of the second trench TR2 on the thin-layer structure TS, and removing the insulating layer from the second trench TR2.

The sidewalls of the second capping layers 116, which are exposed by the second trench TR2, may be recessed after the formation of the horizontal insulating patterns 140. Thus, third recess regions R3 may be formed in the thin-layer structure TS. Each of the third recess regions R3 may be formed between each of the first capping layers 114 and each of the upper insulating layers 110. The third recess regions R3 may expose top surfaces of the variable resistance patterns VR. A portion of each of the third recess regions R3 may extend lengthwise in the third direction D3.

Referring again to FIGS. 2, 3A and 3B, conductive lines 150 may be formed in the third recess regions R3, respectively. Each of the conductive lines 150 may include a line portion 154 extending lengthwise in the third direction D3, and extensions 152 extending from one sidewall of the line portion 154 in a direction parallel to the top surface 100U of the substrate 100. The extensions 152 of each of the conductive lines 150 may extend onto the top surfaces of the variable resistance patterns VR spaced apart from each other in the third direction D3, respectively, and may be spaced apart from each other in the third direction D3 on the one sidewall of the line portion 154. In an implementation, the formation of the conductive lines 150 may include forming a conductive layer filling the third recess regions R3 and filling at least a portion of the second trench TR2 on the thin-layer structure TS, and removing the conductive layer from the second trench TR2. After the formation of the conductive lines 150, a separation insulating layer 145 may be formed to fill the second trench TR2.

Figure 11:
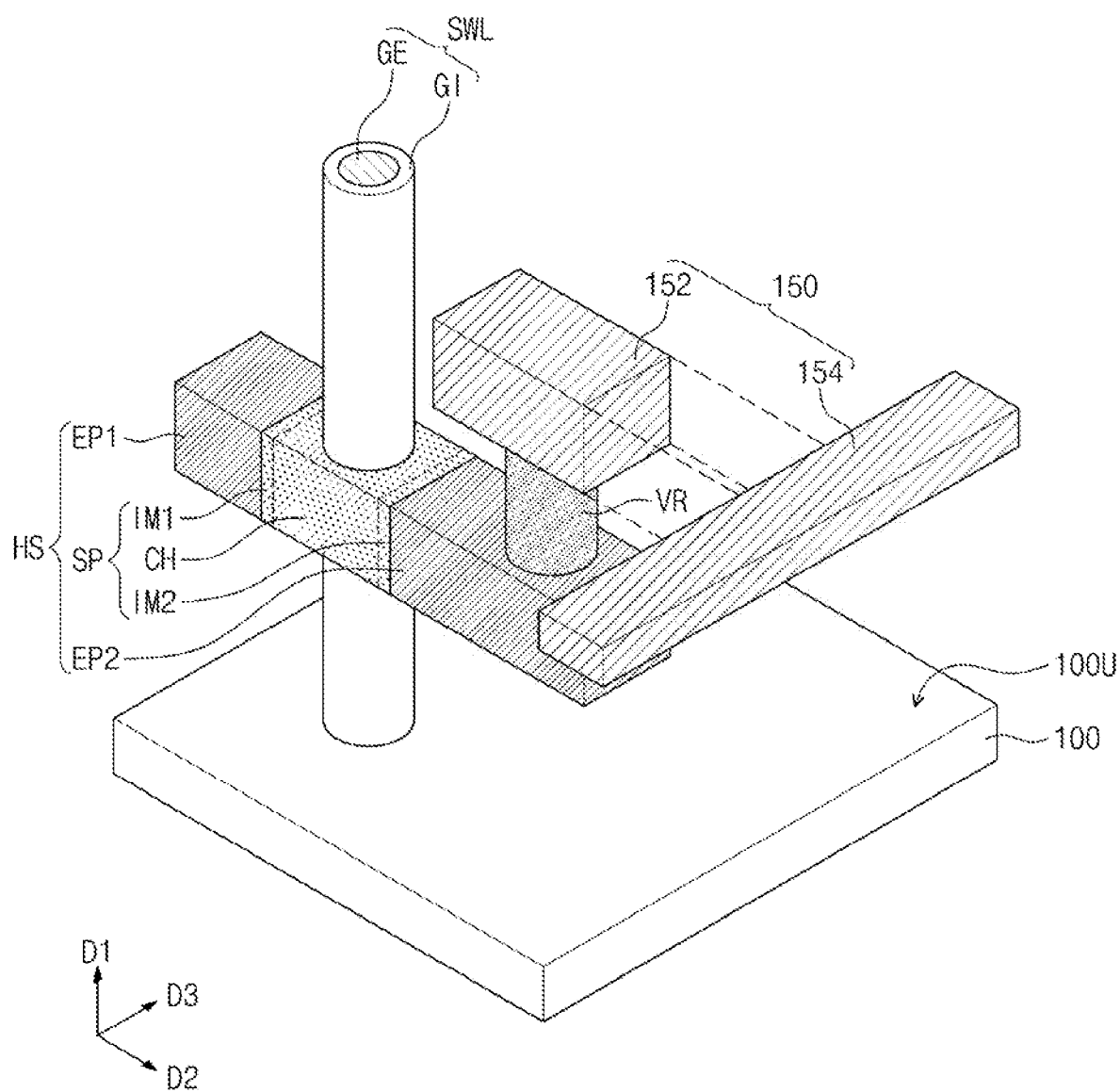
FIG. 11 is a perspective view of a variable resistance memory device according to some embodiments.

FIG. 11 is a perspective view of a variable resistance memory device according to some embodiments. Hereinafter, differences between the present embodiments and the embodiments of FIG. 1 will be mainly described for the purpose of ease and convenience in explanation.

Referring to FIG. 11, according to some embodiments, a selection line SWL may penetrate the horizontal structure HS and may extend lengthwise in the first direction D1. The selection line SWL may penetrate the semiconductor pattern SP of the horizontal structure HS and may be connected to the semiconductor pattern SP. The selection line SWL may include a gate electrode GE penetrating the channel region CH of the semiconductor pattern SP, and a gate dielectric layer GI between the gate electrode GE and the channel region CH of the semiconductor pattern SP. Except for the above differences, other features and components of the variable resistance memory device according to the present embodiments may be substantially the same as corresponding features and components of the variable resistance memory device described with reference to FIG. 1.

Figure 12:
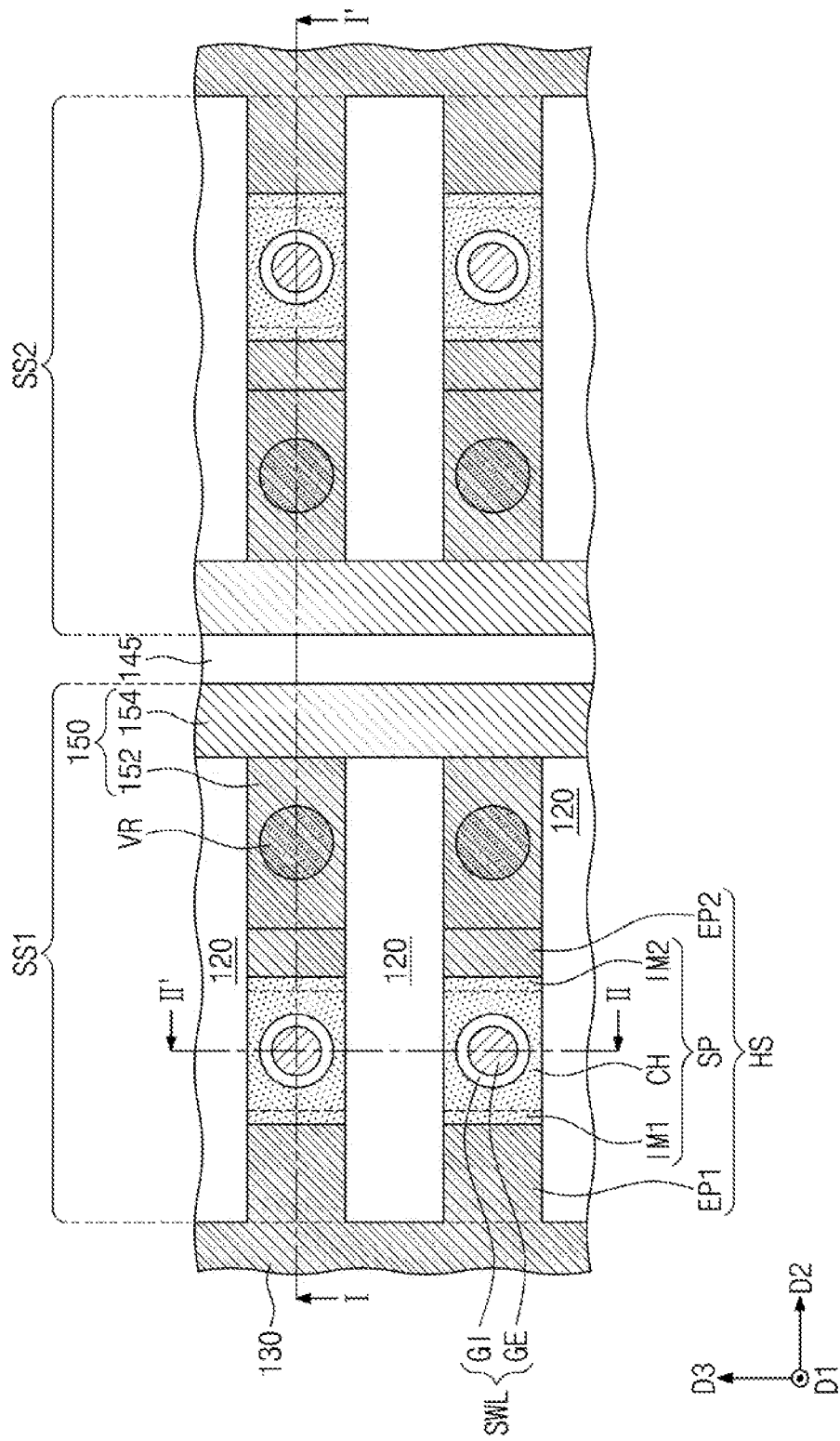
FIG. 12 is a plan view of a variable resistance memory device according to some embodiments.
Figure 13A:
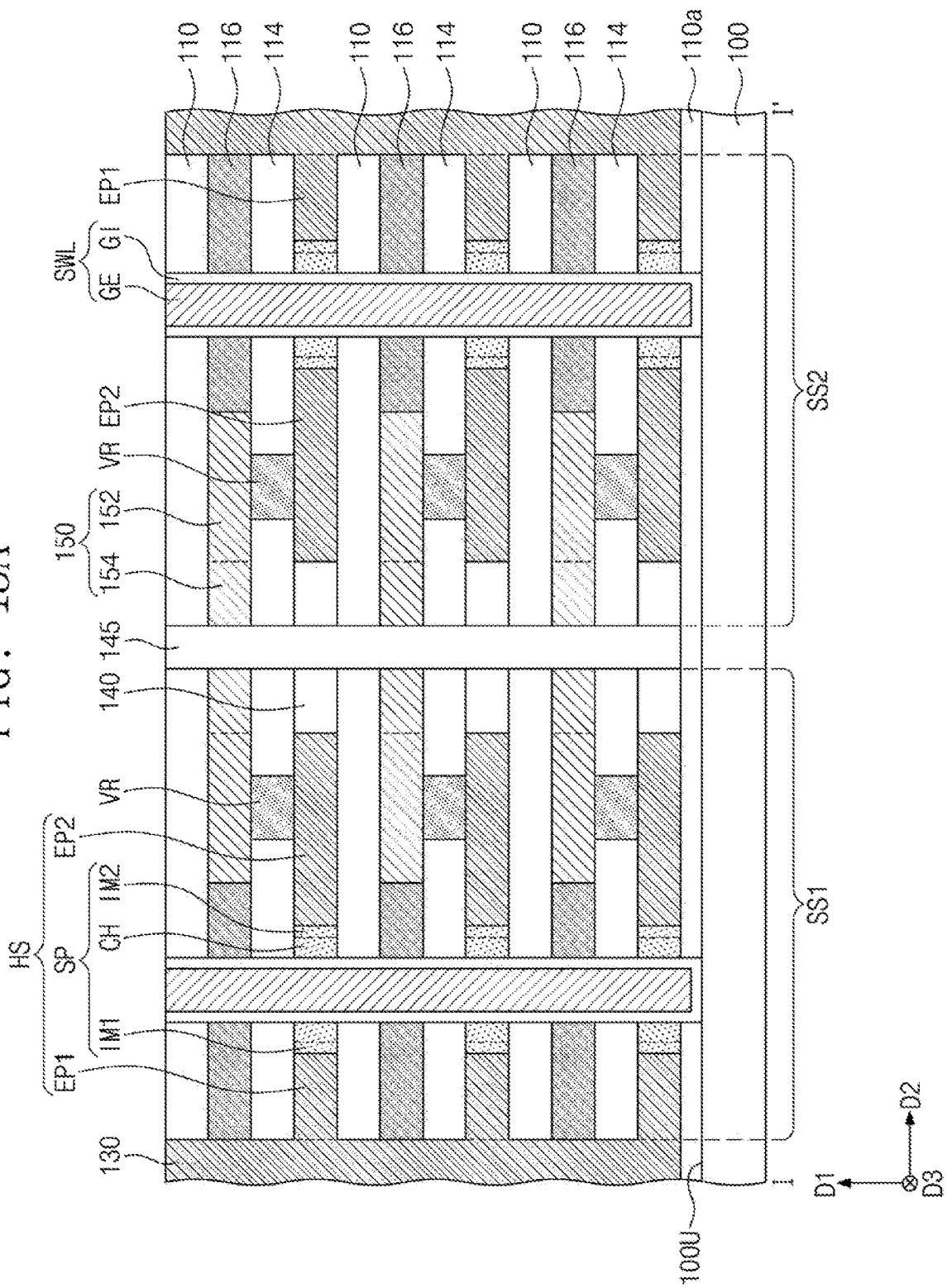
FIGS. 13A and 13B are cross-sectional views taken along lines I-I' and II-II' of FIG. 12, respectively.
Figure 13B:
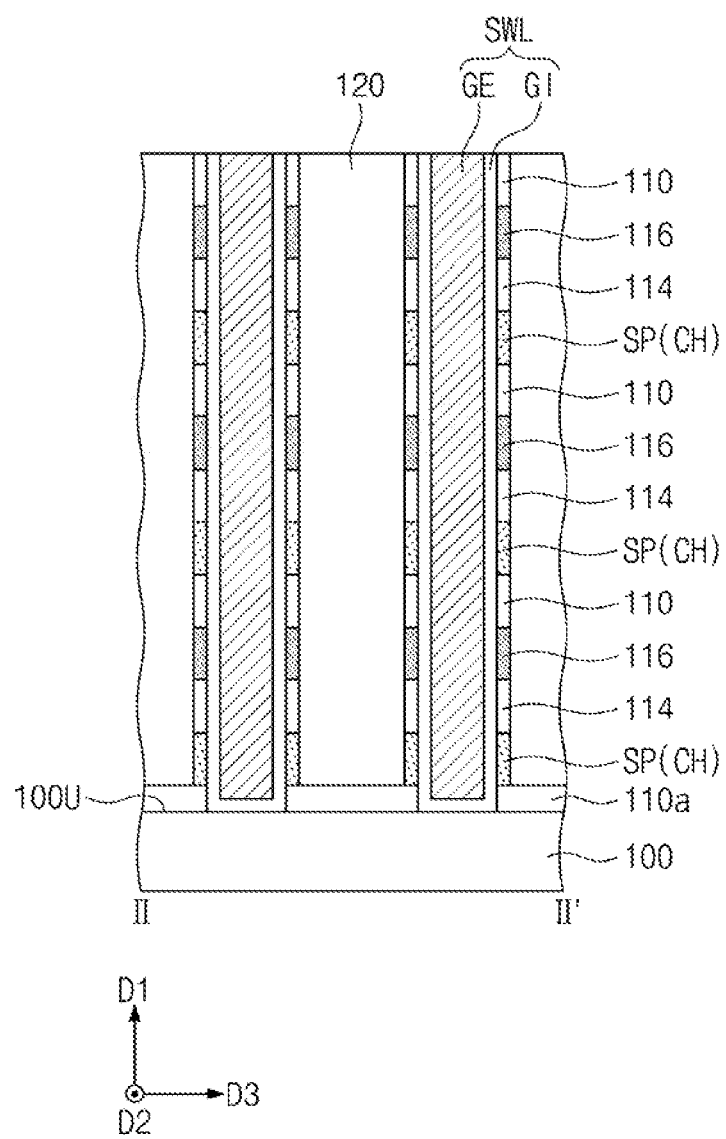

FIG. 12 is a plan view of a variable resistance memory device according to some embodiments. FIGS. 13A and 13B are cross-sectional views taken along lines I-I' and II-II' of FIG. 12, respectively. Hereinafter, differences between the present embodiments and the embodiments of FIGS. 2, 3A, 3B, 4A and 4B will be mainly described for the purpose of ease and convenience in explanation.

Referring to FIGS. 12, 13A and 13B, according to some embodiments, a gate electrode GE may penetrate the horizontal structures HS spaced apart from each other in the first direction D1 and may extend lengthwise in the first direction D1. The gate electrode GE may penetrate the semiconductor patterns SP of the horizontal structures HS spaced apart from each other in the first direction D1. The gate electrode GE may penetrate the channel regions CH of the semiconductor patterns SP.

A gate dielectric layer GI may be between the gate electrode GE and the semiconductor patterns SP of the horizontal structures HS spaced apart from each other in the first direction D1. The gate dielectric layer GI may be between the gate electrode GE and the channel regions CH of the semiconductor patterns SP. The gate dielectric layer GI may extend in the first direction D1 between the gate electrode GE and the first capping layers 114, between the gate electrode GE and the second capping layers 116, between the gate electrode GE and the upper insulating layers 110 and between the gate electrode GE and the lower insulating layer 110a and may extend between the gate electrode GE and the substrate 100.

The gate electrode GE and the gate dielectric layer GI may constitute a selection line SWL. The selection line SWL may penetrate the semiconductor patterns SP of the horizontal structures HS spaced apart from each other in the first direction D1. The selection line SWL may penetrate the channel regions CH of the semiconductor patterns SP.

Except for the above differences, other features and components of the variable resistance memory device according to the present embodiments may be substantially the same as corresponding features and components of the variable resistance memory device described with reference to FIGS. 2, 3A, 3B, 4A and 4B.

FIGS. 14A to 19A are cross-sectional views corresponding to the line I-I' of FIG. 12 of stages in a method of manufacturing a variable resistance memory device according to some embodiments. FIGS. 14B to 19B are cross-sectional views corresponding to the line II-II' of FIG. 12 of stages in a method of manufacturing a variable resistance memory device according to some embodiments. Hereinafter, differences between the present embodiments and the embodiments of FIGS. 5A to 10A and 5B to 10B will be mainly described for the purpose of ease and convenience in explanation.

Figure 14A:
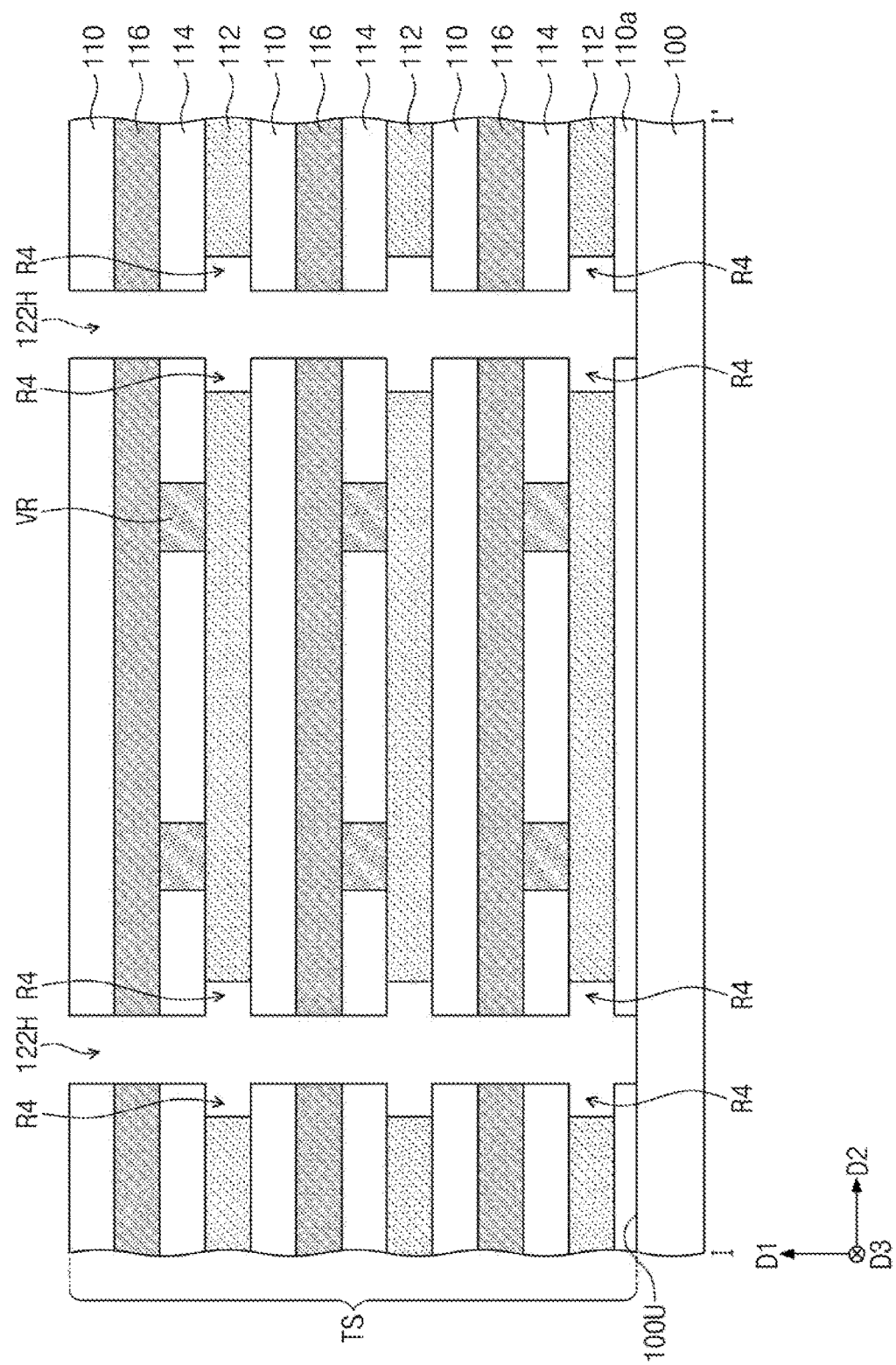
Figure 14B:
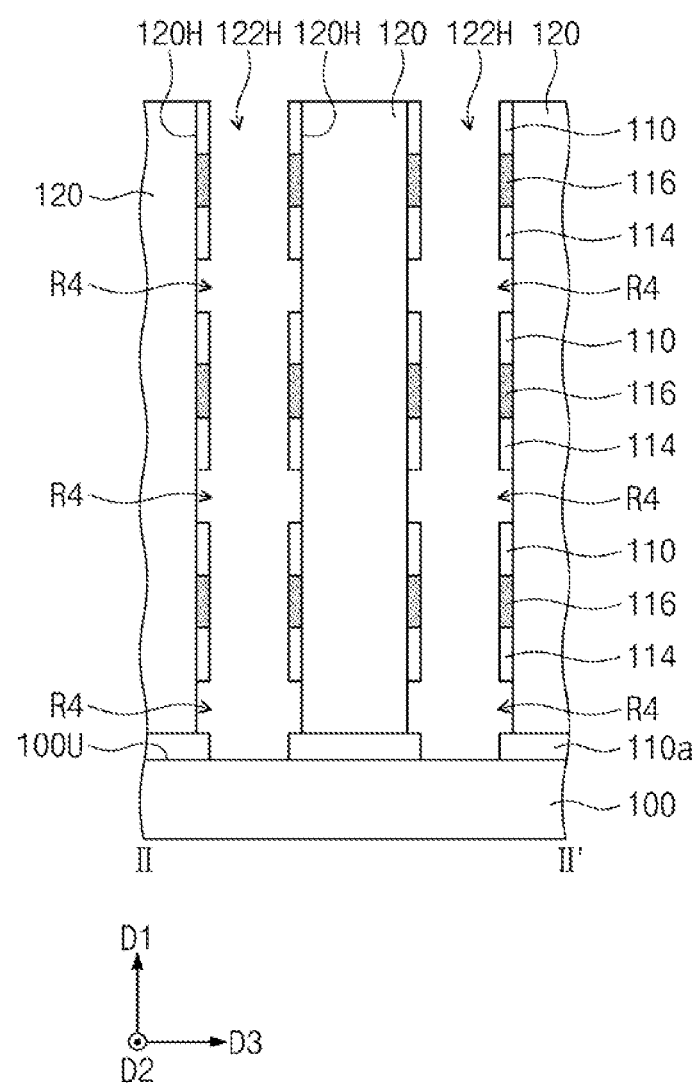

Referring to FIGS. 12, 14A and 14B, a lower insulating layer 110a and a sacrificial layer 112 may be sequentially formed on a substrate 100, and variable resistance patterns VR may be formed on the sacrificial layer 112. After the formation of the variable resistance patterns VR, a first capping layer 114 may be formed on the sacrificial layer 112. The first capping layer 114 may be formed to expose top surfaces of the variable resistance patterns VR. A second capping layer 116 may be formed on the first capping layer 114 and may be formed to cover the exposed top surfaces of the variable resistance patterns VR. An upper insulating layer 110 may be formed on the second capping layer 116. The sacrificial layer 112, the variable resistance patterns VR, the first capping layer 114, the second capping layer 116 and the upper insulating layer 110 may be alternately and repeatedly stacked on the substrate 100 in the first direction D1, and a thin-layer structure TS may be formed on the substrate 100. The thin-layer structure TS may include the variable resistance patterns VR three-dimensionally arranged in the first direction D1, the second direction D2 and the third direction D3.

Vertical holes 120H may be formed in the thin-layer structure TS. Each of the vertical holes 120H may penetrate the thin-layer structure TS in the first direction D1. The vertical holes 120H may extend in the second direction D2 in the thin-layer structure TS and may be spaced apart from each other in the third direction D3. Vertical insulating patterns 120 may be formed in the vertical holes 120H, respectively, and may be formed to fill the vertical holes 120H, respectively. The vertical insulating patterns 120 may extend in the second direction D2 and may be spaced apart from each other in the third direction D3.

Gate holes 122H may be formed in the thin-layer structure TS. Each of the gate holes 122H may be formed between a pair of the vertical insulating patterns 120 adjacent to each other in the third direction D3 and may penetrate the thin-layer structure TS in the first direction D1. Each of the gate holes 122H may expose sidewalls of the sacrificial layers 112, the first capping layers 114, the second capping layers 116 and the upper insulating layers 110 of the thin-layer structure TS. Each of the gate holes 122H may expose the top surface 100U of the substrate 100. In an implementation, the gate holes 122H and the vertical insulating patterns 120 may be alternately and repeatedly arranged in the third direction D3.

The sidewalls of the sacrificial layers 112, which are exposed by each of the gate holes 122H, may be recessed. Thus, fourth recess regions R4 may be formed in the thin-layer structure TS. The fourth recess regions R4 may be formed between the lower insulating layer 110a and the lowermost one of the first capping layers 114 and between each of the upper insulating layers 110 and each of the others of the first capping layers 114.

Figure 15A:
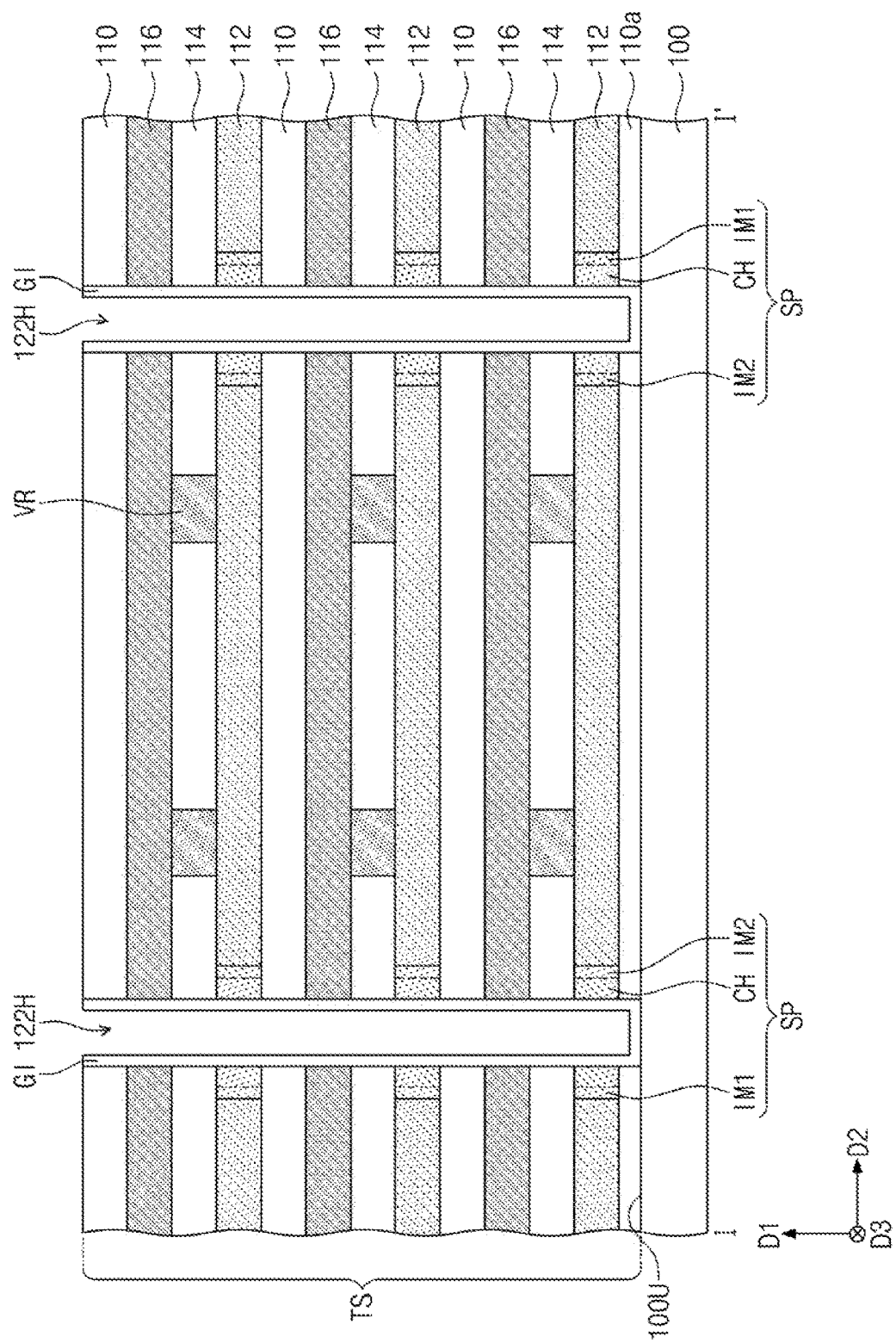
Figure 15B:
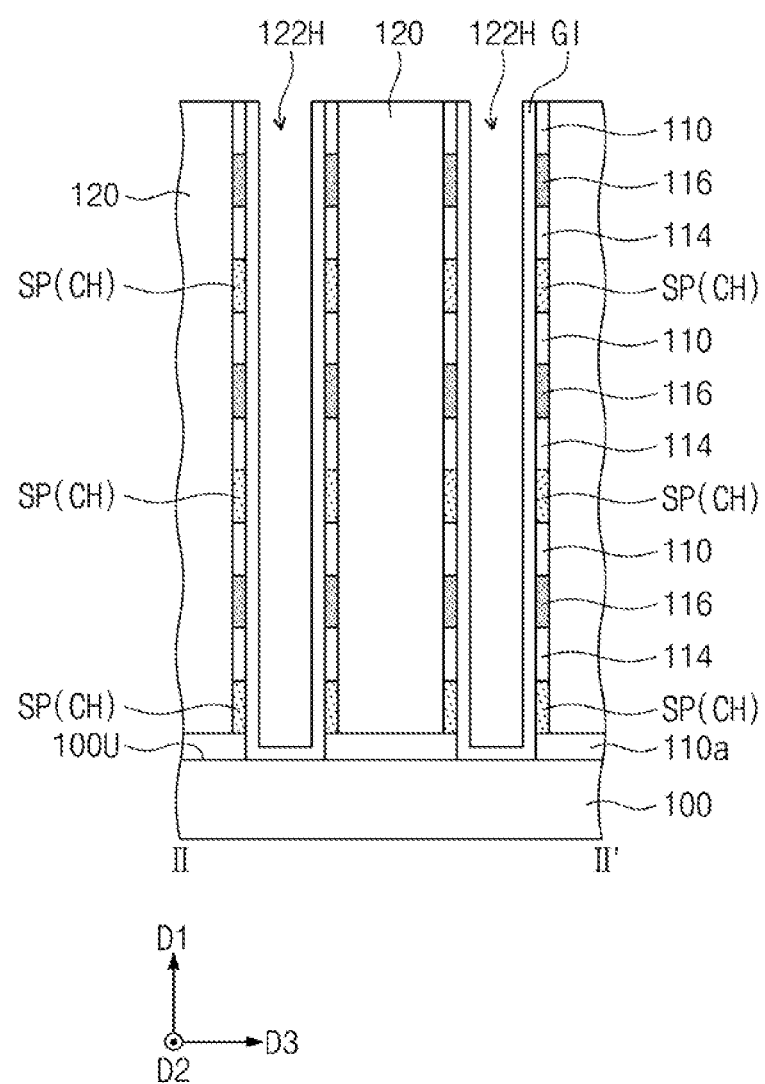

Referring to FIGS. 12, 15A and 15B, semiconductor patterns SP may be formed in the fourth recess regions R4, respectively. The formation of the semiconductor patterns SP may include forming a semiconductor layer filling the fourth recess regions R4 and filling at least a portion of the gate holes 122H on the thin-layer structure TS, and removing the semiconductor layer from the gate holes 122H. The formation of the semiconductor patterns SP may further include forming a first dopant region IM1 and a second dopant region IM2 in each of the semiconductor patterns SP by injecting dopants into each of the semiconductor patterns SP. Each of the semiconductor patterns SP may include a channel region CH between the first dopant region IM1 and the second dopant region IM2. The first dopant region IM1 and the second dopant region IM2 may have a different conductivity type from that of the channel region CH.

A gate dielectric layer GI may be formed to cover an inner surface of each of the gate holes 122H with a substantially uniform thickness.

Figure 16A:
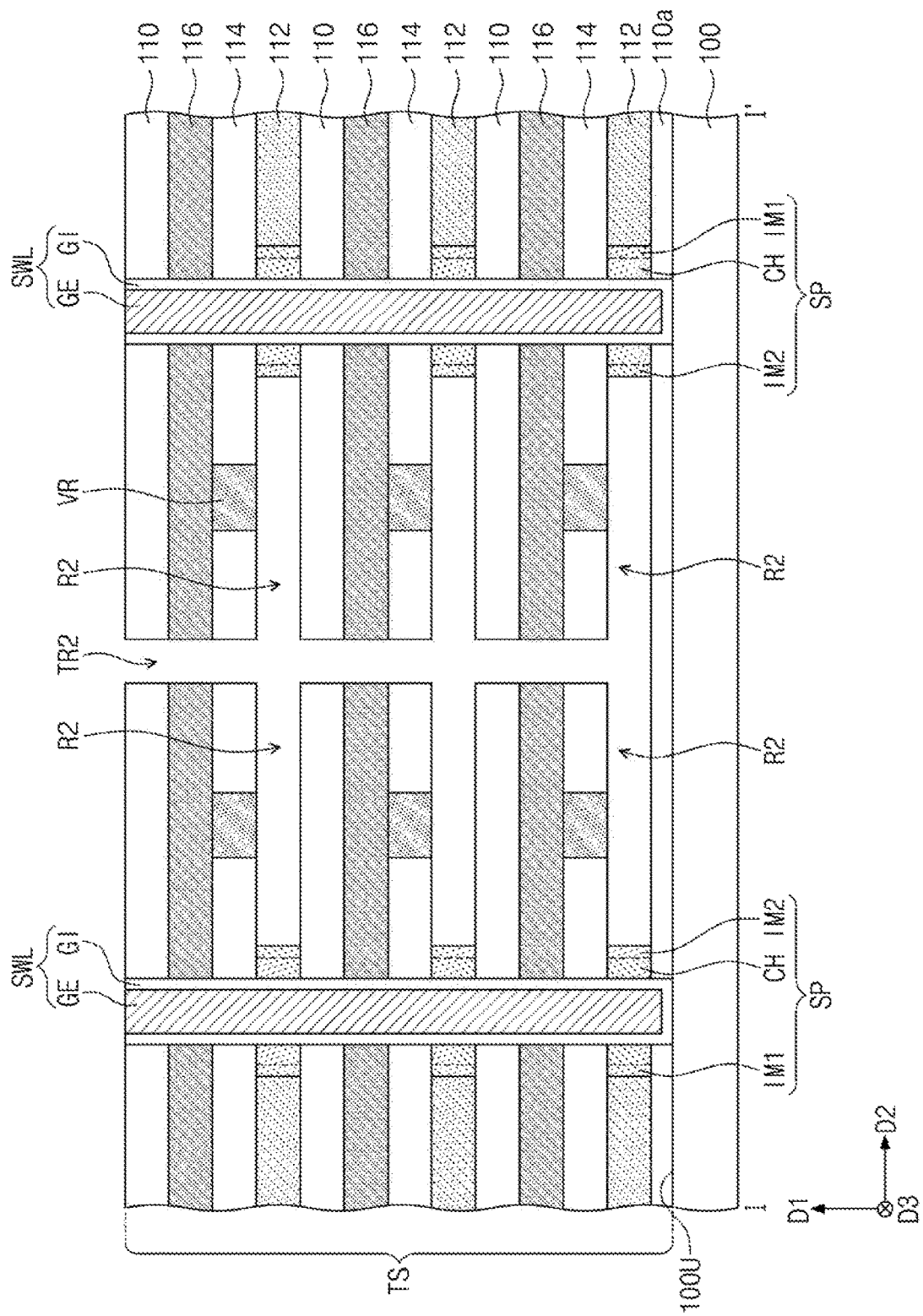
Figure 16B:
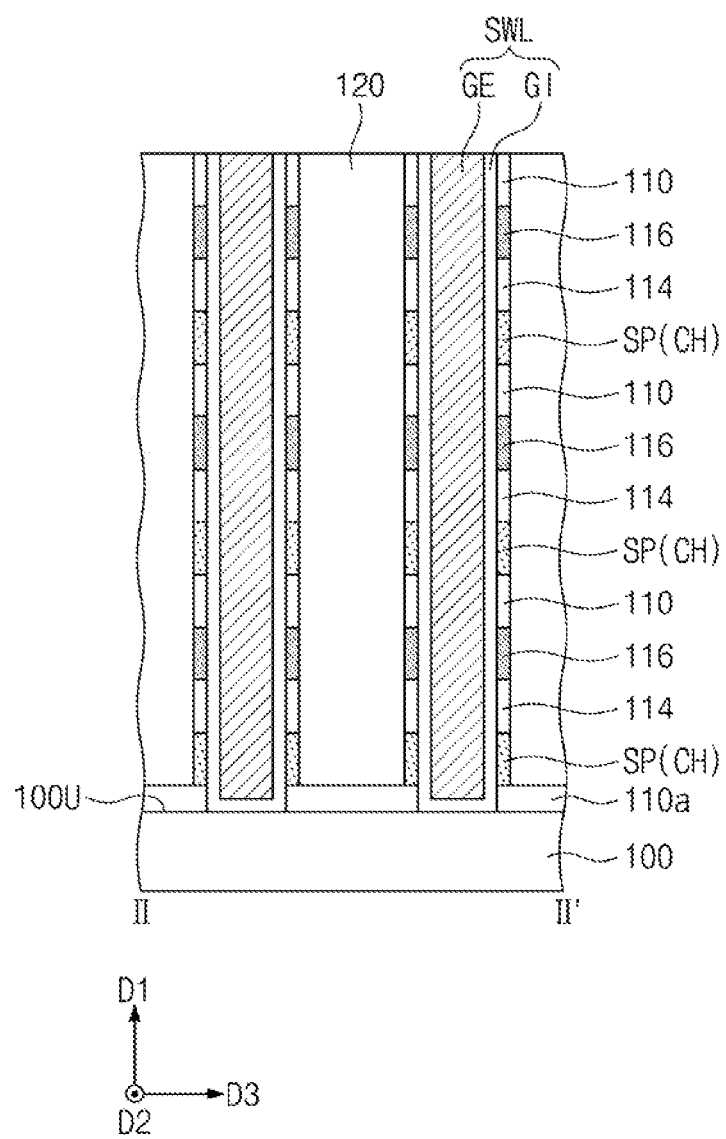

Referring to FIGS. 12, 16A and 16B, a gate electrode GE may be formed in each of the gate holes 122H. The gate electrode GE may fill a remaining portion of each of the gate holes 122H. The formation of the gate electrode GE may include forming a gate electrode layer filling the remaining portion of each of the gate holes 122H on the thin-layer structure TS, and planarizing the gate electrode layer until a top surface of the thin-layer structure TS is exposed.

The gate electrode GE and the gate dielectric layer GI may constitute a selection line SWL. A plurality of the selection lines SWL may be spaced apart from each other in the third direction D3, and the selection lines SWL and the vertical insulating patterns 120 may be alternately and repeatedly arranged in the third direction D3.

A second trench TR2 may be formed in the thin-layer structure TS. The second trench TR2 may be formed between a pair of the selection lines SWL spaced apart from each other in the second direction D2. The second trench TR2 may penetrate the thin-layer structure TS in the first direction D1 and may extend in the third direction D3. The second trench TR2 may expose sidewalls of the sacrificial layers 112, the first capping layers 114, the second capping layers 116, and the upper insulating layers 110 of the thin-layer structure TS.

The sacrificial layers 112 exposed by the second trench TR2 may be removed to form second recess regions R2 in the thin-layer structure TS. The second recess regions R2 may be formed between the lower insulating layer 110a and the lowermost one of the first capping layers 114 and between each of the upper insulating layers 110 and each of the others of the first capping layers 114. The second recess regions R2 may expose sidewalls of the semiconductor patterns SP and bottom surfaces of the variable resistance patterns VR.

Figure 17A:
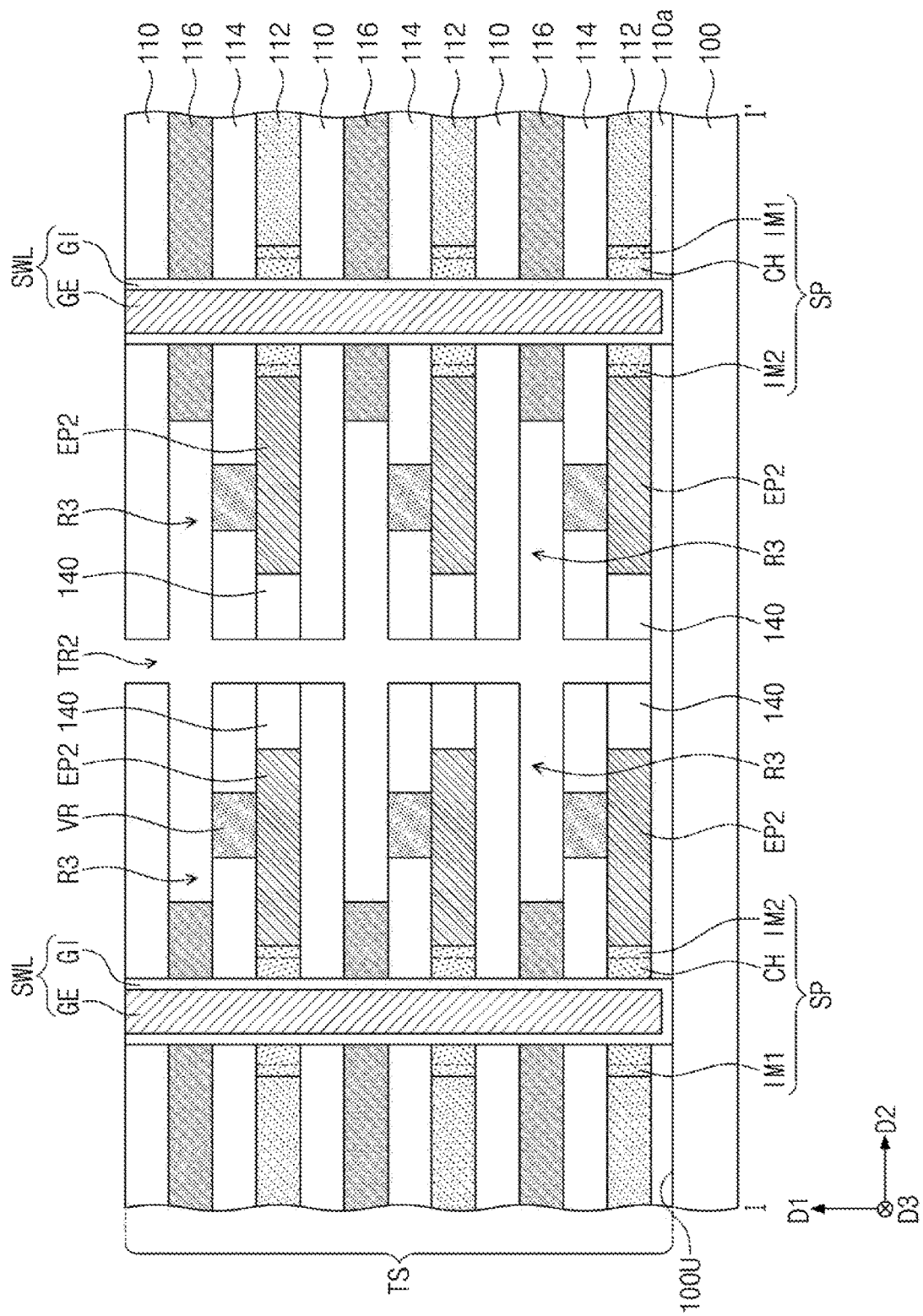
Figure 17B:
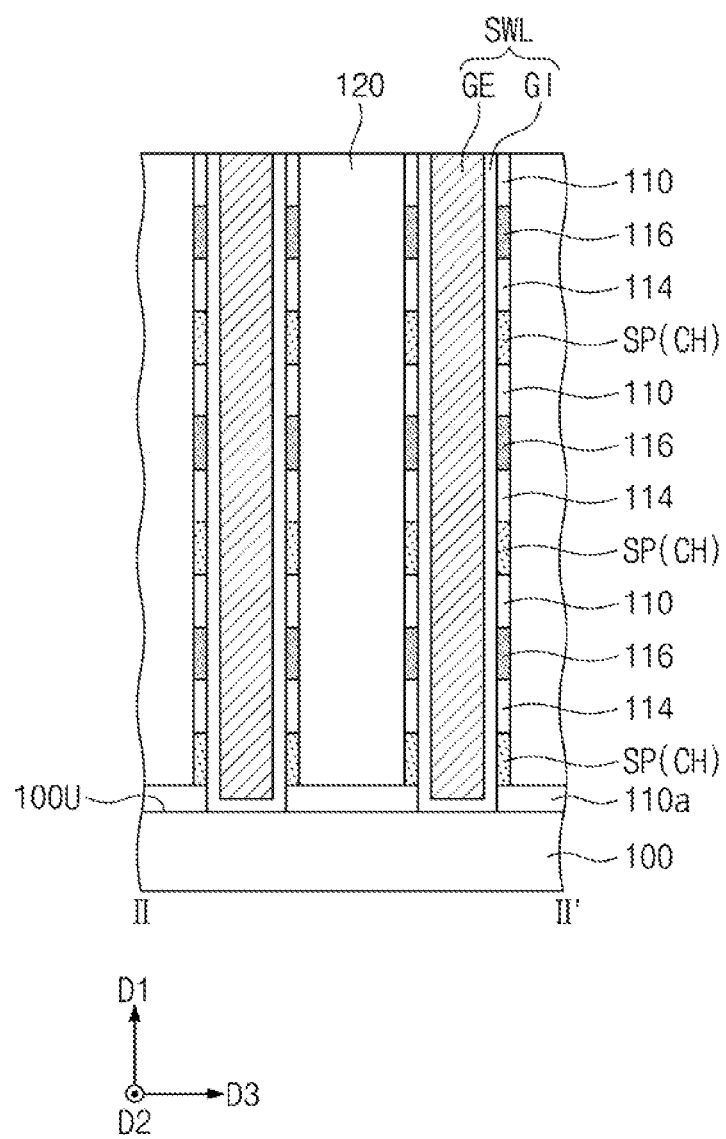

Referring to FIGS. 12, 17A and 17B, second electrode patterns EP2 may be formed in the second recess regions R2, respectively. Each of the second electrode patterns EP2 may fill a portion of each of the second recess regions R2. Each of the second electrode patterns EP2 may be connected to the bottom surface of each of the variable resistance patterns VR. Horizontal insulating patterns 140 may be formed in remaining portions of the second recess regions R2, respectively.

The sidewalls of the second capping layers 116, which are exposed by the second trench TR2, may be recessed after the formation of the horizontal insulating patterns 140. Thus, third recess regions R3 may be formed in the thin-layer structure TS. Each of the third recess regions R3 may be formed between each of the first capping layers 114 and each of the upper insulating layers 110. The third recess regions R3 may expose top surfaces of the variable resistance patterns VR. A portion of each of the third recess regions R3 may extend lengthwise in the third direction D3.

Figure 18A:
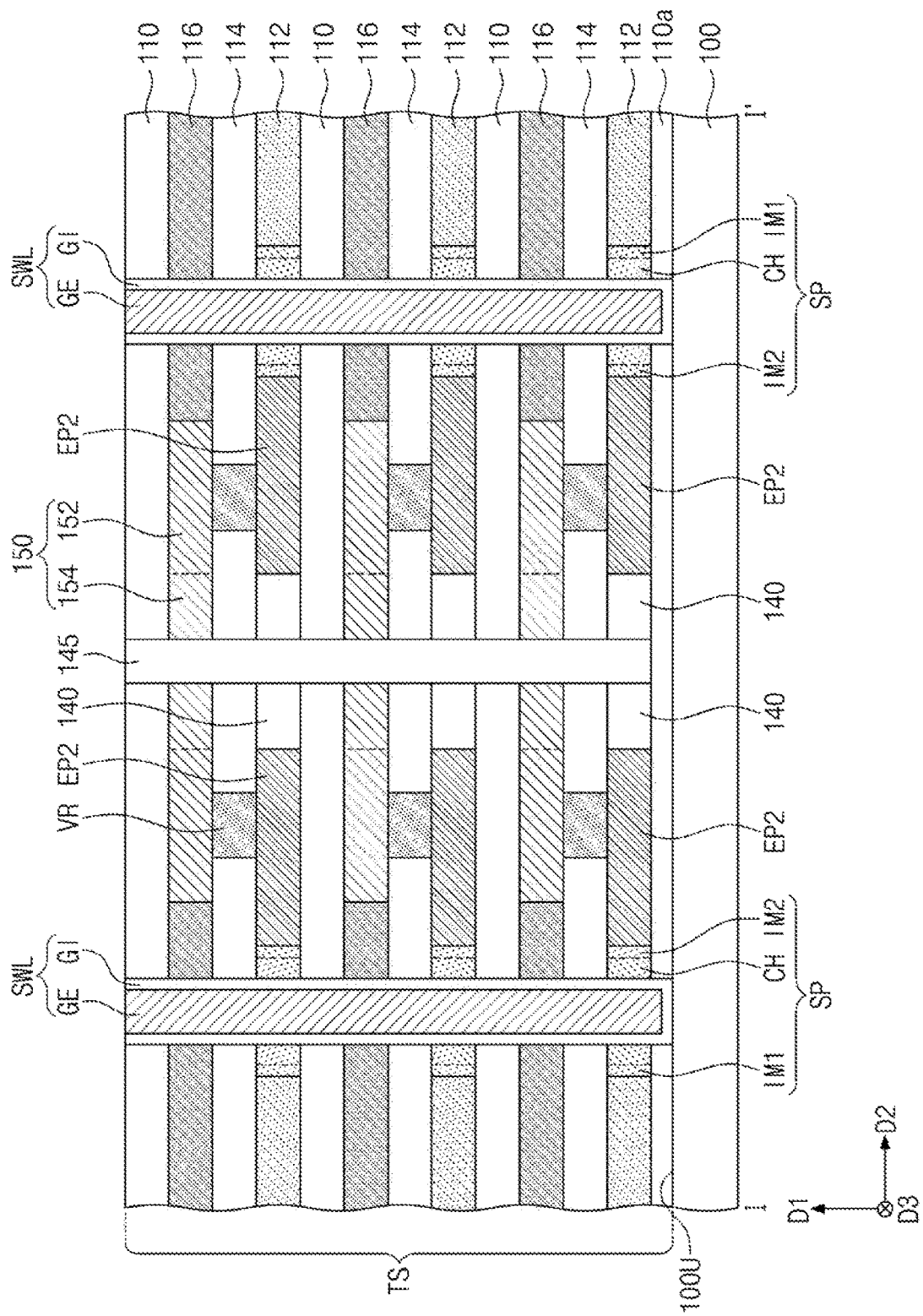
Figure 18B:
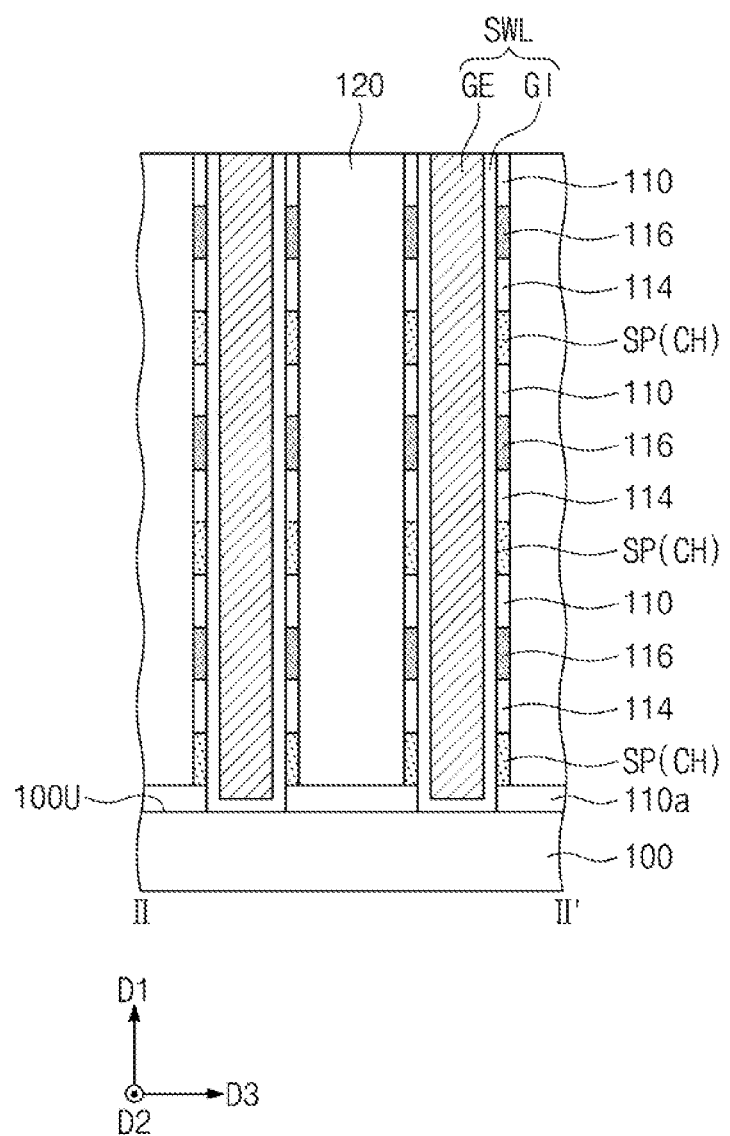

Referring to FIGS. 12, 18A and 18B, conductive lines 150 may be formed in the third recess regions R3, respectively. Each of the conductive lines 150 may include a line portion 154 extending lengthwise in the third direction D3, and extensions 152 extending from one sidewall of the line portion 154 in a direction parallel to the top surface 100U of the substrate 100. After the formation of the conductive lines 150, a separation insulating layer 145 may be formed to fill the second trench TR2.

Figure 19A:
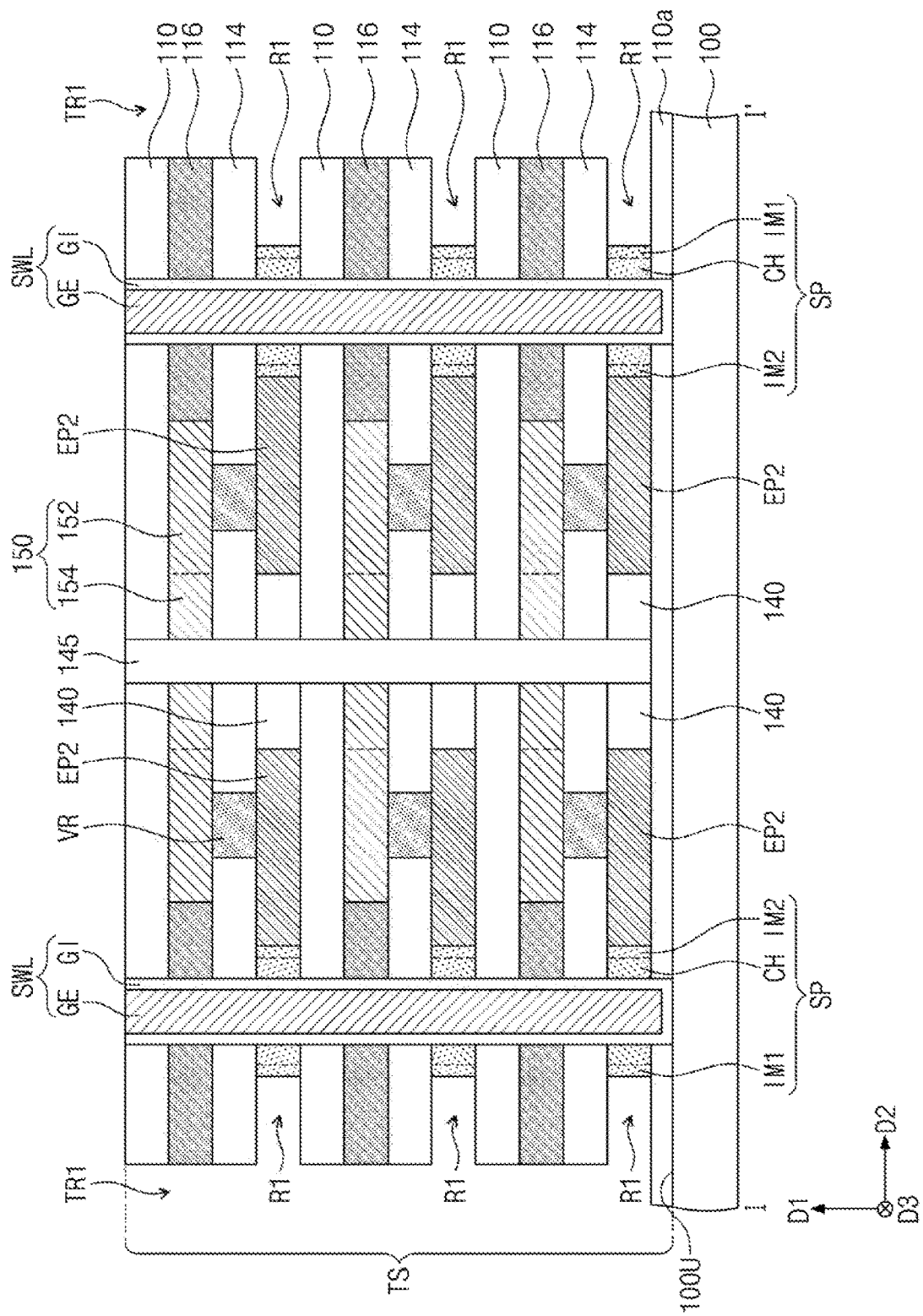
Figure 19B:
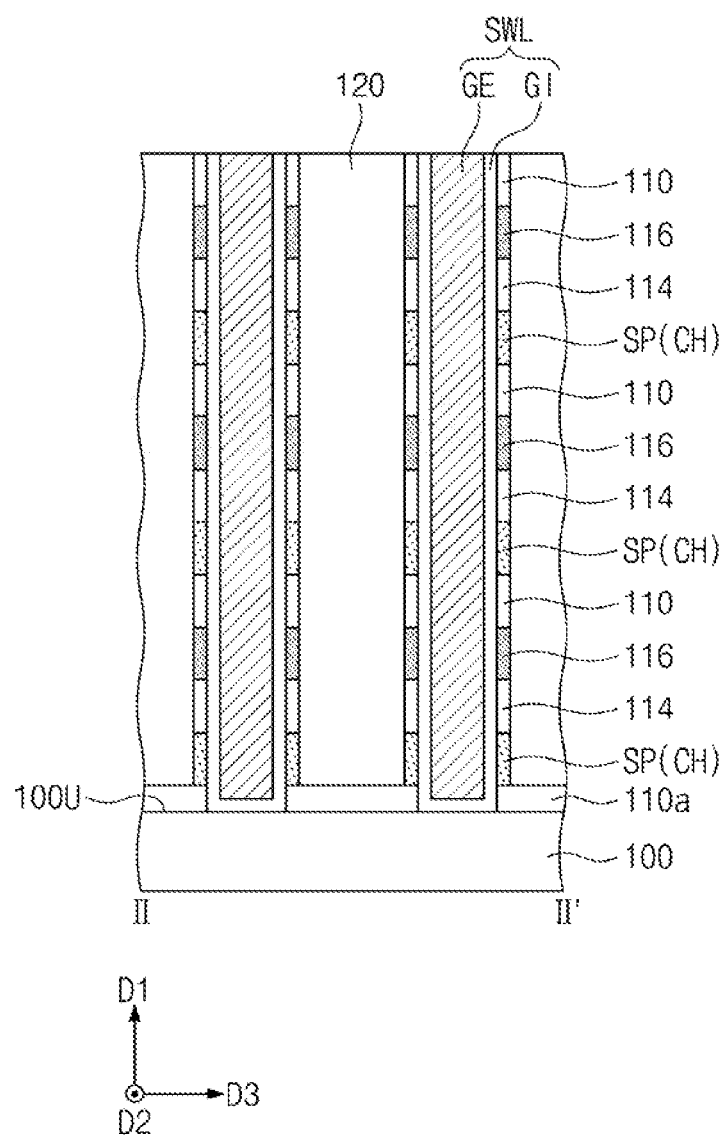

Referring to FIGS. 12, 19A and 19B, first trenches TR1 may be formed in the thin-layer structure TS. The first trenches TR1 may be spaced apart from each other in the second direction D2 and may extend in the third direction D3. The separation insulating layer 145 and the pair of selection lines SWL spaced apart from each other in the second direction D2 may be between the first trenches TR1. Each of the first trenches TR1 may penetrate the thin-layer structure TS in the first direction D1. Each of the first trenches TR1 may expose sidewalls of the sacrificial layers 112, the first capping layers 114, the second capping layers 116 and the upper insulating layers 110 of the thin-layer structure TS.

The sacrificial layers 112 exposed by each of the first trenches TR1 may be removed. Thus, first recess regions R1 may be formed in the thin-layer structure TS. The first recess regions R1 may be formed between the lower insulating layer 110a and the lowermost one of the first capping layers 114 and between each of the upper insulating layers 110 and each of the others of the first capping layers 114. The first recess regions R1 may expose sidewalls of the semiconductor patterns SP.

Referring again to FIGS. 12, 13A and 13B, first electrode patterns EP1 may be formed in the first recess regions R1, respectively, and vertical conductive patterns 130 may be formed in the first trenches TR1, respectively. In an implementation, the formation of the first electrode patterns EP1 and the vertical conductive patterns 130 may include forming a conductive layer filling the remaining portions of the first recess regions R1 and filling the first trenches TR1 on the thin-layer structure TS, and planarizing the conductive layer until a top surface of the thin-layer structure TS is exposed.

FIGS. 20A to 26A are cross-sectional views corresponding to the line I-I' of FIG. 12 of stages in a method of manufacturing a variable resistance memory device according to some embodiments. FIGS. 20B to 26B are cross-sectional views corresponding to the line II-II' of FIG. 12 of stages in a method of manufacturing a variable resistance memory device according to some embodiments. FIGS. 21C to 21E are schematic views of planar shapes of a variable resistance pattern of FIG. 21A. Hereinafter, differences between the present embodiments and the embodiments of FIGS. 5A to 10A and 5B to 10B will be mainly described for the purpose of ease and convenience in explanation.

Figure 20A:
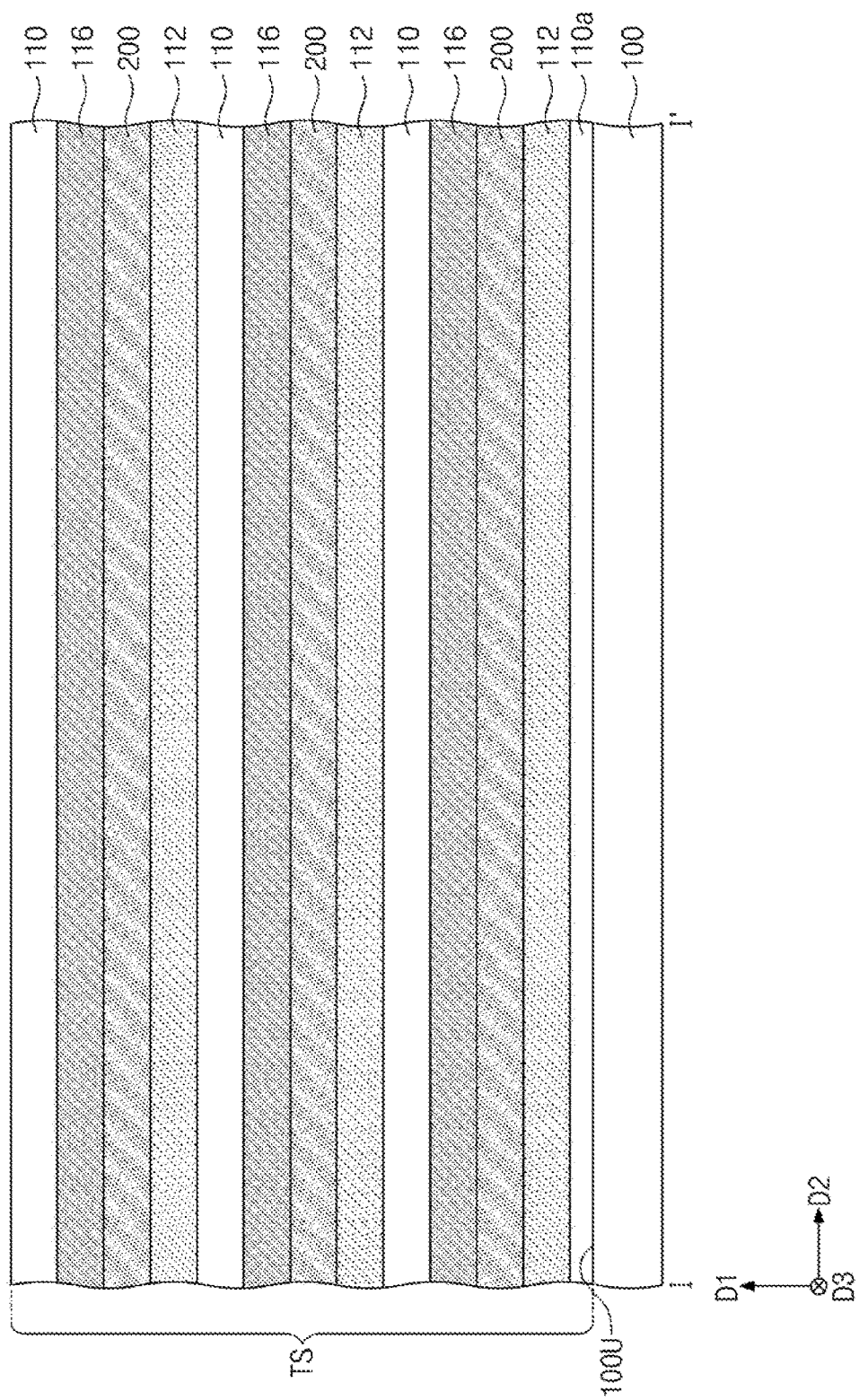
Figure 20B:
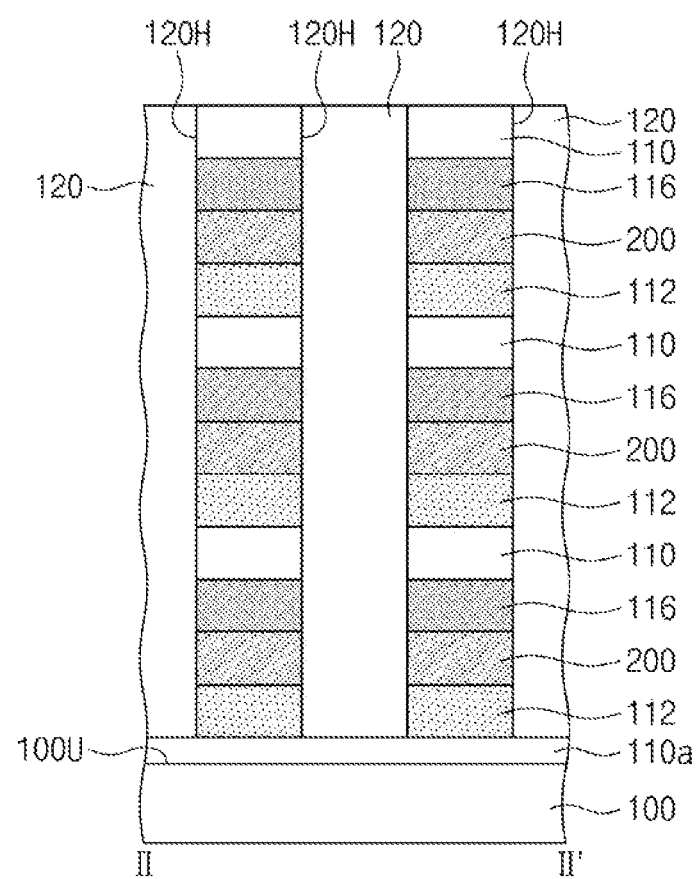

Referring to FIGS. 12, 20A and 20B, a lower insulating layer 110a and a sacrificial layer 112 may be sequentially formed on a substrate 100, and a variable resistance layer 200 may be formed on the sacrificial layer 112. A second capping layer 116 and an upper insulating layer 110 may be sequentially formed on the variable resistance layer 200. The variable resistance layer 200 may be, e.g., a magnetic tunnel junction layer, and the magnetic tunnel junction layer may include a first magnetic layer, a tunnel barrier layer, and a second magnetic layer, which are sequentially stacked on the sacrificial layer 112. The sacrificial layer 112, the variable resistance layer 200, the second capping layer 116, and the upper insulating layer 110 may be alternately and repeatedly stacked on the substrate 100 in the first direction D1, and thus a thin-layer structure TS may be formed on the substrate 100.

Vertical holes 120H may be formed in the thin-layer structure TS. Each of the vertical holes 120H may penetrate the thin-layer structure TS in the first direction D1. The vertical holes 120H may extend in the second direction D2 in the thin-layer structure TS and may be spaced apart from each other in the third direction D3. Vertical insulating patterns 120 may be formed in the vertical holes 120H, respectively, and may be formed to fill the vertical holes 120H, respectively. The vertical insulating patterns 120 may extend in the second direction D2 and may be spaced apart from each other in the third direction D3.

Figure 21A:
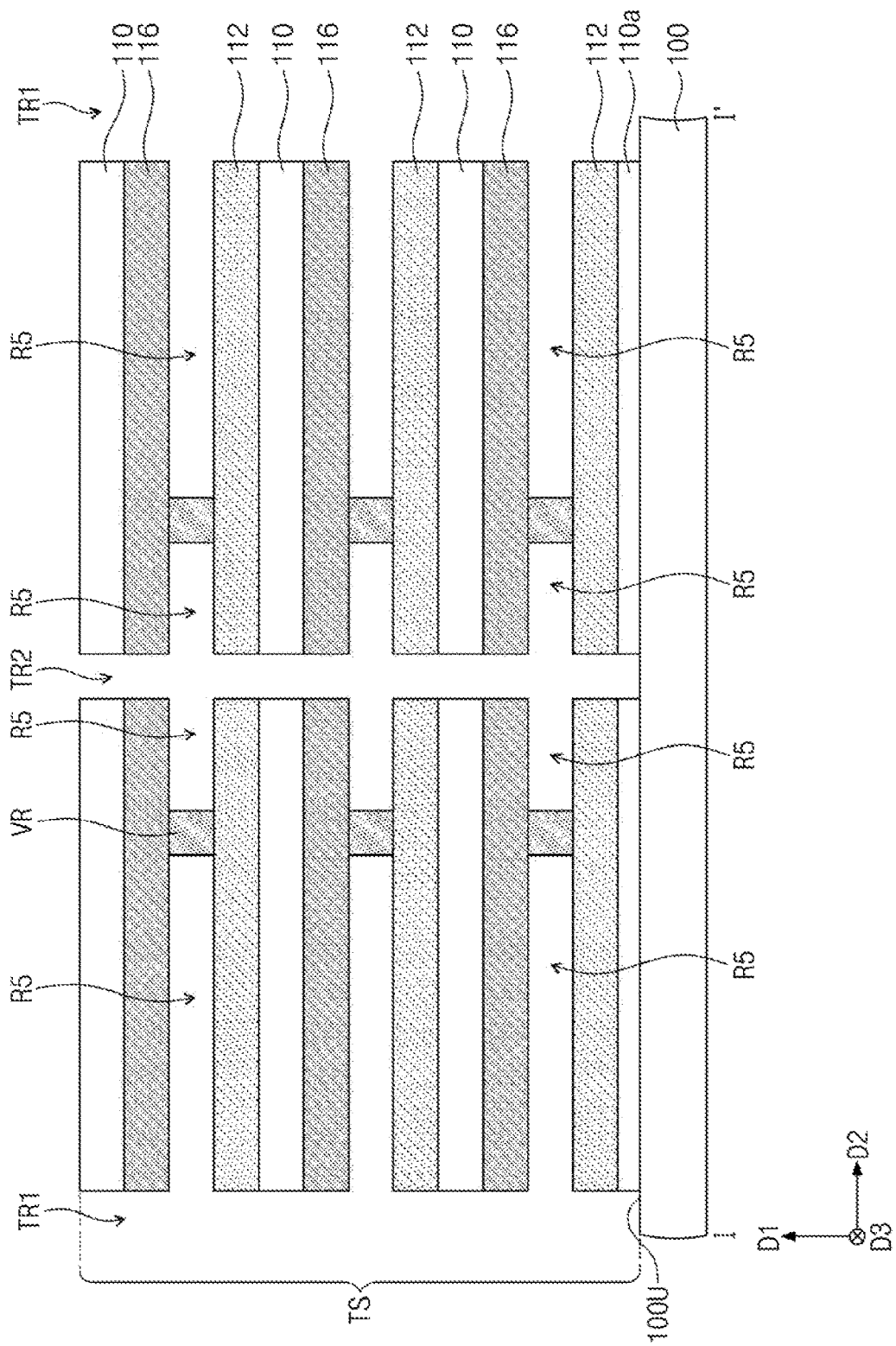
Figure 21B:
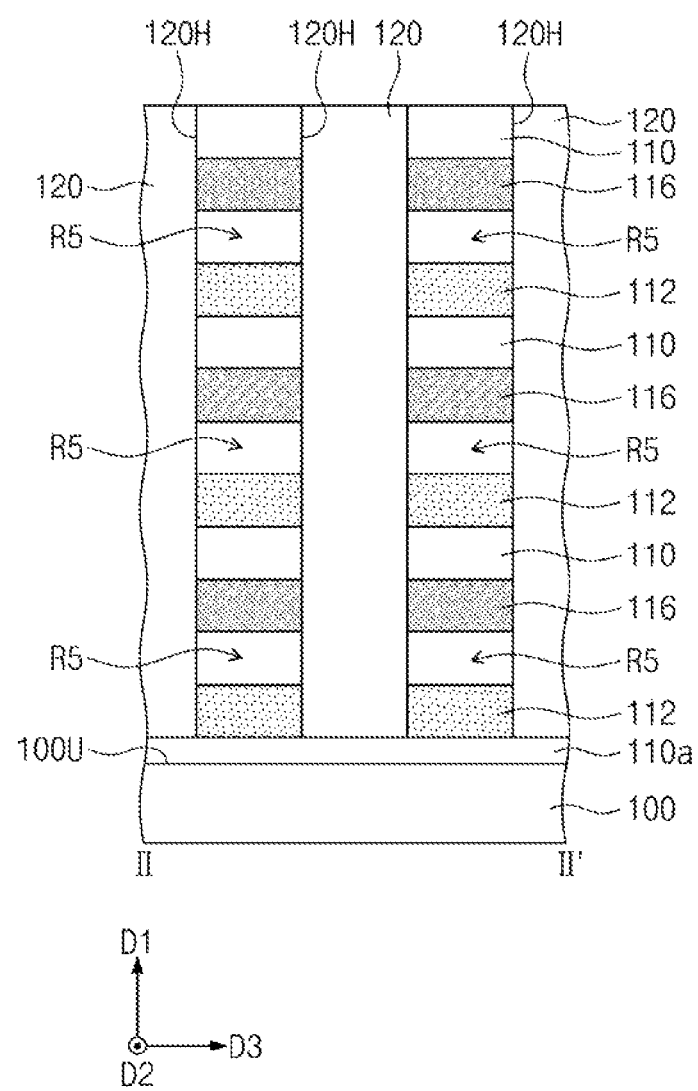

Referring to FIGS. 12, 21A and 21B, first trenches TR1 may be formed in the thin-layer structure TS. The first trenches TR1 may be spaced apart from each other in the second direction D2 and may extend in the third direction D3. Each of the first trenches TR1 may penetrate the thin-layer structure TS in the first direction D1. Each of the first trenches TR1 may expose sidewalls of the lower insulating layer 110a, the sacrificial layers 112, the variable resistance layers 200, the second capping layers 116 and the upper insulating layers 110 of the thin-layer structure TS.

A second trench TR2 may be formed in the thin-layer structure TS. The second trench TR2 may be formed between the first trenches TR1. The second trench TR2 may penetrate the thin-layer structure TS in the first direction D1 and may extend in the third direction D3. The second trench TR2 may expose sidewalls of the lower insulating layer 110a, the sacrificial layers 112, the variable resistance layers 200, the second capping layers 116 and the upper insulating layers 110 of the thin-layer structure TS.

The sidewalls of the variable resistance layers 200 exposed by the first and second trenches TR1 and TR2 may be etched. Thus, variable resistance patterns VR and fifth recess regions R5 exposing sidewalls of the variable resistance patterns VR may be formed. Each of the fifth recess regions R5 may expose the sidewall of each of the variable resistance patterns VR between a corresponding sacrificial layer 112 and a corresponding second capping layer 116. In an implementation, the formation of the variable resistance patterns VR may include performing a wet etching process to etch the sidewalls of the variable resistance layers 200 exposed by the first and second trenches TR1 and TR2.

Figure 21C:
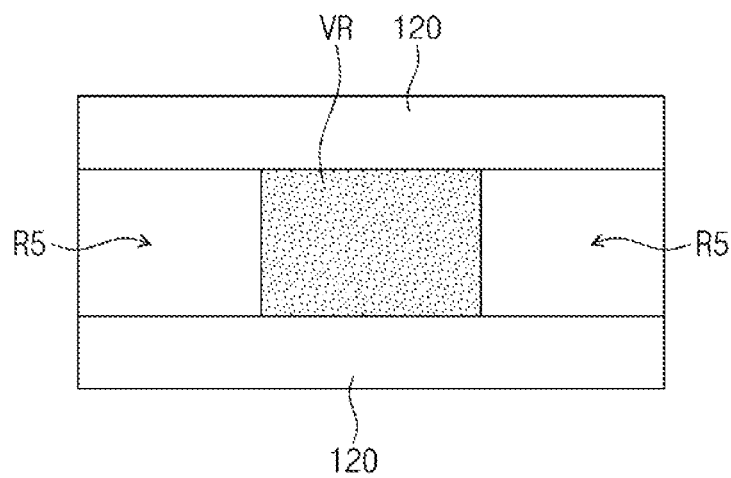
FIGS. 21C to 21E are views of planar shapes of a variable resistance pattern of FIG. 21A.
Figure 21D:
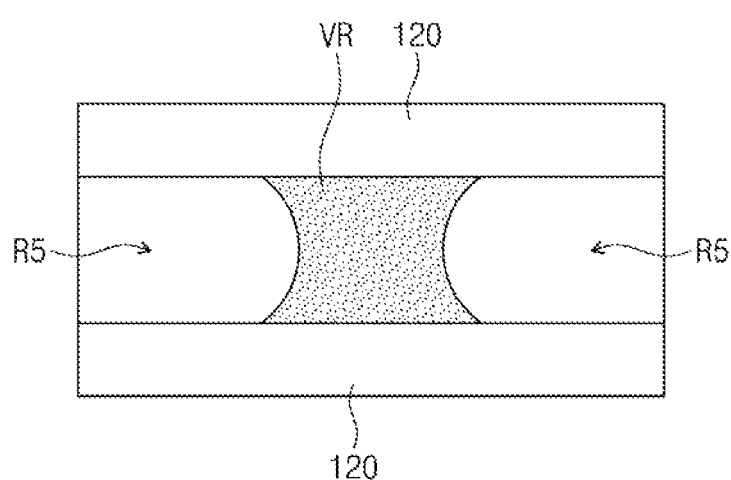
Figure 21E:
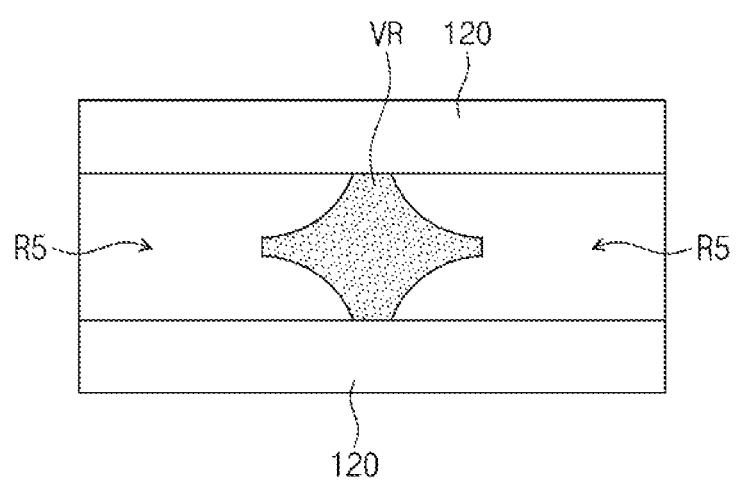

In an implementation, referring to FIG. 21C, the sidewalls of each of the variable resistance patterns VR, which are exposed by the fifth recess regions R5, may be formed to be substantially flat in the wet etching process, when viewed in a plan view. Thus, each of the variable resistance patterns VR may be formed to have a quadrilateral planar shape. In an implementation, referring to FIG. 21D, the sidewalls of each of the variable resistance patterns VR, which are exposed by the fifth recess regions R5, may be recessed inwardly toward the inside of each of the variable resistance patterns VR in the wet etching process when viewed in a plan view. Thus, each of the variable resistance patterns VR may have a planar shape having recessed sidewalls opposite to each other. In an implementation, each of the variable resistance patterns VR may have a shape having a concave intermediate portion when viewed in a plan view. In an implementation, referring to FIG. 21E, the sidewalls of each of the variable resistance patterns VR, which are exposed by the fifth recess regions R5, may be partially recessed toward the inside of each of the variable resistance patterns VR in the wet etching process when viewed in a plan view. Each of the variable resistance patterns VR may have sidewalls recessed toward its inside at its portions adjacent to the vertical insulating patterns 120 when viewed in a plan view. Thus, each of the variable resistance patterns VR may be formed to have a planar shape similar to a substantially circular shape.

Figure 22A:
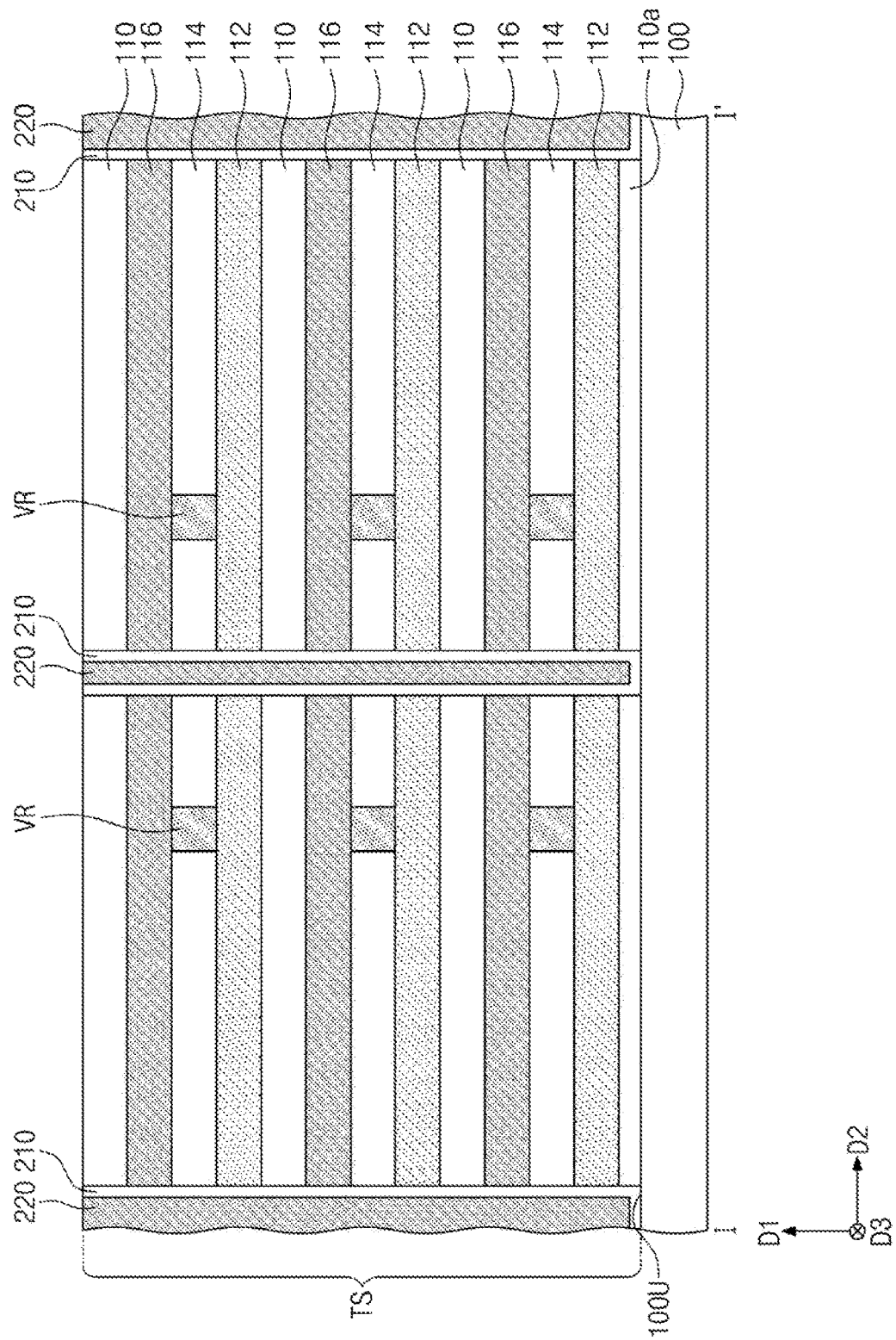
Figure 22B:
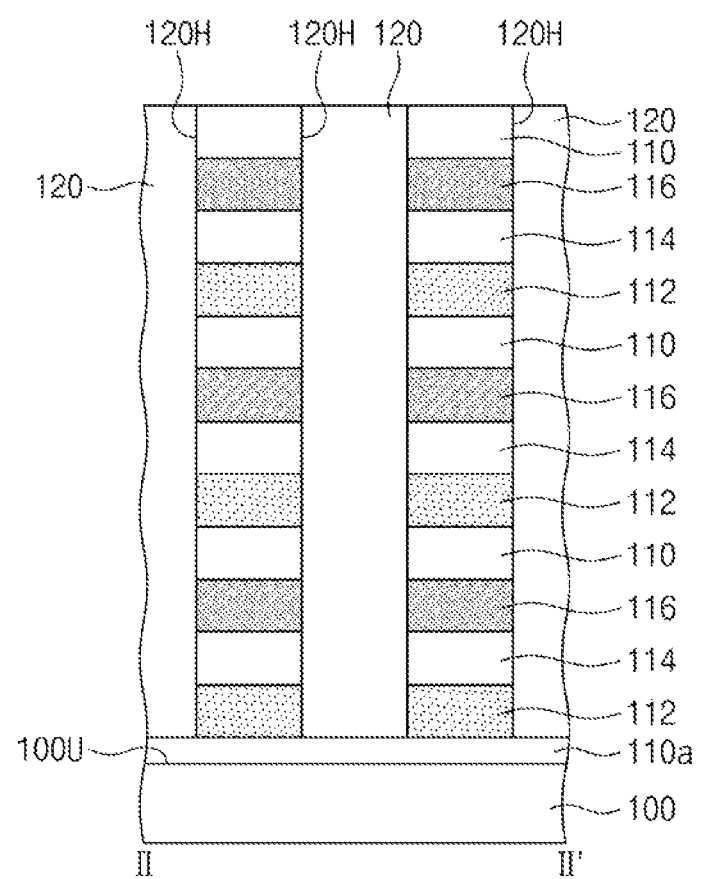

Referring to FIGS. 12, 22A and 22B, first capping layers 114 may be formed to fill the fifth recess regions R5 and may cover the sidewalls of the variable resistance patterns VR. In an implementation, the formation of the first capping layers 114 may include forming a capping insulating layer filling the fifth recess regions R5 and filling a portion of each of the first and second trenches TR1 and TR2, and removing the capping insulating layer in each of the first and second trenches TR1 and TR2.

After the formation of the first capping layers 114, a first sacrificial pattern 210 and a second sacrificial pattern 220 may be formed in each of the first and second trenches TR1 and TR2. The first sacrificial pattern 210 may be conformally formed along an inner surface of each of the first and second trenches TR1 and TR2 and may include, e.g., an oxide. The second sacrificial pattern 220 may be formed to fill a remaining portion of each of the first and second trenches TR1 and TR2 and may include, for example, poly-crystalline silicon.

Figure 23A:
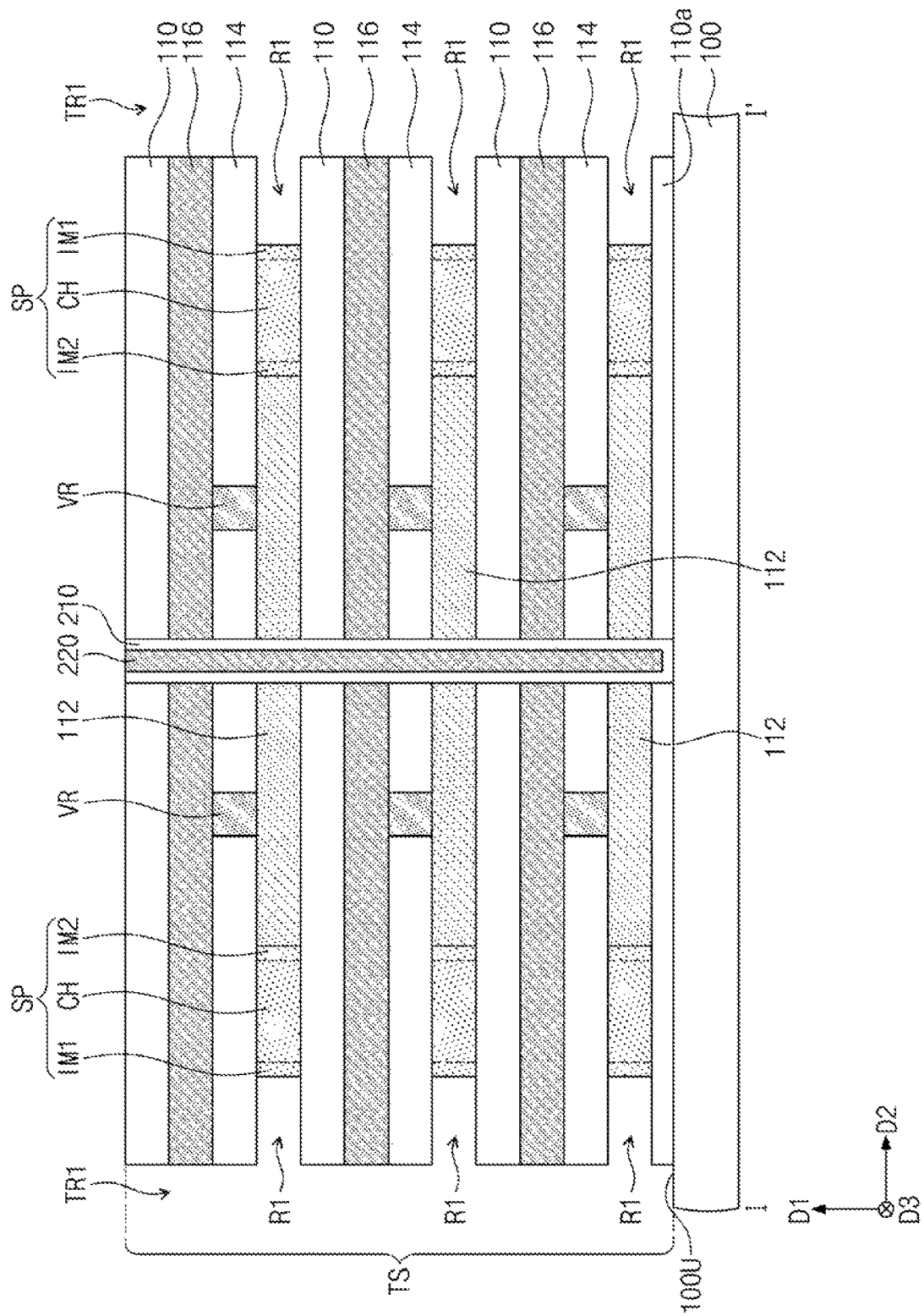
Figure 23B:
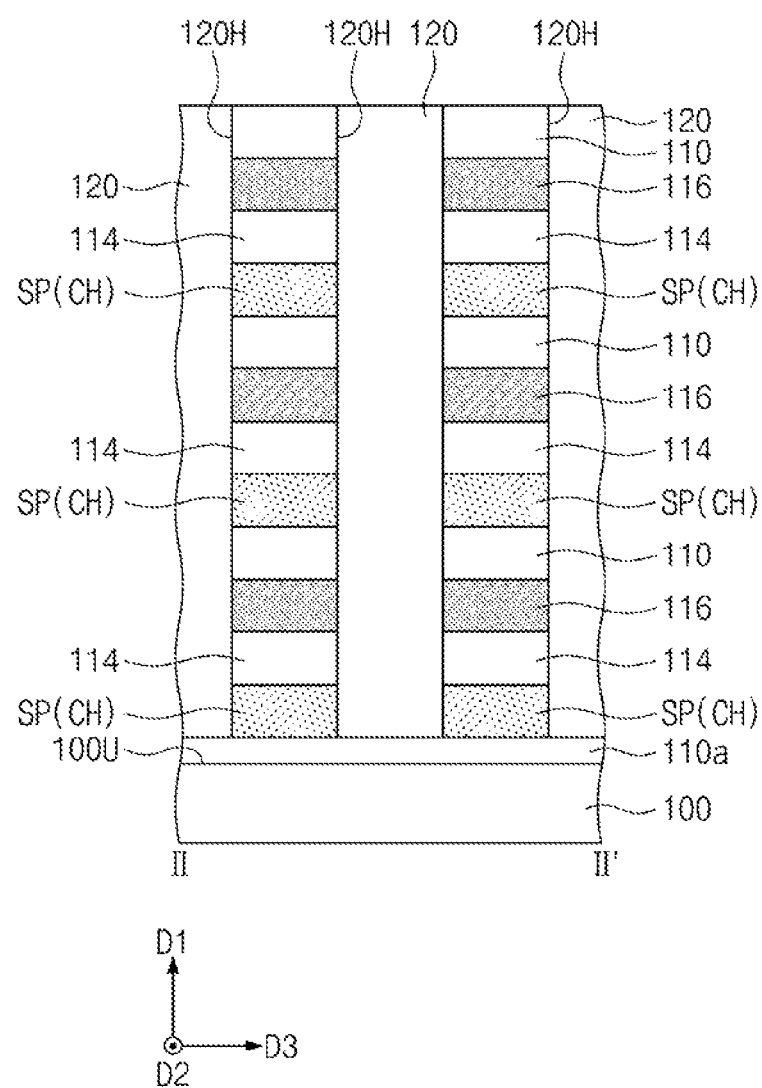

Referring to FIGS. 12, 23A and 23B, the first sacrificial patterns 210 and the second sacrificial patterns 220 in the first trenches TR1 may be removed, and the sidewalls of the sacrificial layers 112 exposed by the first trenches TR1 may be recessed. Thus, first recess regions R1 may be formed in the thin-layer structure TS. The first recess regions R1 may be formed between the lower insulating layer 110a and a lowermost one of the first capping layers 114 and between each of the upper insulating layers 110 and each of the others of the first capping layers 114.

Semiconductor patterns SP may be formed in the first recess regions RE respectively. Each of the semiconductor patterns SP may be formed to fill a portion of each of the first recess regions R1. Thus, a remaining portion of each of the first recess regions R1 may be exposed. The formation of the semiconductor patterns SP may further include forming a first dopant region IM1 and a second dopant region IM2 in each of the semiconductor patterns SP by injecting dopants into each of the semiconductor patterns SP. Each of the semiconductor patterns SP may include a channel region CH between the first dopant region IM1 and the second dopant region IM2. The first dopant region IM1 and the second dopant region IM2 may have a different conductivity type from that of the channel region CH.

Figure 24A:
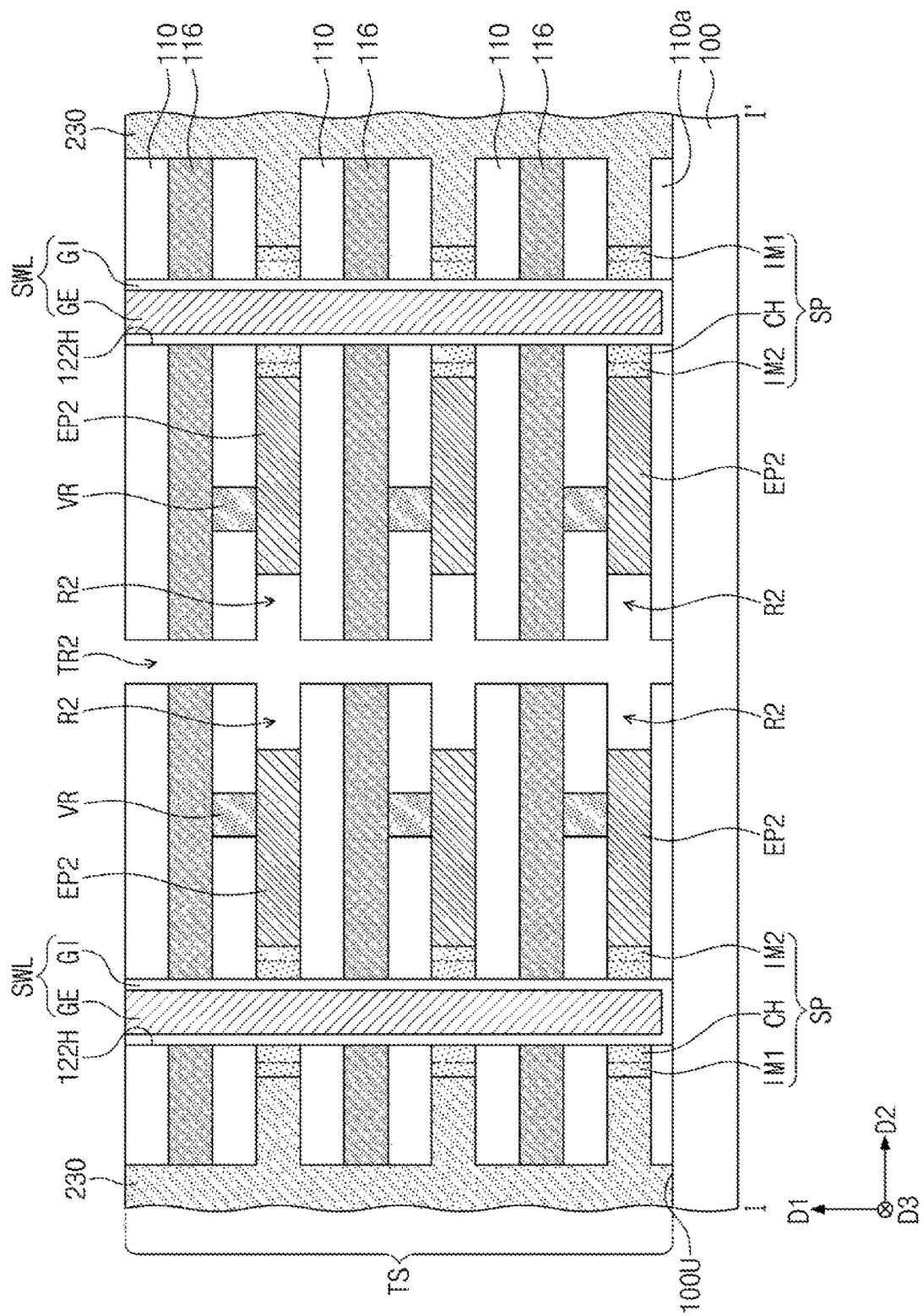
Figure 24B:
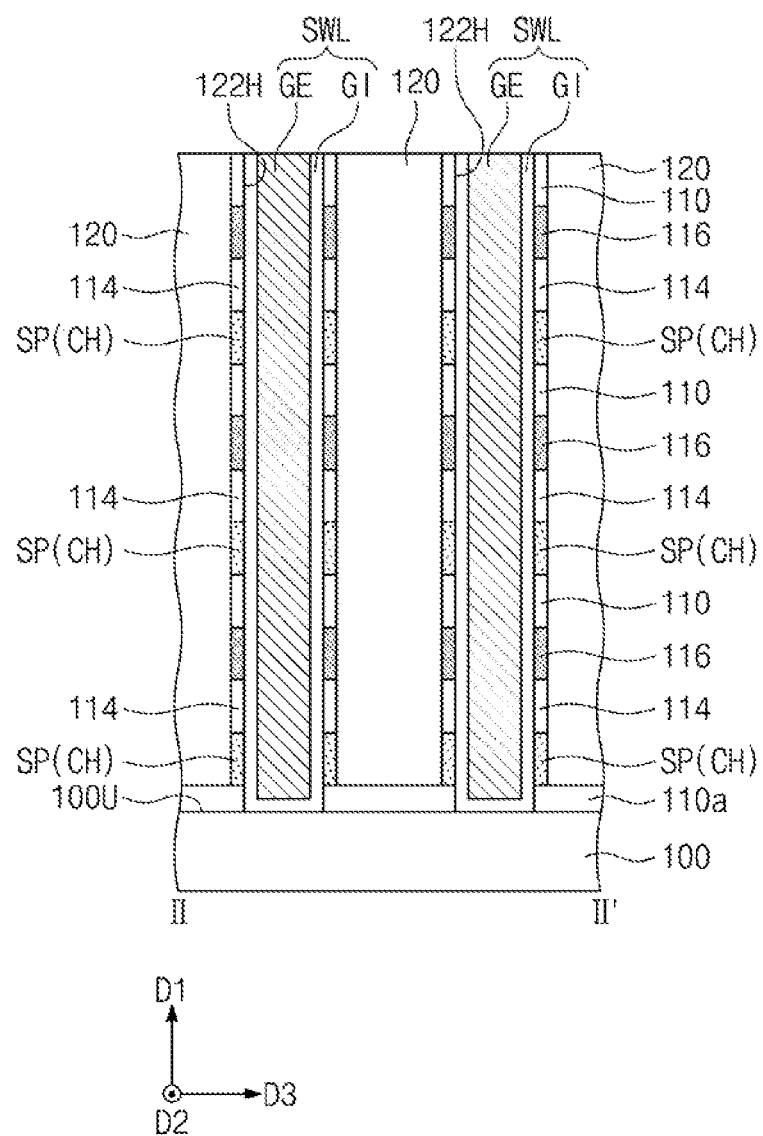

Referring to FIGS. 12, 24A and 24B, a third sacrificial pattern 230 may be formed to fill the remaining portions of the first recess regions R1 and the first trenches TR1. The third sacrificial pattern 230 may include, e.g., silicon nitride.

After the formation of the third sacrificial pattern 230, selection lines SWL may be formed to penetrate the thin-layer structure TS. Each of the selection lines SWL may include a gate electrode GE penetrating the semiconductor patterns SP spaced apart from each other in the first direction D1, and a gate dielectric layer GI between the gate electrode GE and each of the semiconductor patterns SP. The formation of the selection lines SWL may include forming gate holes 122H penetrating the thin-layer structure TS, forming the gate dielectric layer GI covering an inner surface of each of the gate holes 122H with a substantially uniform thickness, and forming the gate electrode GE filling a remaining portion of each of the gate holes 122H.

After the formation of the selection lines SWL, the first and second sacrificial patterns 210 and 220 in the second trench TR2 may be removed, and the sacrificial layers 112 exposed by the second trench TR2 may be removed. Thus, second recess regions R2 may be formed in the thin-layer structure TS. The second recess regions R2 may be formed between the lower insulating layer 110a and the lowermost one of the first capping layers 114 and between each of the upper insulating layers 110 and each of the others of the first capping layers 114. The second recess regions R2 may expose sidewalls of the semiconductor patterns SP and bottom surfaces of the variable resistance patterns VR.

Second electrode patterns EP2 may be formed in the second recess regions R2, respectively. Each of the second electrode patterns EP2 may be formed to fill a portion of each of the second recess regions R2, and thus a remaining portion of each of the second recess regions R2 may be exposed. Each of the second electrode patterns EP2 may be connected to the bottom surface of each of the variable resistance patterns VR.

Figure 25A:
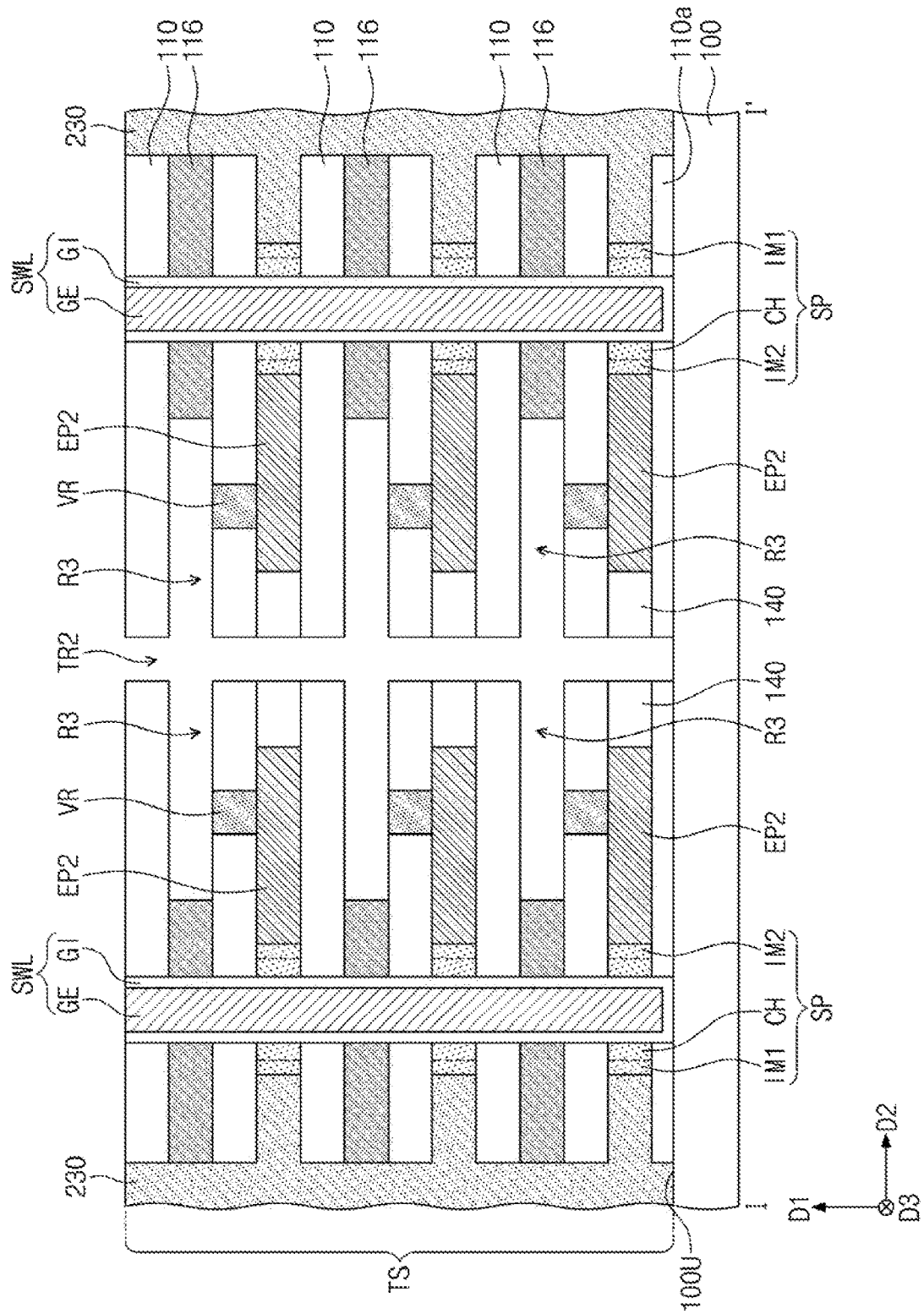
Figure 25B:
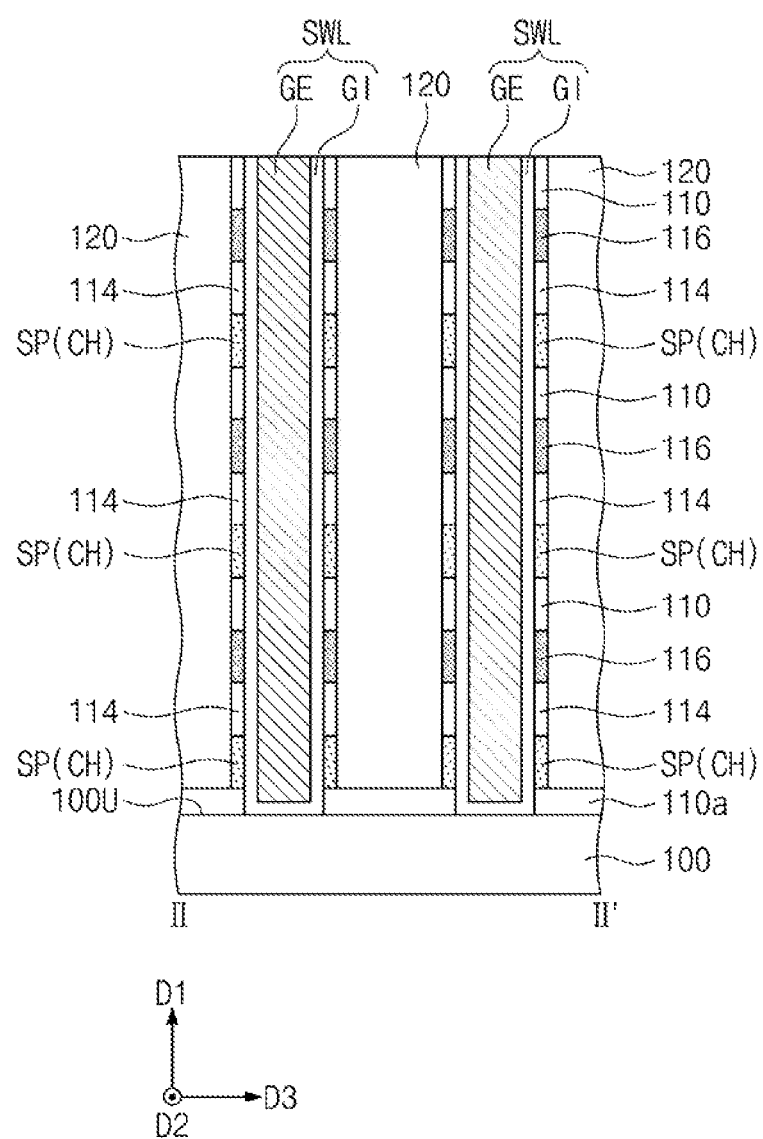

Referring to FIGS. 12, 25A and 25B, horizontal insulating patterns 140 may be formed in the remaining portions of the second recess regions R2, respectively. The sidewalls of the second capping layers 116, which are exposed by the second trench TR2, may be recessed after the formation of the horizontal insulating patterns 140. Thus, third recess regions R3 may be formed in the thin-layer structure TS. Each of the third recess regions R3 may be formed between each of the first capping layers 114 and each of the upper insulating layers 110. The third recess regions R3 may expose top surfaces of the variable resistance patterns VR. A portion of each of the third recess regions R3 may extend lengthwise in the third direction D3.

Figure 26A:
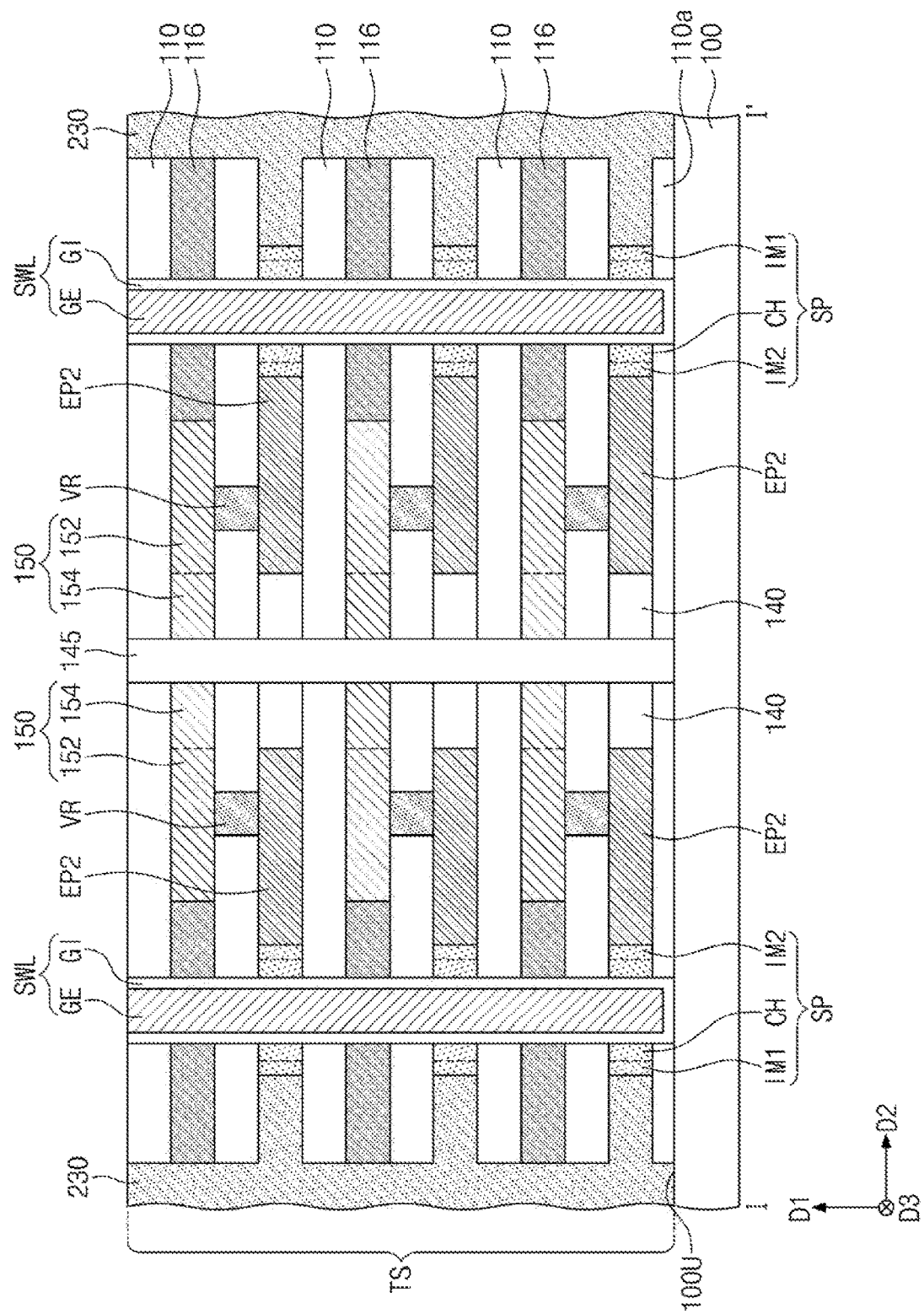
Figure 26B:
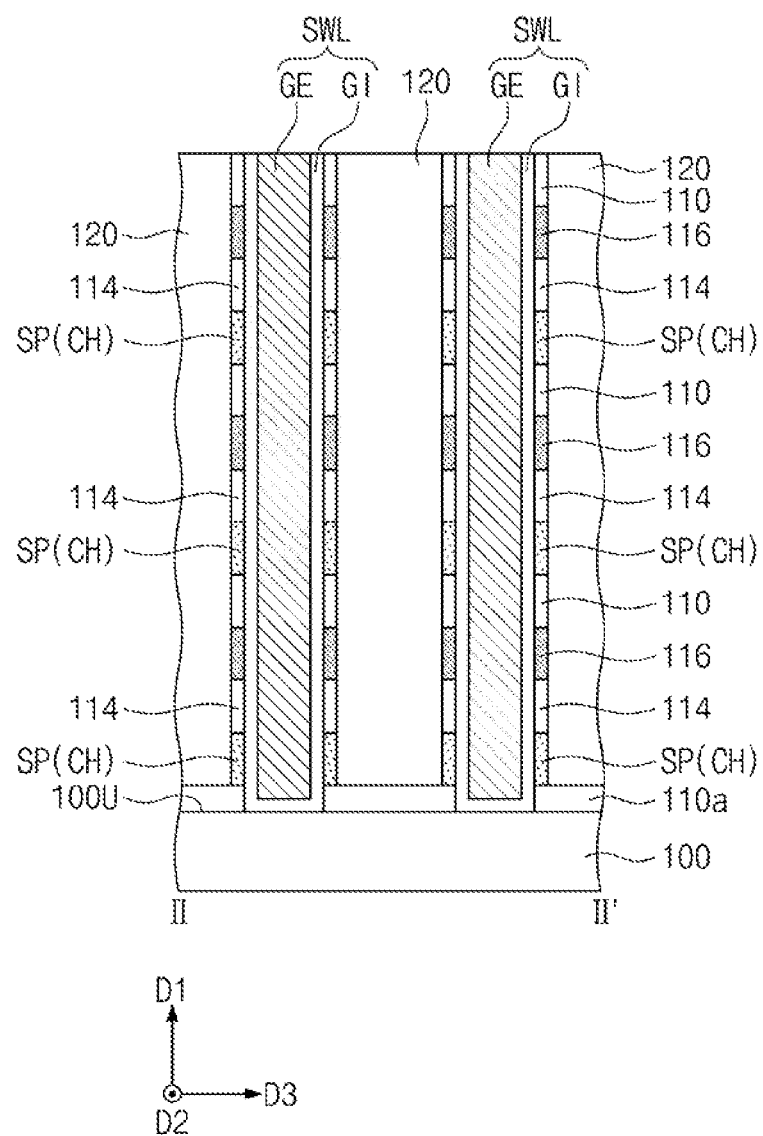

Referring to FIGS. 12, 26A and 26B, conductive lines 150 may be formed in the third recess regions R3, respectively. Each of the conductive lines 150 may include a line portion 154 extending lengthwise in the third direction D3, and extensions 152 extending from one sidewall of the line portion 154 in a direction parallel to the top surface 100U of the substrate 100. The extensions 152 of each of the conductive lines 150 may extend onto the top surfaces of the variable resistance patterns VR spaced apart from each other in the third direction D3, respectively, and may be spaced apart from each other in the third direction D3 on the one sidewall of the line portion 154. After the formation of the conductive lines 150, a separation insulating layer 145 may be formed to fill the second trench TR2.

Referring again to FIGS. 12, 13A and 13B, the third sacrificial pattern 230 in the first recess regions R1 and the first trenches TR1 may be removed. After the removal of the third sacrificial pattern 230, first electrode patterns EP1 may be formed in the first recess regions R1, respectively, and vertical conductive patterns 130 may be formed in the first trenches TR1, respectively.

By way of summation and review, extremely high-priced apparatuses may form fine patterns, and the integration density of 2D semiconductor devices continues to increase but is still limited. Three-dimensional (3D) semiconductor devices including three-dimensionally arranged memory cells have been considered.

In addition, next-generation semiconductor memory devices (e.g., magnetic random access memory (MRAM) devices and phase-change random access memory (PRAM) devices) have been considered to provide high-performance and low power consuming semiconductor memory devices. The high integration density of variable resistance memory devices such as the MRAM devices and the PRAM devices has been increasingly demanded with the development of an electronic industry.

According to the embodiments, the horizontal structures and the variable resistance patterns may be three-dimensionally stacked on the substrate. Each of the horizontal structures may include the first electrode pattern, the semiconductor pattern, and the second electrode pattern, which are horizontally arranged. The semiconductor pattern of each of the horizontal structures and the selection line adjacent thereto may function as a selection element connected to each of the variable resistance patterns. Each of the variable resistance patterns and the selection element connected thereto may constitute a unit memory cell, and a plurality of memory cells may be easily three-dimensionally stacked on the substrate. As a result, increasing an integration density of the variable resistance memory device may be facilitated.

One or more embodiments may provide a variable resistance memory device including three-dimensionally arranged variable resistance patterns.

One or more embodiments may provide a variable resistance memory device capable of increasing an integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a substrate;
horizontal structures spaced apart from each other in a first direction perpendicular to a top surface of the substrate;
variable resistance patterns on the horizontal structures, respectively; and
conductive lines on the variable resistance patterns, respectively,
wherein:
each of the horizontal structures includes a first electrode pattern, a semiconductor pattern, and a second electrode pattern arranged along a second direction parallel to the top surface of the substrate,
each of the variable resistance patterns is between one of the second electrode patterns and a corresponding one of the conductive lines, and
the horizontal structures, the variable resistance patterns, and the conductive lines are sequentially stacked on the top surface of the substrate in the first direction.

2. The variable resistance memory device as claimed in claim 1, wherein the first electrode pattern and the second electrode pattern are spaced apart from each other in the second direction with the semiconductor pattern therebetween.

3. The variable resistance memory device as claimed in claim 2, wherein:
the semiconductor pattern includes:
a first dopant region adjacent to the first electrode pattern;
a second dopant region adjacent to the second electrode pattern; and
a channel region between the first dopant region and the second dopant region, and
the first dopant region and the second dopant region have a different conductivity type from that of the channel region.

4. The variable resistance memory device as claimed in claim 2, further comprising a selection line extending lengthwise in the first direction and connected to the horizontal structures,
wherein the selection line is connected to the semiconductor pattern of each of the horizontal structures.

5. The variable resistance memory device as claimed in claim 4, wherein:

the conductive lines are spaced apart from each other in the first direction and extend lengthwise in a third direction intersecting the second direction, and the third direction is parallel to the top surface of the substrate.

6. The variable resistance memory device as claimed in claim 1, wherein:

the conductive lines are spaced apart from each other in the first direction, and each of the conductive lines includes:

a line portion extending lengthwise in a third direction parallel to the top surface of the substrate and intersecting the second direction; and an extension extending from the line portion onto a top surface of each of the variable resistance patterns.

7. The variable resistance memory device as claimed in claim 6, further comprising vertical insulating patterns at one side of the line portion of each of the conductive lines and spaced apart from each other in the third direction with the extension of each of the conductive lines therebetween, wherein:

the vertical insulating patterns extend lengthwise in the first direction, and the horizontal structures and the variable resistance patterns are between the vertical insulating patterns.

8. The variable resistance memory device as claimed in claim 7, further comprising selection lines penetrating the vertical insulating patterns, respectively, in the first direction, wherein each of the selection lines extends lengthwise in the first direction and is connected to the semiconductor pattern of each of the horizontal structures.

9. The variable resistance memory device as claimed in claim 1, further comprising a vertical conductive pattern extending lengthwise in the first direction and connected to the horizontal structures, wherein the vertical conductive pattern is connected to the first electrode pattern of each of the horizontal structures.

10. A variable resistance memory device, comprising:

a substrate;

horizontal structures and variable resistance patterns alternately stacked on the substrate in a first direction perpendicular to a top surface of the substrate; and a selection line extending lengthwise in the first direction and connected to the horizontal structures, wherein:

each of the horizontal structures includes a first electrode pattern, a semiconductor pattern, and a second electrode pattern arranged in a second direction parallel to the top surface of the substrate, each of the variable resistance patterns is connected to a corresponding one the second electrode patterns, and the selection line is connected to the semiconductor pattern of each of the horizontal structures.

11. The variable resistance memory device as claimed in claim 10, wherein the first electrode pattern and the second electrode pattern are spaced apart from each other in the second direction with the semiconductor pattern therebetween.

12. The variable resistance memory device as claimed in claim 11, wherein:

the semiconductor pattern includes:

a first dopant region adjacent to the first electrode pattern;

a second dopant region adjacent to the second electrode pattern; and a channel region between the first dopant region and the second dopant region, and the first dopant region and the second dopant region have a different conductivity type from that of the channel region.

13. The variable resistance memory device as claimed in claim 12, wherein the selection line includes:

a gate electrode adjacent to the channel region of the semiconductor pattern; and a gate dielectric layer between the channel region of the semiconductor pattern and the gate electrode.

14. The variable resistance memory device as claimed in claim 10, further comprising conductive lines on the variable resistance patterns, respectively, wherein the horizontal structures, the variable resistance patterns, and the conductive lines are sequentially stacked on the top surface of the substrate in the first direction.

15. The variable resistance memory device as claimed in claim 14, wherein each of the conductive lines includes:

a line portion extending lengthwise in a third direction parallel to the top surface of the substrate and intersecting the second direction; and an extension extending from the line portion onto a top surface of each of the variable resistance patterns.

16. A variable resistance memory device, comprising:

a substrate;

horizontal structures laterally spaced apart from each other on a top surface of the substrate;

a vertical insulating pattern between the horizontal structures and extending lengthwise in a first direction perpendicular to the top surface of the substrate;

variable resistance patterns on the horizontal structures, respectively; and a conductive line connected to the variable resistance patterns, wherein:

each of the horizontal structures includes a first electrode pattern, a semiconductor pattern, and a second electrode pattern arranged along a second direction parallel to the top surface of the substrate, each of the variable resistance patterns is on the second electrode pattern of a corresponding one of the horizontal structures, the horizontal structures are spaced apart from each other in a third direction parallel to the top surface of the substrate and intersecting the second direction, and the conductive line extends lengthwise in the third direction and is connected to the variable resistance patterns.

17. The variable resistance memory device as claimed in claim 16, wherein the conductive line includes:

a line portion extending lengthwise in the third direction; and extensions extending from the line portion onto top surfaces of the variable resistance patterns, respectively.

18. The variable resistance memory device as claimed in claim 17, wherein the vertical insulating pattern is between the extensions of the conductive line.

19. The variable resistance memory device as claimed in claim 16, further comprising a selection line penetrating the vertical insulating pattern along the first direction, wherein the selection line extends lengthwise in the first direction and is connected to the semiconductor pattern of a corresponding one of the horizontal structures.

* * * * *